(12) United States Patent
Mimori et al.

(10) Patent No.: US 11,848,315 B2
(45) Date of Patent: Dec. 19, 2023

(54) SEMICONDUCTOR LIGHT-EMITTING DEVICE

(71) Applicant: ROHM CO., LTD., Kyoto (JP)

(72) Inventors: Kanako Mimori, Kyoto (JP); Yusuke Nakakohara, Kyoto (JP); Okimoto Kondo, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 186 days.

(21) Appl. No.: 17/646,821

(22) Filed: Jan. 3, 2022

(65) Prior Publication Data

US 2022/0231003 A1    Jul. 21, 2022

(30) Foreign Application Priority Data

Jan. 15, 2021 (JP) ................. 2021-005191

(51) Int. Cl.
| | |
|---|---|
| *H01L 25/16* | (2023.01) |
| *H01L 33/62* | (2010.01) |
| *H05B 45/40* | (2020.01) |
| *H05K 1/18* | (2006.01) |
| *G01S 7/481* | (2006.01) |
| *G01S 17/10* | (2020.01) |

(52) U.S. Cl.
CPC ............ *H01L 25/167* (2013.01); *H01L 33/62* (2013.01); *H05B 45/40* (2020.01); *H05K 1/181* (2013.01); *G01S 7/4814* (2013.01); *G01S 17/10* (2013.01); *H05K 2201/10015* (2013.01); *H05K 2201/10053* (2013.01); *H05K 2201/10106* (2013.01)

(58) Field of Classification Search
CPC ......... H01L 21/00; H01L 22/00; H01L 23/00; H01L 24/00; H01L 25/00; H01L 28/00; H01L 2933/00; H01L 2924/00; H01L 2229/00; H05K 1/0231; H05K 2201/10053; H05K 1/0216; H05K 1/0234; H05K 1/0243; H05K 1/0236; H05K 1/0245; H05K 1/181; H05K 2201/0792; H05K 2201/10166
See application file for complete search history.

(56) References Cited

U.S. PATENT DOCUMENTS

2013/0234322 A1* 9/2013 Pendse ................ H01L 25/0657
257/737

FOREIGN PATENT DOCUMENTS

JP          2013041866 A     2/2013

* cited by examiner

*Primary Examiner* — Wei (Victor) Y Chan
(74) *Attorney, Agent, or Firm* — HAMRE, SCHUMANN, MUELLER & LARSON, P.C.

(57) ABSTRACT

A semiconductor light-emitting device includes: a board including a front surface, a back surface facing an opposite side of the front surface, a first wiring pattern formed on the front surface, and a second wiring pattern formed on the side of the back surface with respect to the first wiring pattern; and a light-emitting element, a switching element, and a capacitor, which are electrically connected to one another by both the first wiring pattern and the second wiring pattern. Among the light-emitting element, the switching element, and the capacitor, a first predetermined element and a second predetermined element are arranged in a first direction and the second predetermined element and a third predetermined element are arranged in a second direction. The second wiring pattern forms a second current path opposite to a direction of a first current path. The second current path overlaps the first current path.

21 Claims, 21 Drawing Sheets

FIG. 18
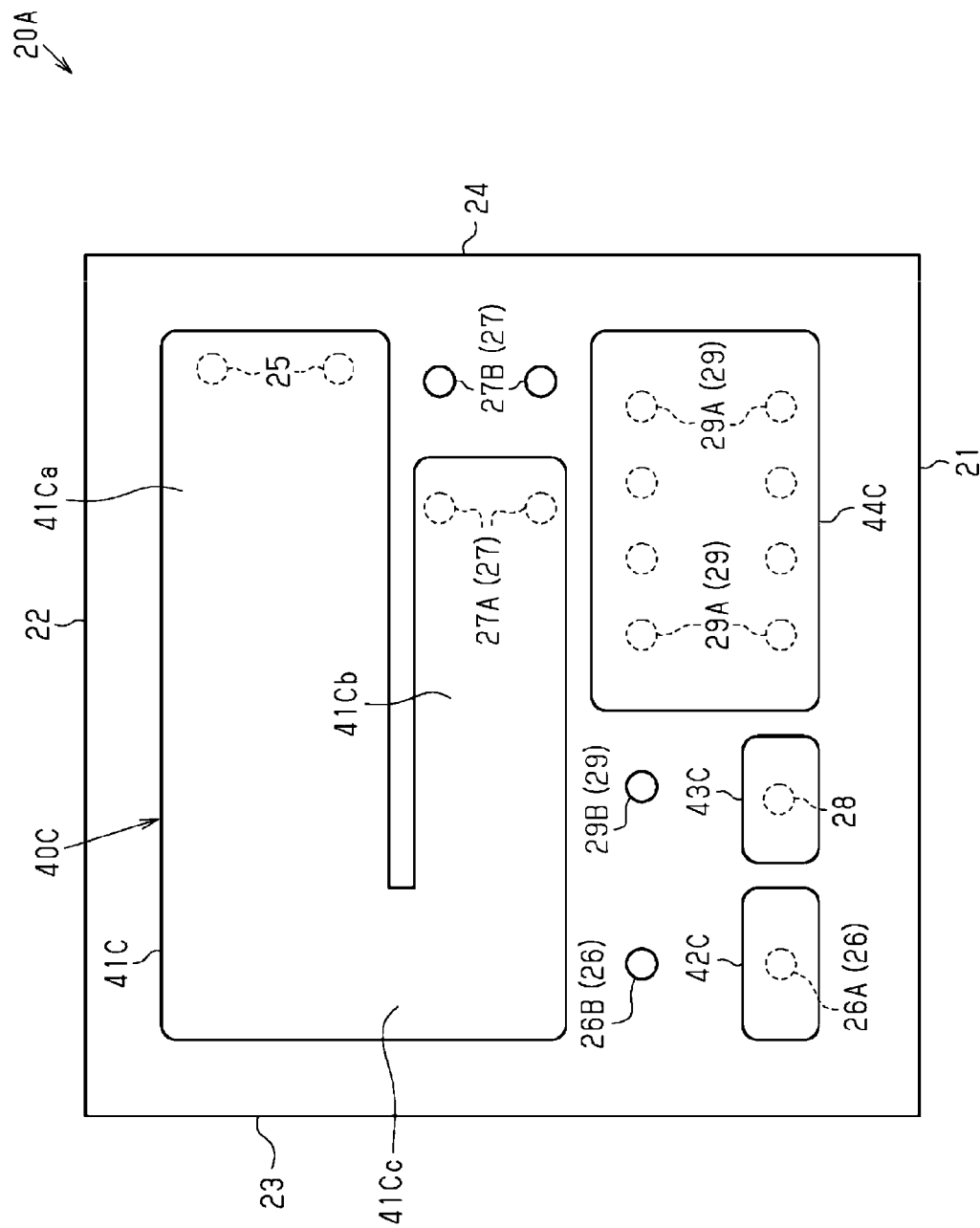
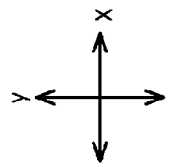

SEMICONDUCTOR LIGHT-EMITTING DEVICE

CROSS-REFERENCE TO RELATED APPLICATION

This application is based upon and claims the benefit of priority from Japanese Patent Application No. 2021-005191, filed on Jan. 15, 2021, the entire contents of which are incorporated herein by reference.

TECHNICAL FIELD

The present disclosure relates to a semiconductor light-emitting device.

BACKGROUND

A semiconductor light-emitting device including a semiconductor light-emitting element as a light source is widely known in the related art. The semiconductor light-emitting device disclosed in the related art includes a semiconductor light-emitting element and a board on which the semiconductor light-emitting element is mounted.

When the semiconductor light-emitting device is used together with, for example, a switching element and a capacitor configured to operate the semiconductor light-emitting device, the switching element and the capacitor are arranged separately from the semiconductor light-emitting device, and the semiconductor light-emitting element, the switching element, and the capacitor are electrically connected to one another by using wirings or the like. In such a configuration, inductance caused by the wirings or the like is a concern.

SUMMARY

According to an embodiment of the present disclosure, a semiconductor light-emitting device includes: a board including a front surface, a back surface facing an opposite side of the front surface, a first wiring pattern formed on the front surface, and a second wiring pattern formed on the side of the back surface with respect to the first wiring pattern; and a light-emitting element, a switching element, and a capacitor, which are electrically connected to one another by both the first wiring pattern and the second wiring pattern, wherein a first predetermined element and a second predetermined element among the light-emitting element, the switching element, and the capacitor are arranged in a first direction when viewed in a thickness direction of the board, wherein, the second predetermined element and a third predetermined element among the light-emitting element, the switching element, and the capacitor are arranged in a second direction intersecting the first direction when viewed in the thickness direction of the board, and wherein with respect to a first current path of a first current flowing through the light-emitting element, the switching element, and the capacitor on the front surface, the second wiring pattern is configured to form a second current path through which a second current flows in an opposite direction to a direction in which the first current flows through the first current path, the second current path overlapping the first current path when viewed in the thickness direction of the board.

According to another embodiment of the present disclosure, a semiconductor light-emitting device includes: a board including a front surface, a back surface facing an opposite side of the front surface, a first wiring pattern formed on the front surface, and a second wiring pattern formed on the side of the back surface with respect to the first wiring pattern; and a light-emitting element, a switching element, and a capacitor, which are electrically connected to one another by both the first wiring pattern and the second wiring pattern, wherein a first predetermined element among the light-emitting element, the switching element, and the capacitor has a shape having a longitudinal direction and a lateral direction when viewed in a thickness direction of the board, wherein the first predetermined element and another element among the light-emitting element, the switching element, and the capacitor are arranged in a first direction intersecting the longitudinal direction when viewed in the thickness direction of the board, and wherein with respect to a first current path of a first current flowing through the light-emitting element, the switching element, and the capacitor on the front surface, the second wiring pattern is configured to form a second current path through which a second current flows in an opposite direction to a direction in which the first current flows through the first current path, the second current path overlapping the first current path when viewed in the thickness direction of the board.

BRIEF DESCRIPTION OF DRAWINGS

FIG. 18 is a perspective view showing a wiring pattern on a side of the substrate back surface of a first substrate constituting a board main surface of a multilayer board of the semiconductor light-emitting device of FIG. 17.

DETAILED DESCRIPTION

Embodiments of a semiconductor light-emitting device will now be described with reference to the drawings. The following embodiments exemplify configurations and methods for embodying the technical ideas of the present disclosure, and the materials, structures, arrangements, dimensions, and the like of various components are not limited to those described below.

First Embodiment

Figure 5:
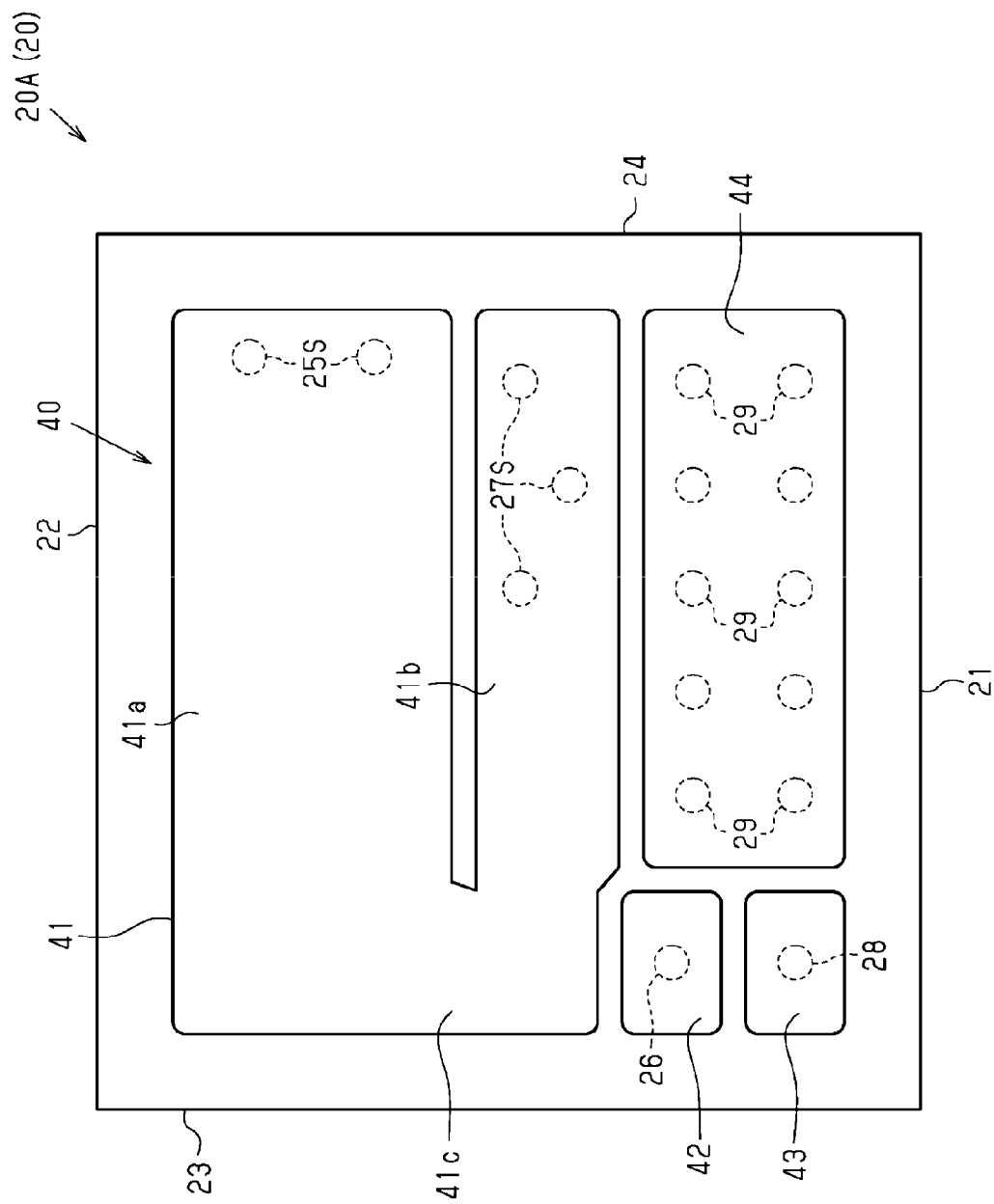
FIG. 5 is a perspective view showing a wiring pattern on a side of the substrate back surface of a first substrate constituting a board main surface of a multilayer board of the semiconductor light-emitting device of FIG. 1.
Figure 6:
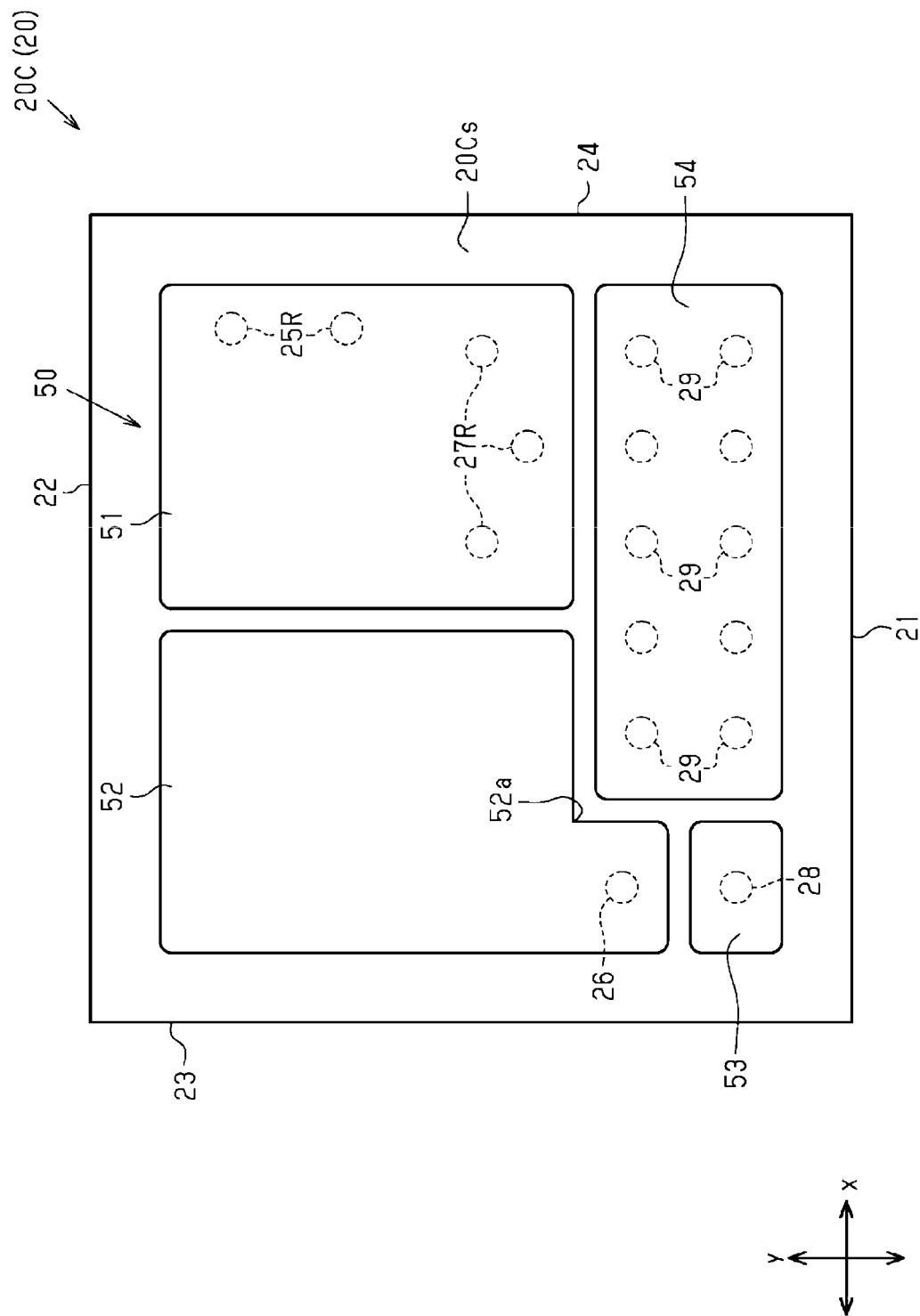
FIG. 6 is a plan view of a third substrate constituting a board back surface of the multilayer board.
Figure 7:
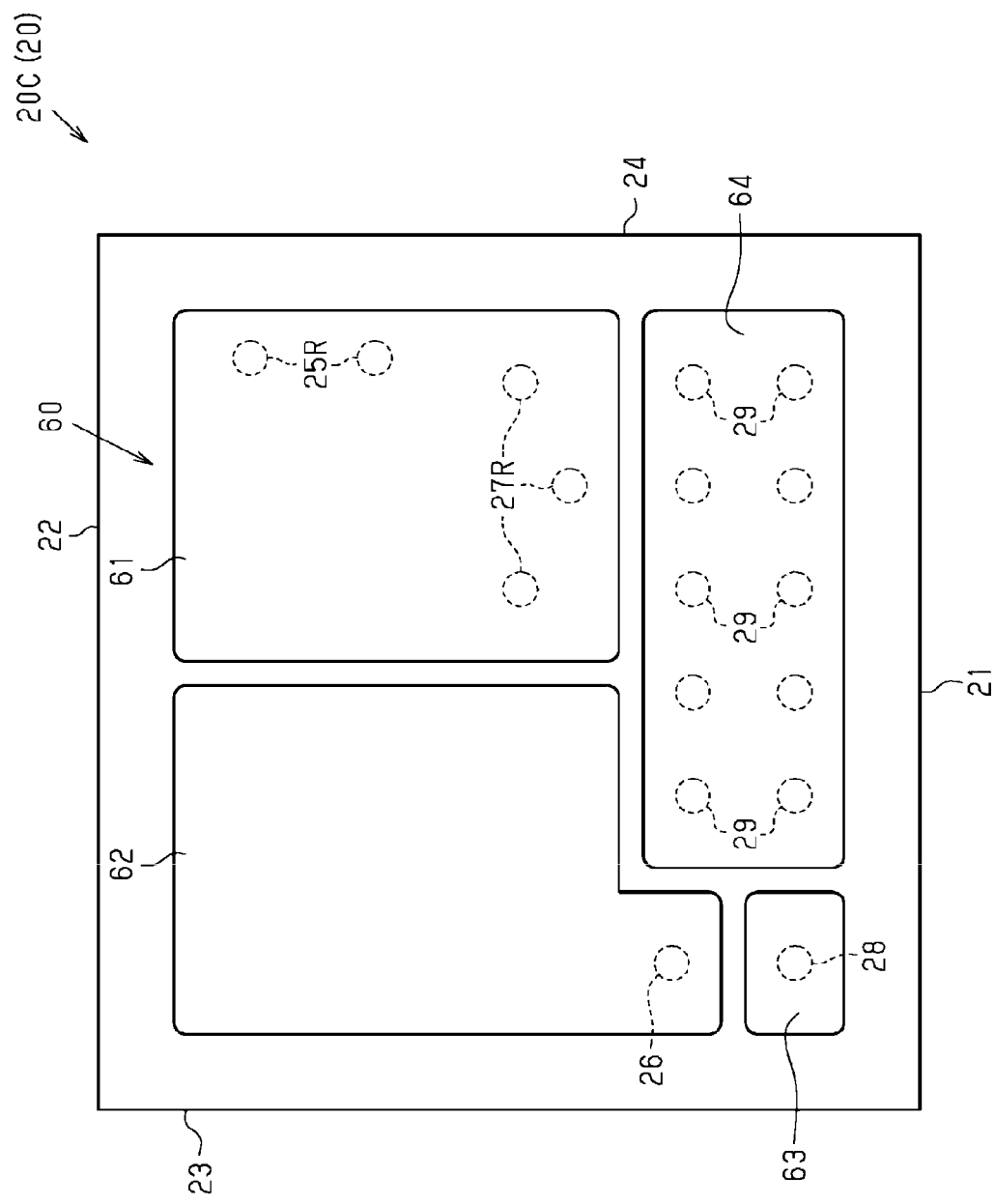
FIG. 7 is a perspective view showing a wiring pattern on a side of the substrate back surface of the third substrate.

A semiconductor light-emitting device 10 according to a first embodiment of the present disclosure will be described with reference to FIGS. 1 to 10. FIGS. 5 to 7 are shown in perspective to make it easier to understand a positional relationship of conductive layers of a multilayer board 20 to be described later. Further, for the sake of convenience, a conductive bonding material to be described later is omitted in FIG. 3.

Figure 1:
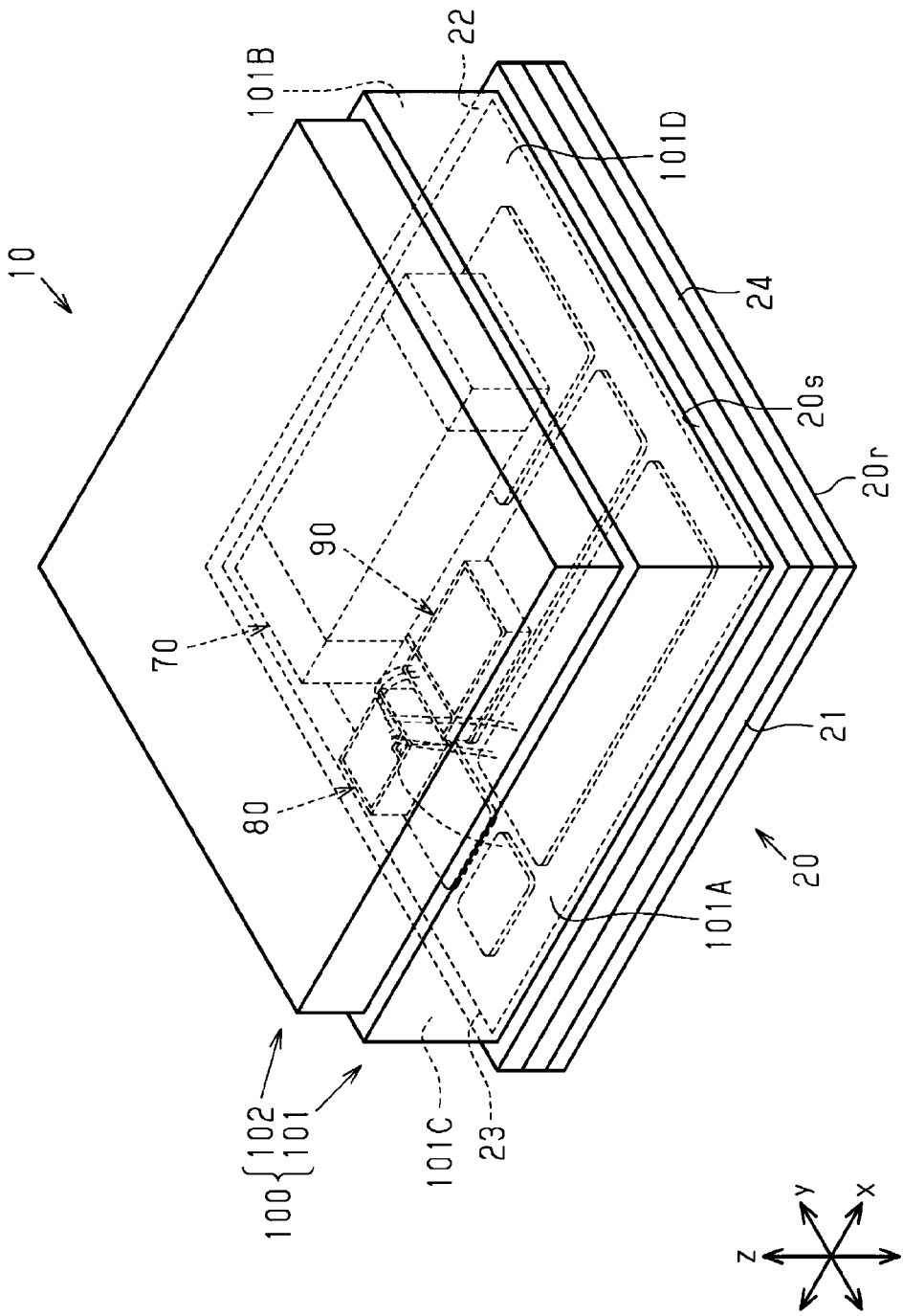
FIG. 1 is a perspective view of a semiconductor light-emitting device according to a first embodiment of the present disclosure.

The semiconductor light-emitting device 10 shown in FIG. 1 may be used in a laser system that measures a distance between the semiconductor light-emitting device 10 and an object by, for example, irradiating the object with a pulsed laser and measuring scattered light reflected from the object. That is, the semiconductor light-emitting device 10 may be used in a laser system as LiDAR (Light Detection and Ranging, Laser Imaging Detection and Ranging), which is an example of three-dimensional distance measurement. Further, the semiconductor light-emitting device 10 may be used in a laser system configured to measure a two-dimensional distance.

As shown in FIG. 1, the semiconductor light-emitting device 10 is formed in, for example, a rectangular flat plate shape. In a plan view of the semiconductor light-emitting device 10, a direction along one side is defined as an x direction, and a direction orthogonal to the x direction is defined as a y direction. Further, a direction orthogonal to both the x direction and the y direction is defined as a z direction. The z direction may be a height direction of the semiconductor light-emitting device 10. In the present embodiment, a size of the semiconductor light-emitting device 10 in the x direction is about 5.65 mm, and a size thereof in the y direction is about 5.35 mm. The plan view of the semiconductor light-emitting device 10 refers to viewing the semiconductor light-emitting device 10 from the z direction. Therefore, in the following description, "viewed from the z direction" means a plan view.

Figure 2:
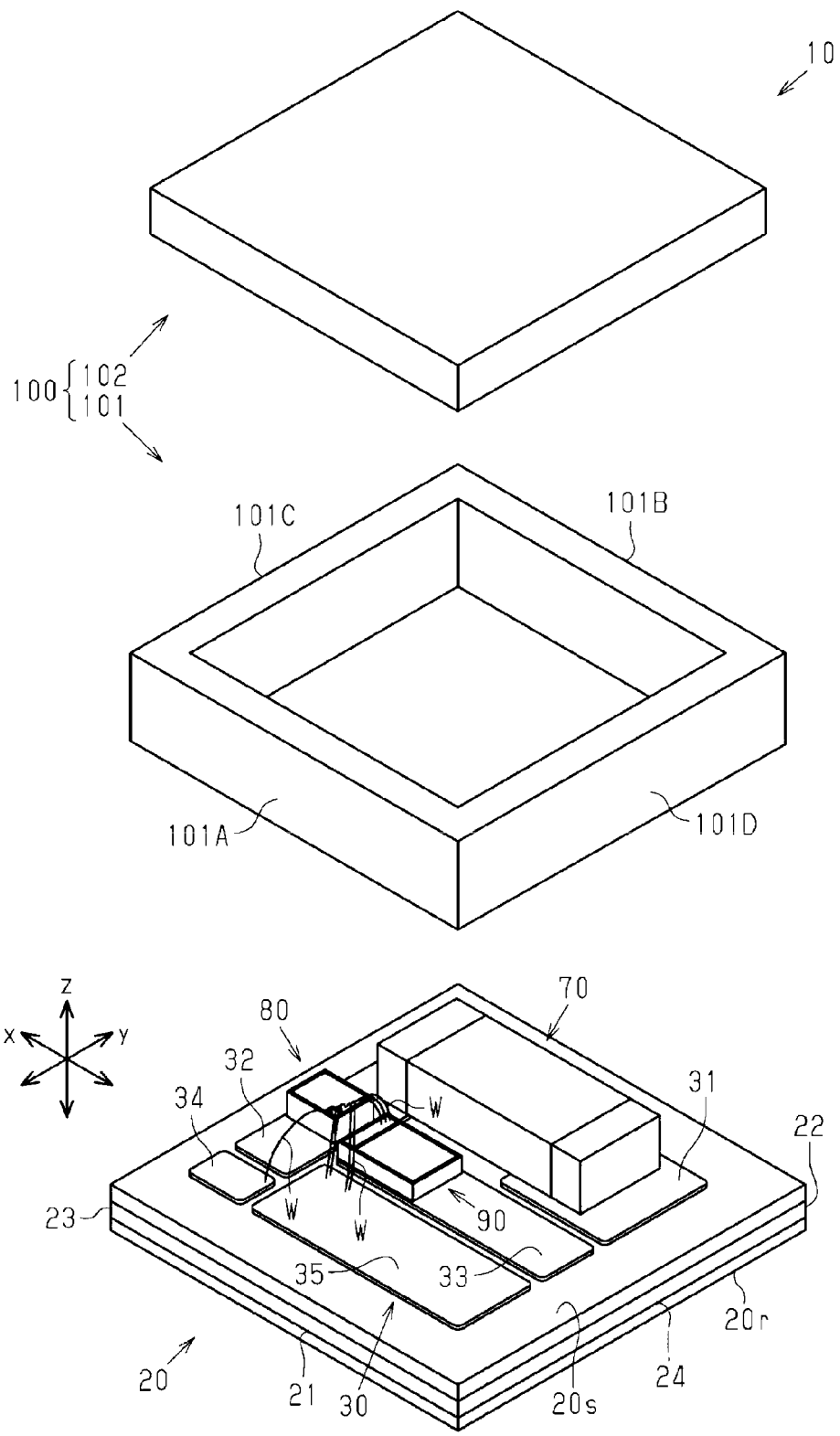
FIG. 2 is an exploded perspective view of the semiconductor light-emitting device of FIG. 1.

As shown in FIGS. 1 and 2, the semiconductor light-emitting device 10 includes: a multilayer board 20; a capacitor 70, a switching element 80, and a light-emitting element 90, which are electronic components mounted on the multilayer board 20; and a case 100.

The multilayer board 20 has a rectangular shape having a long side and a short side when viewed in the z direction. In the present embodiment, the multilayer board 20 is arranged so that the x direction is the long side direction and the y direction is the short side direction. The multilayer board 20 has a board main surface 20s and a board back surface 20r facing opposite sides in the z direction. The capacitor 70, the switching element 80, and the light-emitting element 90 are mounted on the board main surface 20s.

The multilayer board 20 has the board side surfaces 21 to 24 intersecting both the board main surface 20s and the board back surface 20r. In the present embodiment, the board side surfaces 21 to 24 are orthogonal to both the board main surface 20s and the board back surface 20r. When viewed in the z direction, the board side surfaces 21 and 22 extend along the x direction, and the board side surfaces 23 and 24 extend along the y direction.

The case 100 accommodates the capacitor 70, the switching element 80, and the light-emitting element 90. The case 100 is attached to the multilayer board 20. The interior of the case 100 is, for example, hollow. However, the present disclosure is not limited thereto, and the case 100 may be filled with any member (for example, a sealing resin).

The case 100 includes a frame-shaped side wall 101 that opens on both sides in the z direction, and a light-transmitting plate 102 installed at the side wall 101. The side wall 101 is made of, for example, a material having a light-shielding characteristic, such as a colored resin. Light from the light-emitting element 90 is shielded by the side wall 101. The side wall 101 is formed in a rectangular shape that is slightly smaller than the multilayer board 20 when viewed in the z direction.

The side wall 101 includes a first side wall 101A and a second side wall 101B forming both side walls in the y direction, and a third side wall 101C and a fourth side wall 101D forming both side walls in the x direction. When viewed in the z direction, the first side wall 101A is arranged at a position adjacent to the board side surface 21 of the multilayer board 20 in the y direction, and the second side wall 101B is arranged at a position adjacent to the board side surface 22 thereof in the y direction. The third side wall 101C is arranged at a position adjacent to the board side surface 23 of the multilayer board 20 in the x direction, and the fourth side wall 101D is arranged at a position adjacent to the board side surface 24 thereof in the x direction. When viewed in the z direction, the first side wall 101A and the second side wall 101B are side walls extending in the x direction, and the third side wall 101C and the fourth side wall 101D are side walls extending in the y direction.

The light-transmitting plate 102 is formed in a rectangular flat plate shape that is slightly smaller than the side wall 101 when viewed in the z direction. The light-transmitting plate 102 is made of, for example, a transparent material such as glass. The light-transmitting plate 102 transmits light from the light-emitting element 90.

Figure 3:
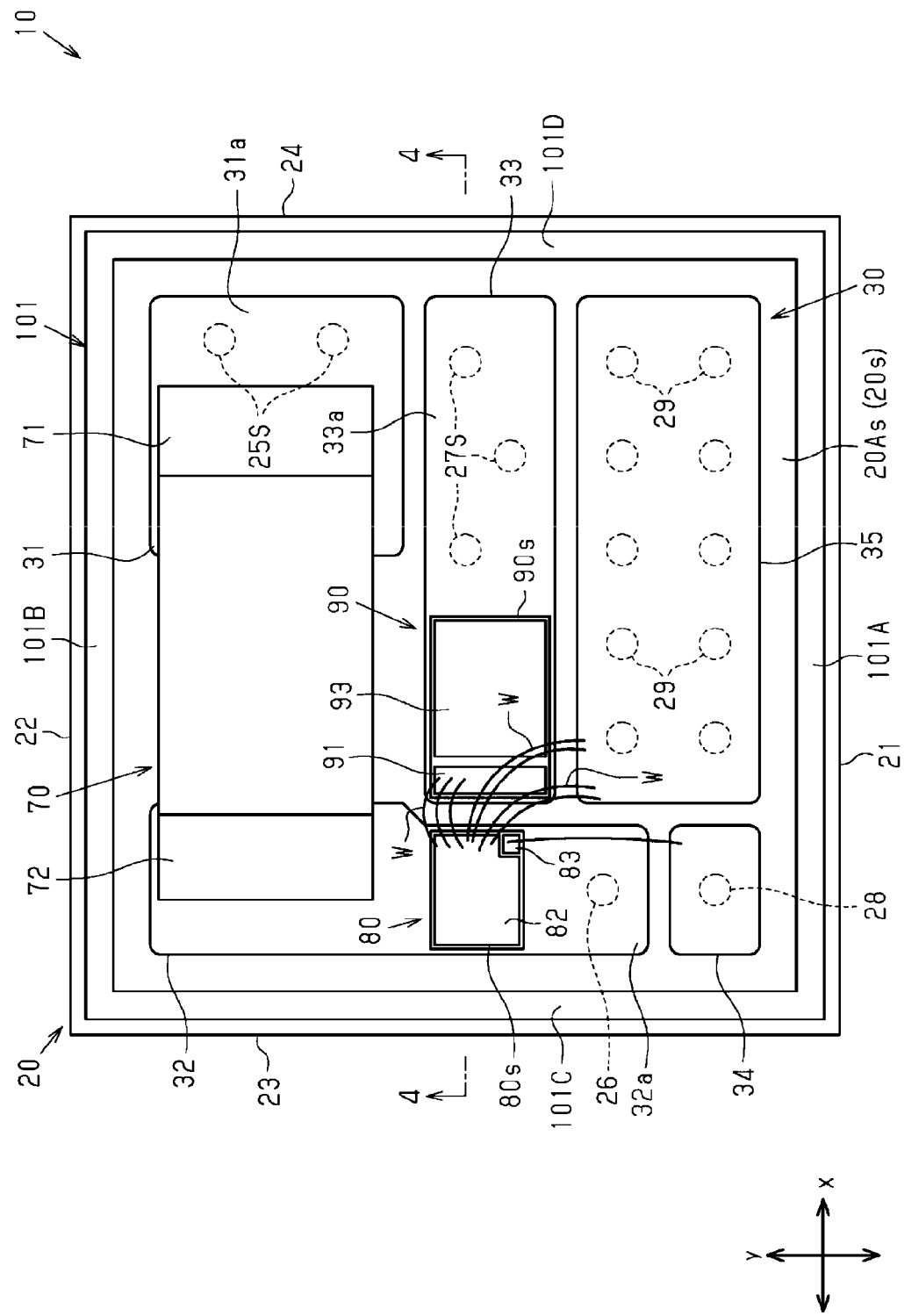
FIG. 3 is a plan view showing an internal structure of the semiconductor light-emitting device of FIG. 1.

FIG. 3 is a plan view of a state in which the light-transmitting plate 102 is omitted from the semiconductor light-emitting device 10. As shown in FIG. 3, the frame-shaped side wall 101 surrounds the capacitor 70, the switching element 80, and the light-emitting element 90.

The capacitor 70 stores electric power from an external power source of the semiconductor light-emitting device 10 and supplies the electric power to the light-emitting element 90 via the switching element 80. As the capacitor 70, for example, a ceramic capacitor or a Si (silicon) capacitor is used. In the present embodiment, the ceramic capacitor is used as the capacitor 70.

When viewed in the z direction, the capacitor 70 is interposed between a center of the multilayer board 20 in the y direction and the board side surface 22. The capacitor 70 is arranged closer to the board side surface 22 than the center of the multilayer board 20 in the y direction. The capacitor 70 is arranged at a position adjacent to the second side wall 101B in the y direction.

As shown in FIGS. 1 and 2, the capacitor 70 is formed in substantially a rectangular parallelepiped shape. As shown in FIG. 3, when viewed in the z direction, the capacitor 70 has a shape having a longitudinal direction and a lateral direction. In the present embodiment, the shape of the capacitor 70 viewed from the z direction is substantially a rectangular shape having a long side and a short side. In the present embodiment, the capacitor 70 is arranged so that its longitudinal direction is along the x direction and its lateral direction is along the y direction.

The size of the capacitor 70 in the x direction is, for example, ½ or more of the size of the multilayer board 20 in the x direction. In the present embodiment, the size of the capacitor 70 in the x direction is larger than ½ of the size of the multilayer board 20 in the x direction, specifically, about ⅔ of the size of the multilayer board 20 in the x direction. The size relationship between the capacitor 70 and the multilayer board 20 may be arbitrarily changed. In one example, the size of the capacitor 70 in the x direction may be smaller than ½ of the size of the multilayer board 20 in the x direction.

The capacitor 70 includes a first electrode 71 and a second electrode 72. The first electrode 71 and the second electrode 72 are arranged apart from each other in the longitudinal direction of the capacitor 70. The first electrode 71 and the second electrode 72 are distributed at both ends of the capacitor 70, respectively, in the longitudinal direction. That is, in the present embodiment, the first electrode 71 and the second electrode 72 are arranged apart from each other in the x direction to be aligned with each other in the y direction. The first electrode 71 is arranged closer to the fourth side wall 101D than the second electrode 72. Therefore, the first electrode 71 is arranged closer to the fourth side wall 101D than the center of the multilayer board 20 in the x direction. The second electrode 72 is arranged closer to the third side wall 101C than the center of the multilayer board 20 in the x direction. In the present embodiment, the capacitor 70 is arranged closer to the third side wall 101C than the fourth side wall 101D. That is, a distance between the second electrode 72 and the third side wall 101C is smaller than a distance between the first electrode 71 and the fourth side wall 101D in the x direction.

The switching element 80 is an element that drives the light-emitting element 90 by turning it on and off and includes, for example, a MOSFET or an IGBT. In the present embodiment, an n-type MOSFET is used as the switching element 80.

The switching element 80 is formed in a flat plate shape. When viewed in the z direction, the switching element 80 has a shape having a longitudinal direction and a lateral direction. In the present embodiment, the shape of the switching element 80 viewed from the z direction is a rectangular shape having a long side and a short side. The switching element 80 is arranged so that its longitudinal direction is along the x direction and its lateral direction is along they direction. In the present embodiment, the size of the switching element 80 in the x direction is smaller than the size of the capacitor 70 in the x direction, and the size of the switching element 80 in they direction is smaller than the size of the capacitor 70 in the y direction. The size of the switching element 80 in the x direction is, for example, ½ or less of the size of the capacitor 70 in the x direction. In the present embodiment, the size of the switching element 80 in the x direction is ⅓ or less of the size of the capacitor 70 in the x direction. The size of the switching element 80 in they direction is about ½ of the size of the capacitor 70 in they direction. The size of the switching element 80 in the x direction may be larger than ½ of the size of the capacitor 70 in the x direction. Further, the size of the switching element 80 in they direction may be larger than ½ of the size of the capacitor 70 in the y direction.

Figure 4:
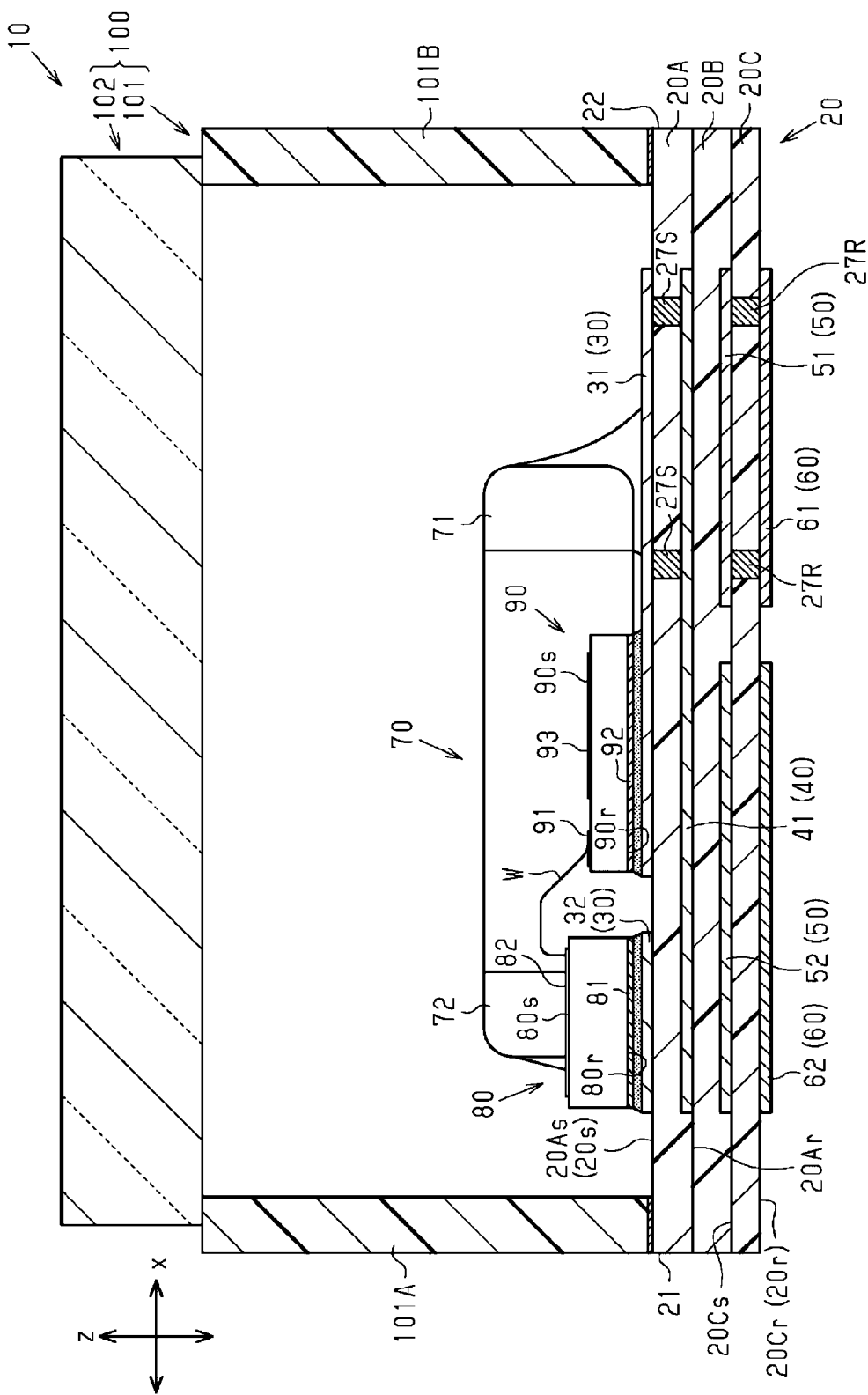
FIG. 4 is a cross-sectional view taken along line 4-4, showing the semiconductor light-emitting device of FIG. 3.

As shown in FIG. 4, the switching element 80 has a switching element main surface 80s and a switching element back surface 80r facing opposite sides in the z direction. The switching element 80 is arranged so that the switching element main surface 80s faces the same side as the board main surface 20s of the multilayer board 20.

As shown in FIGS. 3 and 4, the switching element 80 includes a drain electrode 81, a source electrode 82, and a gate electrode 83. The drain electrode 81 is formed on the switching element back surface 80r, and both the source electrode 82 and the gate electrode 83 are formed on the switching element main surface 80s. The drain electrode 81 is formed over the entire switching element back surface 80r. The source electrode 82 is formed over most of the switching element main surface 80s. The gate electrode 83 is formed at one of four corners of the switching element main surface 80s.

When viewed in the z direction, the switching element 80 is arranged apart from the capacitor 70 in the y direction. When viewed in the z direction, it may be said that the capacitor 70 and the switching element 80 are arranged in the y direction. In the present embodiment, a distance between the capacitor 70 and the switching element 80 in the y direction is about 0.15 mm. The switching element 80 is arranged closer to the first side wall 101A than the capacitor 70 in the y direction. In the present embodiment, the switching element 80 is arranged at the center of the multilayer board 20 in they direction.

As shown in FIG. 3, the switching element 80 is interposed between the center of the multilayer board 20 in the x direction and the board side surface 23. The switching element 80 is arranged closer to the board side surface 23 than the center of the multilayer board 20 in the y direction. The switching element 80 is arranged at a position adjacent to the third side wall 101C in the x direction.

The capacitor 70 and the switching element 80 are arranged at positions where at least portions of the capacitor 70 and the switching element 80 overlap each other when viewed in the y direction. That is, when at least portions of the capacitor 70 and the switching element 80 overlap each other when viewed in the y direction, it may be said that the capacitor 70 and the switching element 80 are arranged in a first direction. In the present embodiment, the x direction corresponds to the "first direction." Further, the capacitor 70 corresponds to a "first predetermined element," and the switching element 80 corresponds to a "second predetermined element."

In the present embodiment, the switching element 80 is arranged at a position where it overlaps the second electrode 72 of the capacitor 70 when viewed in they direction. When viewed in the y direction, a portion of the switching element 80 protrudes from the capacitor 70 in the x direction. More specifically, an end, which is closer to the third side wall 101C, of both ends of the switching element 80 in they direction protrudes from the second electrode 72 of the capacitor 70 toward the third side wall 101C when viewed in the y direction. In this manner, in the present embodiment, the capacitor 70 and the switching element 80 are arranged at positions where portions of the capacitor 70 and the switching element 80 overlap each other when viewed in the y direction.

A positional relationship between the switching element 80 and the capacitor 70 is not limited thereto, and the entire switching element 80 may be arranged to overlap the capacitor 70 when viewed in the y direction. That is, the switching element 80 may be arranged so that the end, between both ends of the switching element 80, which is closer to the third side wall 101C in the y direction does not protrude from the second electrode 72 of the capacitor 70 toward the third side wall 101C when viewed in the y direction. For example, the end, between both ends of the switching element 80, which is closer to the third side wall 101C in they direction and the second electrode 72 of the capacitor 70 may be arranged at positions at which they are aligned with each other in the x direction.

The light-emitting element 90 is a light source in the semiconductor light-emitting device 10 and emits light in a predetermined wavelength band by electric power from the capacitor 70. The specific configuration of the light-emitting element 90 is not particularly limited, and it may be a semiconductor light-emitting element such as a semiconductor laser element or an LED element. Therefore, a light-emitting diode may be used as the light-emitting element 90. In the present embodiment, the light-emitting element is a semiconductor laser element, and particularly, a VCSEL (Vertical Cavity Surface Emitting LASER) element is adopted as the light-emitting element. The light from the light-emitting element 90 passes through the light-transmitting plate 102 (see FIG. 4) and is emitted to the outside.

As shown in FIGS. 3 and 4, the light-emitting element 90 is formed in a rectangular plate shape. As shown in FIG. 4, the light-emitting element 90 includes a light-emitting element main surface 90s and a light-emitting element back surface 90r facing opposite sides in the z direction. The light-emitting element 90 is arranged so that the light-emitting element main surface 90s faces the same side as the board main surface 20s of the multilayer board 20.

As shown in FIG. 3, when viewed in the z direction, the light-emitting element 90 has a shape having a longitudinal direction and a lateral direction. In the present embodiment, the shape of the light-emitting element 90 viewed from the z direction is substantially a rectangular shape having a long side and a short side. In the present embodiment, the light-emitting element 90 is arranged such that its longitudinal direction is along the x direction and its lateral direction is along the y direction.

The size of the light-emitting element 90 in the x direction is smaller than the size of the capacitor 70 in the x direction, and the size of the light-emitting element 90 in they direction is smaller than the size of the capacitor 70 in they direction. On the other hand, the size of the light-emitting element 90 in the x direction is larger than the size of the switching element 80 in the x direction, and the size of the light-emitting element 90 in the y direction is larger than the size of the switching element 80 in they direction. The size of the light-emitting element 90 in the x direction is ½ or less of the size of the capacitor 70 in the x direction. In the present embodiment, the size of the light-emitting element 90 in the x direction is about ⅓ of the size of the capacitor 70 in the x direction. Since the size of the light-emitting element 90 in the y direction is slightly larger than the size of the switching element 80 in the y direction, it is slightly larger than ½ of the size of the capacitor 70 in the y direction.

As shown in FIG. 4, the light-emitting element 90 includes an anode electrode 91 and a cathode electrode 92. The anode electrode 91 is formed on the light-emitting element main surface 90s. More specifically, the anode electrode 91 is formed at an end of both ends of the light-emitting element main surface 90s in the x direction. The cathode electrode 92 is formed on the light-emitting element back surface 90r. More specifically, the cathode electrode 92 is formed over the entire light-emitting element back surface 90r.

As shown in FIG. 3, the light-emitting element 90 includes a light-emitting part 93 that emits light. The light-emitting part 93 emits the light toward the light-transmitting plate 102 in the z direction. The light-emitting part 93 is formed on the light-emitting element main surface 90s. The anode electrode 91 and the light-emitting part 93 are arranged apart from each other in the x direction. The light-emitting part 93 is formed over most of the light-emitting element main surface 90s.

When viewed in the z direction, the light-emitting element 90 is arranged apart from the capacitor 70 in the y direction. When viewed in the z direction, it may be said that the capacitor 70 and the light-emitting element 90 are arranged in the y direction. In the present embodiment, a distance between the capacitor 70 and the light-emitting element 90 in the y direction is about 0.15 mm. That is, in the present embodiment, the distance between the capacitor 70 and the light-emitting element 90 in the y direction is equal to the distance between the capacitor 70 and the switching element 80 in the y direction. Here, in a case where a difference between the distance between the capacitor 70 and the light-emitting element 90 in the y direction and the distance between the capacitor 70 and the switching element 80 in the y direction is, for example, 20% or less of the distance between the capacitor 70 and the light-emitting element 90 in the y direction, it may be said that the distance between the capacitor 70 and the light-emitting element 90 in the y direction is equal to the distance between the capacitor 70 and the switching element 80 in the y direction.

The capacitor 70 and the light-emitting element 90 are arranged at positions where they overlap each other when viewed in the y direction. In the present embodiment, the light-emitting element 90 is arranged such that the entire light-emitting element 90 overlaps the capacitor 70 when viewed in the y direction. The light-emitting element 90 is arranged closer to the third side wall 101C than the first electrode 71 of the capacitor 70 and closer to the fourth side wall 101D than the second electrode 72 of the capacitor 70. That is, it may be said that the light-emitting element 90 is arranged between the first electrode 71 and the second electrode 72 of the capacitor 70 when viewed in they direction. In the present embodiment, the light-emitting element 90 is arranged closer to the second electrode 72 than the first electrode 71 of the capacitor 70 in the x direction.

The light-emitting element 90 is arranged closer to the first side wall 101A than the capacitor 70 in the y direction. That is, the light-emitting element 90 is arranged on the same side as the side on which the switching element 80 is arranged with respect to the capacitor 70 in the y direction.

In the present embodiment, the light-emitting element 90 is arranged at the center of the multilayer board 20 in they direction.

The switching element 80 and the light-emitting element 90 are arranged at positions where at least portions of the switching element 80 and the light-emitting element 90 overlap each other when viewed in the x direction. In the present embodiment, the switching element 80 is arranged at a position where the entire switching element 80 overlaps the light-emitting element 90 when viewed in the x direction. Therefore, it may be said that the switching element 80 and the light-emitting element 90 are arranged apart from each other in the x direction to be aligned with each other in the y direction. The light-emitting element 90 is arranged at a position adjacent to the switching element 80 in the x direction. The light-emitting element 90 is arranged closer to the fourth side wall 101D than the switching element 80. That is, when viewed in the z direction, the light-emitting element 90 is arranged near the center of the multilayer board 20. In the present embodiment, the light-emitting element 90 is arranged so that the center of the light-emitting element 90 in the x direction is closer to the third side wall 101C than the center of the multilayer board 20 in the x direction. More specifically, the light-emitting element 90 is arranged such that an end, which is closer to the fourth side wall 101D, of both ends of the light-emitting element 90 in the x direction is arranged at the center of the multilayer board 20 in the x direction.

Here, when at least portions of the switching element 80 and the light-emitting element 90 overlap with each other when viewed in the x direction, it may be said that the switching element 80 and the light-emitting element 90 are arranged in a second direction. In the present embodiment, they direction corresponds to the "second direction." Further, the light-emitting element 90 corresponds to a "third predetermined element."

In the present embodiment, when the y direction corresponds to the "second direction," the first direction corresponding to the x direction and the second direction are orthogonal to each other, but the present disclosure is not limited thereto. The present disclosure may apply as long as the first direction and the second direction intersect each other. In a case where the capacitor 70 and the switching element 80 are arranged so that at least portions thereof overlap each other when viewed in the y direction and the switching element 80 and the light-emitting element 90 are arranged so that at least portions thereof overlap each other when viewed in the x direction, it may be said that the first direction, which is an arrangement direction of the capacitor 70 and the switching element 80, intersects the second direction, which is an arrangement direction of the switching element 80 and the light-emitting element 90.

The positional relationship between the switching element 80 and the light-emitting element 90 is not limited to the positional relationship shown in FIG. 3. For example, the switching element 80 may be arranged so that a portion thereof protrudes from the light-emitting element 90 when viewed in the x direction.

As shown in FIG. 4, the multilayer board 20 includes a plurality of substrates and a plurality of conductive layers and is a multilayer board in which the substrates and the conductive layers are alternately stacked. In the present embodiment, the multilayer board 20 includes a first substrate 20A, a second substrate 20B, and a third substrate 20C as the plurality of substrates, and a first conductive layer 30, a second conductive layer 40, a third conductive layer 50, and a fourth conductive layer 60 as the plurality of conductive layers. Each of the substrates 20A to 20C is made of a material having an electrical insulation characteristic such as an epoxy resin. In the present embodiment, the thicknesses of the substrates 20A to 20C are equal to each other, and a thickness dimension of each of the substrates 20A to 20C is about 0.1 mm. That is, in the present embodiment, a thickness dimension of the first substrate 20A is smaller than both the distance between the capacitor 70 and the switching element 80 in the y direction and the distance between the capacitor 70 and the light-emitting element 90 in the y direction. Each of the conductive layers 30, 40, 50, and 60 is made of a conductive material such as Cu (copper), Al (aluminum), Ti (titanium), or Au (gold).

The thickness of each of the substrate 20A to 20C may be arbitrarily changed. In one example, the thicknesses of the substrates 20A to 20C may be different from each other. Further, in one example, the thickness of the second substrate 20B may be larger than the thicknesses of the first substrate 20A and the third substrate 20C.

The third substrate 20C, the second substrate 20B, and the first substrate 20A are stacked in this order in the z direction. The first conductive layer 30 is formed on the first substrate 20A, the second conductive layer 40 is formed between the first substrate 20A and the second substrate 20B, the third conductive layer 50 is formed between the second substrate 20B and the third substrate 20C, and the fourth conductive layer 60 is formed on the side opposite to the third conductive layer 50 in the z direction with respect to the third substrate 20C.

The first substrate 20A has a substrate main surface 20As and a substrate back surface 20Ar facing opposite sides in the z direction. The substrate main surface 20As constitutes the board main surface 20s of the multilayer board 20. Here, in the present embodiment, the substrate main surface 20As (the board main surface 20s) corresponds to a "surface of the board."

As shown in FIG. 3, the first conductive layer 30 is a wiring pattern formed on the substrate main surface 20As. In other words, the first conductive layer 30 is a wiring pattern formed on the board main surface 20s of the multilayer board 20. Here, the first conductive layer 30 corresponds to a "first wiring pattern."

The first conductive layer 30 includes a first wiring 31, a second wiring 32, a third wiring 33, a fourth wiring 34, and a fifth wiring 35. The first to fifth wirings 31 to 35 are arranged apart from each other. Here, the first wiring 31 corresponds to a "first front surface side wiring," the second wiring 32 corresponds to a "second front surface side wiring," and the third wiring 33 corresponds to a "third front surface side wiring."

The first wiring 31 is a wiring on which the first electrode 71 of the capacitor 70 is mounted, and is formed near the board side surface 22 and the board side surface 24 of the board main surface 20s. The first electrode 71 of the capacitor 70 is bonded to the first wiring 31 by a conductive bonding material such as solder or Ag (silver) paste. As a result, the first electrode 71 of the capacitor 70 is electrically connected to the first wiring 31.

The first wiring 31 is arranged at a position adjacent to both the second side wall 101B and the fourth side wall 101D. The first wiring 31 has an extension wiring 31a extending beyond the first electrode 71 of the capacitor 70 toward the fourth side wall 101D in the x direction.

The shape of the first wiring 31 viewed from the z direction is substantially a rectangular shape in which the x direction is a long side direction and the y direction is a short side direction. It may be said that the first wiring 31 extends in the x direction. A width dimension of the first wiring 31 (a dimension of the first wiring 31 in the y direction) is substantially equal to a dimension of the first electrode 71 of the capacitor 70 in the y direction. More specifically, in consideration of a deviation in mounting position of the first electrode 71 of the capacitor 70 on the first wiring 31, the width dimension of the first wiring 31 is also set to be slightly larger than the dimension of the first electrode 71 of the capacitor 70 in the y direction.

The second wiring 32 is a wiring on which the second electrode 72 of the capacitor 70 and the switching element 80 are mounted. The second electrode 72 of the capacitor 70 is bonded to the second wiring 32 by a conductive bonding material. Further, the switching element back surface 80r (see FIG. 4) of the switching element 80 is bonded to the second wiring 32 by a conductive bonding material. As a result, both the second electrode 72 of the capacitor 70 and the drain electrode 81 (see FIG. 4) of the switching element 80 are electrically connected to the second wiring 32.

The second wiring 32 is formed near the board side surface 22 and the board side surface 23 of the board main surface 20s. The second wiring 32 is formed at a position adjacent to both the second side wall 101B and the third side wall 101C.

The shape of the second wiring 32 viewed from the z direction is substantially a rectangular shape in which the y direction is a long side direction and the x direction is a short side direction. It may be said that the second wiring 32 extends in the y direction. The second wiring 32 includes an extension wiring 32a extending beyond the switching element 80 toward the first side wall 101A in the y direction. The extension wiring 32a is arranged closer to the first side wall 101A than the center of the multilayer board 20 in the y direction. When viewed in the x direction, the second wiring 32 extends in the y direction to overlap the first wiring 31, the third wiring 33, and the fifth wiring 35. In the present embodiment, when viewed in the x direction, the second wiring 32 extends in the y direction to overlap the entire first wiring 31, the entire third wiring 33, and a portion of the fifth wiring 35 in the y direction.

A width dimension of the second wiring 32 (a dimension of the second wiring 32 in the x direction) is substantially equal to a dimension of the switching element 80 in the x direction. More specifically, in consideration of a deviation in mounting position of the switching element 80 on the second wiring 32, the width dimension of the second wiring 32 is set to be slightly larger than the dimension of the switching element 80 in the x direction.

The third wiring 33 is a wiring on which the light-emitting element 90 is mounted. The light-emitting element back surface 90r (see FIG. 4) of the light-emitting element 90 is bonded to the third wiring 33 by a conductive bonding material. As a result, the cathode electrode 92 (see FIG. 4) of the light-emitting element 90 is electrically connected to the third wiring 33. Further, the anode electrode 91 of the light-emitting element 90 is connected to the source electrode 82 of the switching element 80 by a wire W. As a result, the anode electrode 91 is electrically connected to the source electrode 82. The wire W is a bonding wire made of a conductive material. Cu, Al, Au, and the like are appropriately selected as the conductive material.

The third wiring 33 is formed in the center of the board main surface 20s in the y direction and near the board side surface 24 in the x direction. The third wiring 33 is arranged at a position adjacent to the fourth side wall 101D. The third wiring 33 is arranged apart from the second wiring 32 in the x direction. It may be said that the third wiring 33 is arranged at a position aligned with the switching element 80 in the y direction. The third wiring 33 is arranged apart from the first wiring 31 in the y direction. When viewed in the y direction, the third wiring 33 has a portion that overlaps the first wiring 31.

The shape of the third wiring 33 viewed from the z direction is substantially a rectangular shape in which the x direction is a long side direction and the y direction is a short side direction. It may be said that the third wiring 33 extends in the x direction. The third wiring 33 includes an extension wiring 33a extending beyond the light-emitting element 90 toward the fourth side wall 101D in the y direction. In other words, the light-emitting element 90 is arranged at one of both ends of the third wiring 33 that is closer to the second wiring 32 in the x direction. A dimension of the third wiring 33 in the x direction is larger than a dimension of the light-emitting element 90 in the x direction. In the x direction, the extension wiring 33a extends closer to the fourth side wall 101D than the first electrode 71 of the capacitor 70. The extension wiring 33a is formed so that its lead end is aligned with the leading end of the extension wiring 31a of the first wiring 31 in the x direction.

A width dimension of the third wiring 33 (a dimension of the third wiring 33 in the y direction) is substantially equal to a dimension of the light-emitting element 90 in the y direction. More specifically, in consideration of a deviation in mounting position of the light-emitting element 90 on the third wiring 33, the width dimension of the third wiring 33 is set to be slightly larger than the dimension of the light-emitting element 90 in the y direction.

The fourth wiring 34 is a wiring that is electrically connected to the gate electrode 83 of the switching element 80. The gate electrode 83 of the switching element 80 is connected to the fourth wiring 34 by a wire W. As a result, the gate electrode 83 is electrically connected to the fourth wiring 34.

The fourth wiring 34 is formed near the board side surface 21 and the board side surface 23 of the board main surface 20s. The fourth wiring 34 is formed at a position adjacent to both the first side wall 101A and the third side wall 101C. The fourth wiring 34 is arranged apart from the fourth wiring 34 in the y direction to be aligned with the second wiring 32 in the x direction. It may be said that the fourth wiring 34 is interposed between the second wiring 32 and the first side wall 101A in the y direction. The shape of the fourth wiring 34 viewed from the z direction is substantially a rectangular shape in which the x direction is a long side direction and the y direction is a short side direction. A dimension of the fourth wiring 34 in the x direction is equal to the width dimension (dimension in the x direction) of a portion of the second wiring 32 on which the switching element 80 is mounted.

The fifth wiring 35 is a wiring connected to the ground. The source electrode 82 of the switching element 80 is connected to the fifth wiring 35 by a wire W. As a result, the source electrode 82 is electrically connected to the fifth wiring 35.

The fifth wiring 35 is formed near the board side surface 21 and the board side surface 24 of the board main surface 20s. The fifth wiring 35 is arranged at a position adjacent to both the first side wall 101A and the fourth side wall 101D. The fifth wiring 35 is arranged apart from the third wiring 33 in the y direction to be aligned with the third wiring 33 in the x direction. When viewed in the y direction, the fifth wiring 35 is arranged at a position where it overlaps both the first wiring 31 and the third wiring 33. When viewed in the x direction, the fifth wiring 35 is arranged at a position where it overlaps the fourth wiring 34.

The shape of the fifth wiring 35 viewed from the z direction is substantially a rectangular shape in which the x direction is a long side direction and the y direction is a short side direction. It may be said that the fifth wiring 35 extends in the x direction. A dimension of the fifth wiring 35 in the x direction is equal to the dimension of the third wiring 33 in the x direction. A width dimension of the fifth wiring 35 (a dimension of the fifth wiring 35 in the y direction) is larger than the width dimension of the third wiring 33.

A first current path of a current flowing through the light-emitting element 90, the switching element 80, and the capacitor 70 is formed on the board main surface 20s of the multilayer board 20 by the first conductive layer 30, the light-emitting element 90, the switching element 80, and the capacitor 70. The first current path is, for example, a path through which a current flows in the order of the first electrode 71 and the second electrode 72 of the capacitor 70, the drain electrode 81 and the source electrode 82 of the switching element 80, the wire W, and the anode electrode 91 and the cathode electrode 92 of the light-emitting element 90.

As shown in FIG. 5, the second conductive layer 40 is an inner layer pattern formed in the multilayer board 20. In the present embodiment, the second conductive layer 40 corresponds to a "second wiring pattern." That is, the light-emitting element 90, the switching element 80, and the capacitor 70 are electrically connected to each other by both the conductive layers 30 and 40.

The second conductive layer 40 is formed on the substrate back surface 20Ar (see FIG. 4) of the first substrate 20A. That is, it may be said that the second conductive layer 40 is formed on the board back surface 20r of the multilayer board 20 with respect to the first conductive layer 30. When viewed in the z direction, the second conductive layer 40 is provided at a position where it overlaps the first conductive layer 30 (see FIG. 3). That is, the second conductive layer 40 is formed to overlap the first current path when viewed in the z direction. Further, the second conductive layer 40 is configured to form a second current path of a current flowing in a direction opposite to that of the first current path.

The second conductive layer 40 includes a first wiring 41, a second wiring 42, a third wiring 43, and a fourth wiring 44. The first to fourth wirings 41 to 44 are arranged apart from one another. In the present embodiment, the first wiring 41 corresponds to a "back surface side wiring."

As shown in FIGS. 3 and 5, the first wiring 41 is a wiring that forms the second current path of the current flowing in a direction opposite to the direction of the current flowing in the first current path. Further, the first wiring 41 is a wiring connected to the first current path.

The first wiring 41 includes a first wiring portion 41a formed at a position where it overlaps both the first electrode 71 and the second electrode 72 of the capacitor 70 when viewed in the z direction, a second wiring portion 41b formed at a position where it overlaps both the light-emitting element 90 and the switching elements 80 when viewed in the z direction, and a third wiring portion 41c connecting the first wiring portion 41a and the second wiring portion 41b in they direction.

The first wiring portion 41a extends in the x direction. When viewed in the z direction, the first wiring portion 41a is formed so as to overlap both the first wiring 31 of the first conductive layer 30 and a portion of the second wiring 32 that overlaps the first wiring 31 when viewed in the x direction. A width dimension of the first wiring portion 41a (a dimension of the first wiring portion 41a in they direction) is equal to the dimension of the first wiring 31 of the first conductive layer 30 in they direction. Therefore, the width dimension of the first wiring portion 41a is equal to the dimension of the capacitor 70 in they direction. More specifically, in consideration of a deviation in a mounting position of the capacitor 70, the width dimension of the first wiring portion 41a is slightly larger than the dimension of the capacitor 70 in the y direction. In a case where a difference between the width dimension of the first wiring portion 41a and the dimension of the capacitor 70 in they direction is within, for example, 10% of the width dimension of the first wiring portion 41a, it may be said that the width dimension of the first wiring portion 41a is equal to the dimension of the capacitor 70 in the y direction.

When viewed in the z direction, both ends of the first wiring portion 41a in the x direction protrude from the capacitor 70. That is, the length of the first wiring portion 41a in the x direction is longer than the length of the capacitor 70 in the x direction.

The second wiring portion 41b extends in the x direction. The second wiring portion 41b is arranged apart from the first wiring portion 41a in they direction. A width dimension of the second wiring portion 41b (a dimension of the second wiring portion 41b in they direction) is equal to the width dimension of the third wiring 33 (the dimension of the third wiring 33 in the y direction) of the first conductive layer 30. Therefore, the width dimension of the second wiring portion 41b is equal to the dimension of the light-emitting element 90 in they direction. More specifically, in consideration of a deviation in mounting position of the light-emitting element 90, the width dimension of the second wiring portion 41b is slightly larger than the dimension of the light-emitting element 90 in they direction. In a case where a difference between the width dimension of the second wiring portion 41b and the dimension of the light-emitting element 90 in they direction is within, for example, 10% of the width dimension of the second wiring portion 41b, it may be said that the width dimension of the second wiring portion 41b is equal to the dimension of the light-emitting element 90 in the y direction.

In the present embodiment, a distance between the first wiring portion 41a and the second wiring portion 41b in the y direction is larger than 0.1 mm and smaller than 0.15 mm. That is, the distance between the first wiring portion 41a and the second wiring portion 41b in the y direction is smaller than both the distance between the capacitor 70 and the switching element 80 in the y direction and the distance between the capacitor 70 and the light-emitting element 90 in they direction. In the present embodiment, since the dimension of the light-emitting element 90 in the y direction is smaller than the dimension of the capacitor 70 in they direction, the width dimension of the second wiring portion 41b is smaller than the width dimension of the first wiring portion 41a. Since the width dimension of the first wiring portion 41a is set according to the dimension of the capacitor 70 in the y direction and the width dimension of the second wiring portion 41b is set according to the dimension of the light-emitting element 90 in they direction, in a case where the dimension of the light-emitting element 90 in the y direction is larger than the dimension of the capacitor 70 in they direction, the width dimension of the second wiring portion 41b is larger than the width dimension of the first wiring portion 41a.

The distance between the first wiring portion 41a and the second wiring portion 41b in the y direction may be arbitrarily changed. For example, the distance between the first wiring portion 41a and the second wiring portion 41b in the y direction may be larger than 0.15 mm. That is, the distance between the first wiring portion 41a and the second wiring portion 41b in the y direction may be larger than both the distance between the capacitor 70 and the switching element 80 in the y direction and the distance between the capacitor 70 and the light-emitting element 90 in the y direction.

The dimension of the second wiring portion 41b in the x direction is equal to the dimension of the first wiring portion 41a in the x direction. The leading end of the second wiring portion 41b and the leading end of the first wiring 41 are formed to be aligned with each other in the x direction.

The third wiring portion 41c is interposed between the first wiring portion 41a and the second wiring portion 41b in the y direction. When viewed in the y direction, the third wiring portion 41c is arranged at a position where it overlaps both an end, between both ends of the first wiring portion 41a, which is closer to the board side surface 23 in the x direction and an end, between both ends of the second wiring portion 41b, which is closer to the board side surface 23 in the x direction.

As shown in FIGS. 3 and 5, when viewed in the z direction, the second wiring 42 is arranged at a position where it overlaps the extension wiring 32a in the second wiring 32 of the first conductive layer 30. That is, when viewed in the z direction, the third wiring 43 is arranged closer to the first side wall 101A (the board side surface 21) than the switching element 80. On the other hand, the third wiring 43 is arranged closer to the board side surface 23 than the fourth wiring 44. The second wiring 42 is arranged at a position where it overlaps an end, between both ends of the first wiring 41, which is closer to the board side surface 23 in the x direction when viewed in the y direction.

When viewed in the z direction, the third wiring 43 is arranged at a position where it overlaps the fourth wiring 34 of the first conductive layer 30. The shape and size of the third wiring 43 viewed from the z direction are the same as the shape and size of the fourth wiring 34 viewed from the z direction. When viewed in the y direction, the third wiring 43 is arranged at a position where it overlaps the second wiring 42.

When viewed in the z direction, the fourth wiring 44 is arranged at a position where it overlaps the fifth wiring 35 of the first conductive layer 30. The shape and size of the fourth wiring 44 viewed from the z direction is the same as the shape and size of the fifth wiring 35 viewed from the z direction. When viewed in the x direction, the fourth wiring 44 is arranged at a position where it overlaps both the second wiring 42 and the third wiring 43.

As shown in FIG. 6, both the third conductive layer 50 and the fourth conductive layer 60 are wiring patterns formed on the third substrate 20C. The third substrate 20C has a substrate main surface 20Cs and a substrate back surface 20Cr (see FIG. 4) facing opposite sides in the z direction. The substrate back surface 20Cr forms the board back surface 20r of the multilayer board 20. Here, the substrate back surface 20Cr (the board back surface 20r) corresponds to a "back surface of the board."

As shown in FIG. 4, the third conductive layer 50 is formed on the substrate main surface 20Cs of the third substrate 20C. The fourth conductive layer 60 is formed on the substrate back surface 20Cr of the third substrate 20C. It may be said that the third conductive layer 50 is an inner layer pattern formed in the multilayer board 20.

As shown in FIG. 6, the third conductive layer 50 includes a first wiring 51, a second wiring 52, a third wiring 53, and a fourth wiring 54. The first wiring 51 to the fourth wiring 54 are arranged apart from one another.

As shown in FIGS. 5 and 6, when viewed in the z direction, the first wiring 51 is arranged at a position where it overlaps the first wiring 41 of the second conductive layer 40 and does not overlap the second wiring 42, the third wiring 43, and the fourth wiring 44. Further, when viewed in the z direction, the first wiring 51 is arranged at a position where it does not overlap the third wiring portion 41c of the first wiring 41. The first wiring 51 is arranged near the board side surface 22 and the board side surface 24 of the substrate main surface 20Cs. When viewed in the z direction, the first wiring 51 is arranged closer to the board side surface 24 than the light-emitting element 90 (see FIG. 3). When viewed in the z direction, the first wiring 51 is arranged at a position where it overlaps the first electrode 71 (see FIG. 3) of the capacitor 70.

The shape of the first wiring 51 viewed from the z direction is substantially a rectangular shape in which the y direction is a long side direction and the x direction is a short side direction. An end, between both ends of the first wiring 51, which is closer to the board side surface 23 in the x direction is located closer to the board side surface 23 than the first electrode 71 of the capacitor 70 when viewed in the z direction.

When viewed in the z direction, the second wiring 52 is arranged at a position where it overlaps the first wiring 41 and the second wiring 42 of the second conductive layer 40 and does not overlap the third wiring 43 and the fourth wiring 44. The second wiring 52 is arranged near the board side surface 22 and the board side surface 23 of the substrate main surface 20Cs. When viewed in the z direction, the second wiring 52 is arranged at a position where it overlaps the second electrode 72 of the capacitor 70, the switching element 80, and the light-emitting element 90 (see FIG. 3 for both). On the other hand, when viewed in the z direction, the second wiring 52 is arranged at a position where it does not overlap the first electrode 71 of the capacitor 70.

The shape of the second wiring 52 viewed from the z direction is substantially a rectangular shape having a recessed portion 52a, in which the y direction is a long side direction and the x direction is a short side direction. The recessed portion 52a is provided at an end, between both ends of the second wiring 52, which is closer to the board side surface 21 in the x direction, and is recessed from the board side surface 24 toward the board side surface 23.

As shown in FIGS. 5 and 6, when viewed in the z direction, the third wiring 53 is arranged at a position where it overlaps the third wiring 43 of the second conductive layer 40. The shape of the third wiring 53 viewed from the z direction is the same as the shape of the third wiring 43 viewed from the z direction.

As shown in FIGS. 5 and 6, when viewed in the z direction, the fourth wiring 54 is arranged at a position where it overlaps the fourth wiring 44 of the second conductive layer 40. The shape of the fourth wiring 54 viewed from the z direction is the same as the shape of the fourth wiring 44 viewed from the z direction. When viewed in the x direction, a portion of the fourth wiring 54 enters the recessed portion 52a of the second wiring 52.

As shown in FIG. 7, the fourth conductive layer 60 includes a first wiring 61, a second wiring 62, a third wiring 63, and a fourth wiring 64. As shown in FIGS. 6 and 7, the first wiring 61 is arranged at a position where it overlaps the first wiring 51 of the third conductive layer 50 when viewed in the z direction, and has the same shape as the first wiring 51. When viewed in the z direction, the second wiring 62 is arranged at a position where it overlaps the second wiring 52 of the third conductive layer 50, and has the same shape as the second wiring 52. When viewed in the z direction, the third wiring 63 is arranged at a position where it overlaps the third wiring 53 of the third conductive layer 50, and has the same shape as the third wiring 53. When viewed in the z direction, the fourth wiring 64 is arranged at a position where it overlaps the fourth wiring 54 of the third conductive layer 50, and has the same shape as the fourth wiring 54. The wirings 61 to 64 of the fourth conductive layer 60 are exposed to the outside of the multilayer board 20, and are configured as a plurality of external terminals connected to the outside. In this way, the semiconductor light-emitting device 10 has a surface mount type package structure.

As shown in FIGS. 3 to 7, the multilayer board 20 has through-wirings that penetrate one or more substrates in the thickness direction thereof. In this embodiment, the multilayer board 20 has first through-wirings 25S and 25R, a second through-wiring 26, third through-wirings 27S and 27R, a fourth through-wiring 28, and a fifth through-wiring 29. Both the first through-wiring 25S and the third through-wiring 27S are wirings penetrating the first substrate 20A in the z direction. The first through-wiring 25S and the third through-wiring 27S are formed of vias formed, for example, by burying a conductor in a through-hole penetrating the first substrate 20A in the z direction. Both the first through-wiring 25R and the third through-wiring 27R are formed of vias formed, for example, by burying a conductor in a through-hole penetrating the third substrate 20C in the z direction. Each of the through-wirings 26, 28, and 29 is, for example, a wiring that penetrates the first to third substrates 20A to 20C. Each of the through-wirings 26, 28, and 29 is formed of a via formed by, for example, burying a conductor in a through-hole penetrating the first substrate 20A in the z direction. Each of the through-wirings 25S, 25R, 26, 27S, 27R, 28, and 29 is made of a conductive material such as Cu or Al. Each of the through-wirings 25S, 25R, 26, 27S, 27R, 28, and 29 may be formed by a through-hole.

As shown in FIGS. 3 and 5, both the first through-wiring 25S and the third through-wiring 27S are wirings that connect the first wiring 31 and the third wiring 33 of the first conductive layer 30 and the first wiring 41 of the second conductive layer 40. That is, the first wiring 31, the third wiring 33, and the first wiring 41 are electrically connected by the first through-wiring 25S and the third through-wiring 27S. In other words, the first current path and the second current path are electrically connected via the first through-wiring 25S and the third through-wiring 27S.

As shown in FIGS. 3 and 5, the first through-wiring 25S is a wiring that connects the first wiring 31 and the first wiring portion 41a of the first wiring 41. As shown in FIG. 3, the first through-wiring 25S is arranged at a position where it overlaps the extension wiring 31a of the first wiring 31 when viewed in the z direction. That is, when viewed in the z direction, the first through-wiring 25S is arranged closer to the fourth side wall 101D than the first electrode 71 of the capacitor 70. As shown in FIG. 5, the first through-wiring 25S is arranged at a position where it overlaps the leading end of the first wiring portion 41a of the first wiring 41 when viewed in the z direction. A plurality of first through-wirings 25S (two first through-wirings 25S in the present embodiment) are provided. The two first through-wirings 25S are arranged apart from each other in the y direction to be aligned with each other in the x direction.

As shown in FIGS. 3 and 5, the third through-wiring 27S is a wiring that connects the third wiring 33 and the second wiring portion 41b of the first wiring 41. As shown in FIG. 3, the third through-wiring 27S is arranged at a position where it overlaps the extension wiring 33a of the third wiring 33 when viewed in the z direction. That is, when viewed in the z direction, the third through-wiring 27S is arranged closer to the fourth side wall 101D than the light-emitting element 90. As shown in FIG. 5, the third through-wiring 27S is arranged at a position where it overlaps the leading end of the second wiring portion 41b of the first wiring 41 when viewed in the z direction. A plurality of third through-wirings 27S (three third through-wirings 27S in the present embodiment) are provided. The three third through-wirings 27S are arranged apart from each other in the x direction.

As shown in FIGS. 6 and 7, both the first through-wiring 25R and the third through-wiring 27R are wirings that connect the first wiring 51 of the third conductive layer 50 and the first wiring 61 of the fourth conductive layer 60. That is, the first wiring 51 and the first wiring 61 are electrically connected by the first through-wiring 25R and the third through-wiring 27R.

In the present embodiment, the arrangement position and shape of the first through-wiring 25R are the same as those of the first through-wiring 25S. The arrangement position and shape of the third through-wiring 27R are the same as those of the third through-wiring 27R. The arrangement position, shape, and number of both the first through-wiring 25R and the third through-wiring 27R may be arbitrarily changed as long as these through-wirings 25R and 27R overlap both the first wiring 51 and the first wiring 61 when viewed in the z direction. For example, at least one of the arrangement position, shape, and number of the first through-wiring 25R may be different from that of the first through-wiring 25S. At least one of the arrangement position, shape, and number of the third through-wiring 27R may be different from that of the third through-wiring 27S.

As shown in FIGS. 3 to 7, the second through-wiring 26 is a wiring that connects the second wiring 32 of the first conductive layer 30, the second wiring 42 of the second conductive layer 40, the second wiring 52 of the third conductive layer 50, and the second wiring 62 of the fourth conductive layer 60. When viewed in the z direction, the second through-wiring 26 is arranged at a position where it overlaps the extension wiring 32a of the second wiring 32. That is, when viewed in the z direction, the second through-wiring 26 is arranged closer to the board side surface 21 than the switching element 80.

As shown in FIGS. 3 to 7, the fourth through-wiring 28 is a wiring that connects the fourth wiring 34 of the first conductive layer 30, the third wiring 43 of the second conductive layer 40, the third wiring 53 of the third conductive layer 50, and the third wiring 63 of the fourth conductive layer 60.

As shown in FIGS. 3 to 7, the fifth through-wiring 29 is a wiring that connects the fifth wiring 35 of the first conductive layer 30, the fourth wiring 44 of the second conductive layer 40, the fourth wiring 54 of the third conductive layer 50, and the fourth wiring 64 of the fourth conductive layer 60. A plurality of fifth through-wirings 29 (ten fifth through-wirings 29 in the present embodiment) are provided. In the plurality of fifth through-wirings 29, two rows of five fifth through-wirings 29 arranged apart from each other in the x direction so as to be aligned with each other in the y direction are provided to be apart from each other in the y direction.

Since the second wiring 32 of the first conductive layer 30 and the second wiring 62 of the fourth conductive layer 60 are connected via the second through-wiring 26, the second wiring 62 constitutes a power supply terminal for connection to an external electrode.

Since the fourth wiring 34 of the first conductive layer 30 and the third wiring 63 of the fourth conductive layer 60 are connected via the fourth through-wiring 28 and the gate electrode 83 of the switching element 80 is connected to the four wirings 34 via the wire W, the third wiring 63 constitutes a control terminal to control the switching element 80.

Since the fifth wiring 35 of the first conductive layer 30 and the fourth wiring 64 of the fourth conductive layer 60 are connected via the fifth through-wiring 29, the fourth wiring 64 constitutes a ground terminal. Since the source electrode 82 of the switching element 80 is connected to the fifth wiring 35 by the wire W, it may be said that the fourth wiring 64 is a source terminal connected to the source electrode 82 of the switching element 80.

Figure 8:
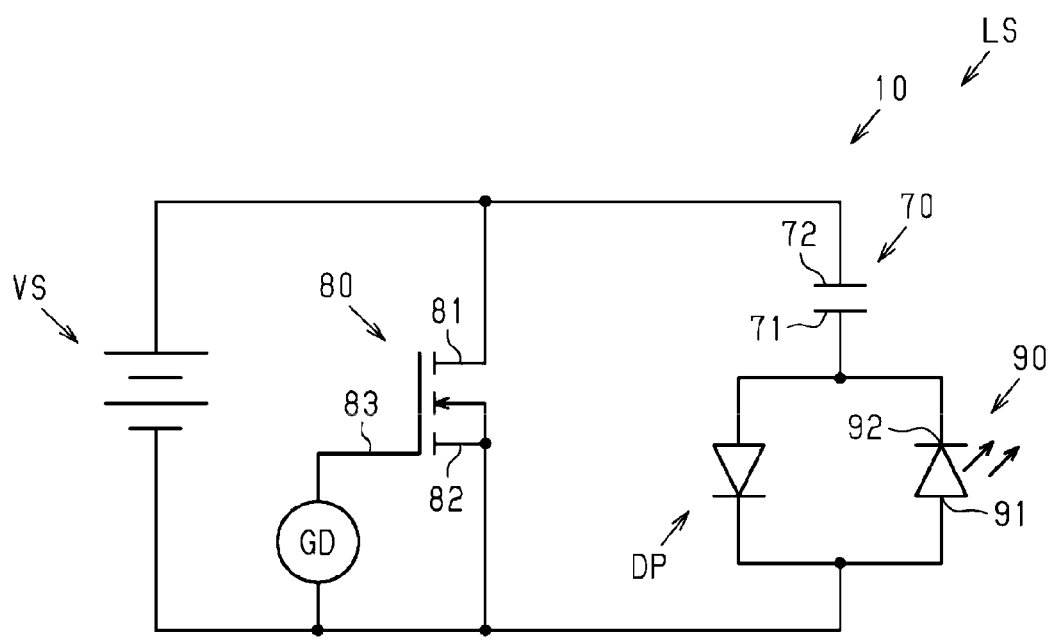
FIG. 8 is a schematic circuit diagram of a laser system including the semiconductor light-emitting device of FIG. 1.

A circuit configuration of the semiconductor light-emitting device 10 having such a configuration will be described with reference to FIG. 8. FIG. 8 shows an example of a laser system LS including the semiconductor light-emitting device 10. An example of such a laser system LS is LIDAR.

As shown in FIG. 8, the semiconductor light-emitting device 10 is connected to an external power supply VS which is a DC power supply. The positive terminal of the external power supply VS is electrically connected to the drain electrode 81 of the switching element 80 and the second electrode 72 of the capacitor 70, and the negative terminal thereof is connected to the source electrode 82 of the switching element 80. That is, the positive terminal of the external power supply VS is electrically connected to the second wiring 62 which is the power supply terminal. The negative terminal of the external power supply VS is electrically connected to the fourth wiring 64 which is the ground terminal.

The source electrode 82 is electrically connected to the anode electrode 91 of the light-emitting element 90. The cathode electrode 92 of the light-emitting element 90 is electrically connected to the first electrode 71 of the capacitor 70.

A gate driver circuit GD is electrically connected to the gate electrode 83 of the switching element 80. The gate driver circuit GD is a circuit that controls an on/off operation of the switching element 80 by applying a gate voltage to the gate electrode 83 of the switching element 80.

A protective diode DP is connected to the light-emitting element 90 in antiparallel. That is, the cathode electrode of the protective diode DP is connected to the anode electrode 91 of the light-emitting element 90, and the anode electrode of the protective diode DP is connected to the cathode electrode 92 of the light-emitting element 90. The protective diode DP is a protective element provided outside the semiconductor light-emitting device 10.

In the semiconductor light-emitting device 10, when the switching element 80 is turned off by the gate driver circuit GD, the capacitor 70 is charged by the external power supply VS. Then, when the switching element 80 is turned on by the gate driver circuit GD, the capacitor 70 is discharged to allow a current to flow through the switching element 80. As a result, the light-emitting element 90 emits laser light.

(Operation)

Figure 9:
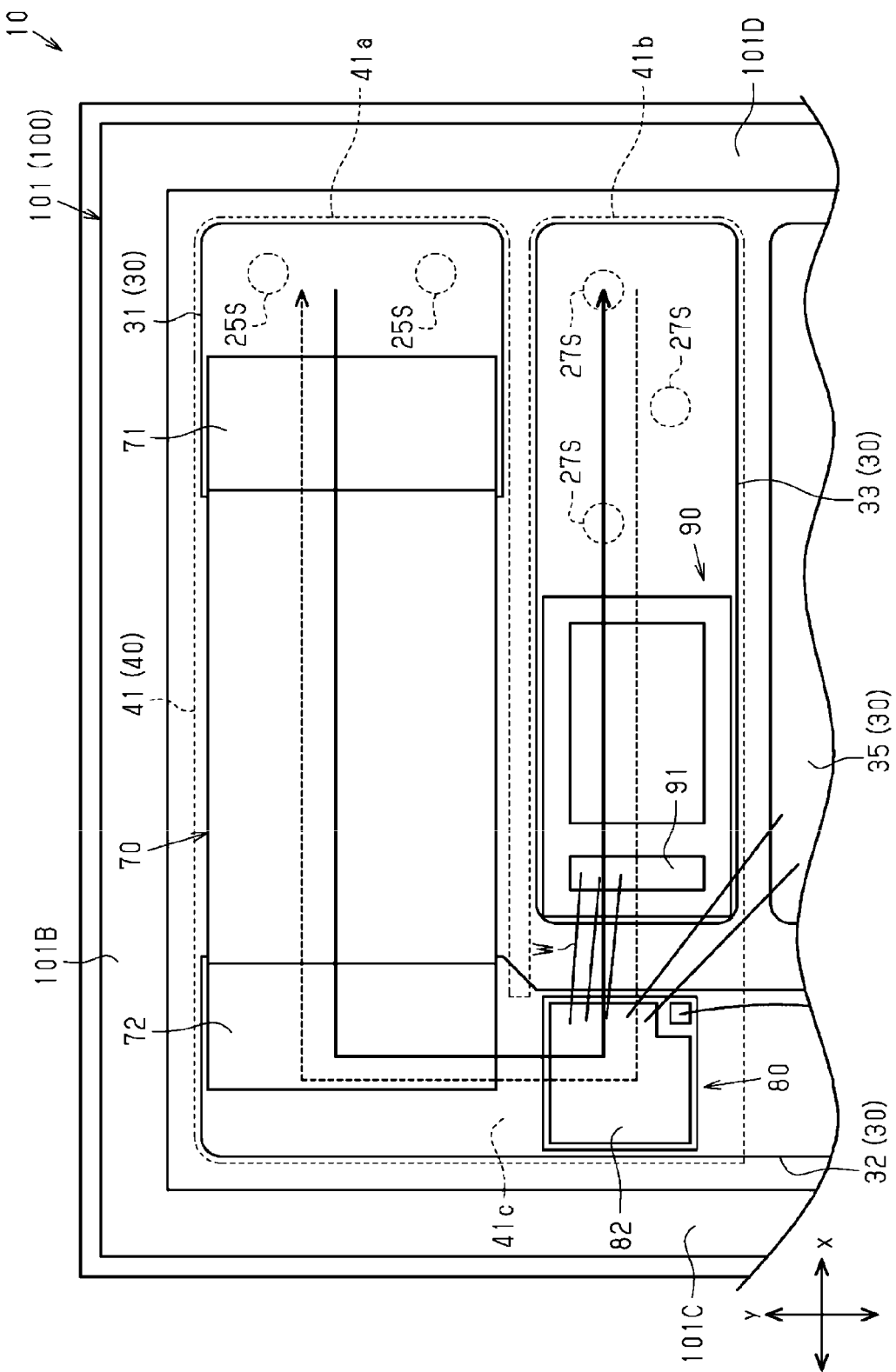
FIG. 9 is a plan view showing a first current path and a second current path of a semiconductor light-emitting device.

The operation of the semiconductor light-emitting device 10 according to the present embodiment will be described. In FIG. 9, the first wiring 41 of the second conductive layer 40 is indicated by a broken line for the sake of convenience. Further, in order to make the first wiring 41 easier to see, the first wiring 41 is shown to be slightly larger than an actual width dimension of the first wiring 41 such that it does not overlap the first conductive layer 30. Further, in FIG. 9, a solid-line arrow indicating a current flow direction indicates the first current path, and a broken line arrow indicates the second current path.

As shown in FIG. 9, when the switching element 80 is turned on, the first current path through which a current flows in the order of the first electrode 71 and the second electrode 72 of the capacitor 70, the second wiring 32 of the first conductive layer 30, the drain electrode 81 (see FIG. 4) and the source electrode 82 of the switching element 80, the wire W, the anode electrode 91 and the cathode electrode 92 (see FIG. 4) of the light-emitting element 90, and the third wiring 33 is formed. Then, a current flows in the order of the third through-wiring 27S, the second wiring portion 41b, the third wiring portion 41c, and the first wiring portion 41a of the first wiring 41 of the second conductive layer 40. That is, when a current flows along the first current path on the side of the substrate main surface 20As of the first substrate 20A, a current flows in the direction opposite to a direction in which the current flows through the first current path on the side of the substrate back surface 20Ar of the first substrate 20A. In other words, a current flows in the second current path. Therefore, a magnetic flux caused by the current flowing along the first current path and a magnetic flux caused by the current flowing along the second current path cancel each other out. As a result, an inductance in a loop of the current flowing through the capacitor 70, the switching element 80, and the light-emitting element 90 is reduced.

Figure 10:
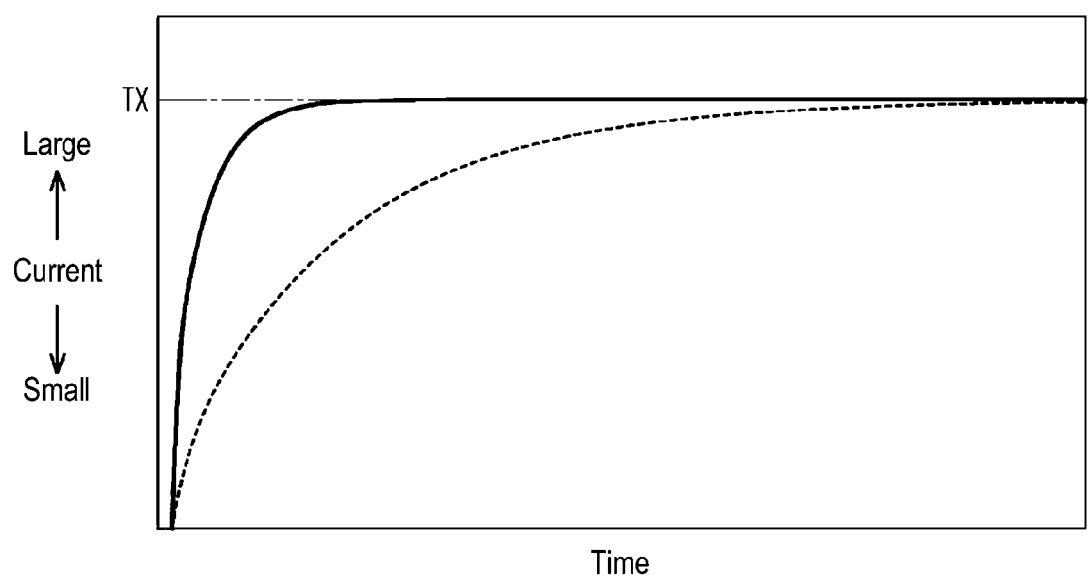
FIG. 10 is a graph showing transition of a current flowing through a light-emitting element of a semiconductor light-emitting device.

A graph of FIG. 10 shows a transition of a current flowing when a light-emitting element emits light in Experimental Example 1 and a transition of a current flowing when a light-emitting element emits light in Experimental Example 2. A solid line graph corresponds to Experimental Example 1, and a broken line graph corresponds to Experimental Example 2. Experimental Example 1 is a configuration of the semiconductor light-emitting device 10 of the present embodiment, and Experimental Example 2 is a configuration of a semiconductor light-emitting device in which the loop of a current flowing through the capacitor 70, the switching element 80, and the light-emitting element 90 is formed on the board main surface 20s of the multilayer board 20.

In Experimental Example 1, since the current flow in the first current path on the side of the board main surface 20s and the current flow in the second current path on the substrate back surface 20Ar are opposite to each other, the loop of the current flowing through the capacitor 70, the switching element 80, and the light-emitting element 90 is a sum of the first current path, the second current path, the first through-wiring 25S, and the third through-wiring 27S.

In Experimental Example 2, since the current loop is formed on the board main surface 20s, this loop is roughly equal to the sum of the first current path and a distance between the light-emitting element 90 and the first electrode 71 of the capacitor 70.

In this way, the length of the loop in Experimental Example 1 is longer than the length of the loop in Experimental Example 2. However, as shown in FIG. 10, the time from when a current is supplied to the light-emitting element 90 until the magnitude of the current supplied to the light-emitting element 90 reaches a threshold value TX in Experimental Example 1 is shorter than the time from when a current is supplied to the light-emitting element 90 until the magnitude of the current supplied to the light-emitting element 90 reaches a threshold value TX in Experimental Example 2. That is, it may be seen that it is more effective in reducing an inductance in the semiconductor light-emitting device to reduce a magnetic flux generated in the loop than to reduce a length of the loop of the current flowing through the capacitor 70, the switching element 80, and the light-emitting element 90.

From this result, when the semiconductor light-emitting device 10 is applied to LIDAR, an output waveform of LIDAR may rise faster, thereby making the output waveform closer to a square wave. Therefore, the accuracy of measurement of a distance to an object by LIDAR may be improved.

(Effects)

According to the semiconductor light-emitting device 10 of the present embodiment, the following effects may be obtained.

(1-1) The semiconductor light-emitting device 10 includes the multilayer board 20 having the board main surface 20s, the board back surface 20r facing the side opposite to the board main surface 20s, the first conductive layer 30 formed on the board main surface 20s, and the second conductive layer 40 formed on the side of the board back surface 20r with respect to the first conductive layer 30, and further includes the light-emitting element 90, the switching element 80, and the capacitor 70, which are electrically connected to one another by the first conductive layer 30. When viewed in the z direction, the capacitor 70 and the switching element 80 are arranged in the y direction, and the switching element 80 and the light-emitting element 90 are arranged in the x direction. The first wiring 41 is formed to overlap the first current path of the current flowing through the light-emitting element 90, the switching element 80, and the capacitor 70 on the board main surface 20s when viewed in the z direction and to form the second current path of the current flowing in the direction opposite to the direction in which the current flows through the first current path.

According to this configuration, the magnetic flux generated by the current flowing in the first current path and the magnetic flux generated by the current flowing in the second current path cancel each other out, such that the inductance caused by the loop of the current flowing through the capacitor 70, the switching element 80, and the light-emitting element 90 may be reduced.

(1-2) When viewed in the z direction, the first wiring portion 41a of the first wiring 41 of the second conductive layer 40 is formed to overlap the entire capacitor 70, and the second wiring portion 41b thereof is formed to overlap both the entire switching element 80 and the entire light-emitting element 90.

According to this configuration, in comparison with at least one of a configuration where a portion of the capacitor 70 is arranged to be deviated from the first wiring portion 41a when viewed in the z direction and a configuration where portions of both the switching element 80 and the light-emitting element 90 are arranged to be deviated from the second wiring portion 41b when viewed in the z direction, a region where the magnetic flux generated by the current flowing in the first current path and the magnetic flux generated by the current flowing in the second current path of the current flowing in the direction opposite to the direction in which the current flows through the first current path are opposed to each other in the z direction increases. Therefore, it is possible to enhance an effect of cancelling out the magnetic flux generated by the current flowing in the first current path and the magnetic flux generated by the current flowing in the second current path. Therefore, it is possible to further reduce an inductance caused by the loop of the current flowing through the capacitor 70, the switching element 80, and the light-emitting element 90.

(1-3) When viewed in the z direction, the dimension of the second wiring portion 41b of the first wiring 41 of the second conductive layer 40 in the y direction is equal to the dimension of the third wiring 33 of the first conductive layer 30 in the y direction, and the dimension of the first wiring portion 41a of the first wiring 41 in the y direction is equal to the dimension of the capacitor 70 in the y direction.

According to this configuration, for example, in comparison with at least one of a configuration where the dimension of the second wiring portion 41b in the y direction is different from the dimension of the third wiring 33 in the y direction and a configuration where the dimension of the first wiring portion 41a in the y direction is different from the dimension of the capacitor 70 in the y direction, a region where the magnetic flux generated by the current flowing through the first current path and the magnetic flux generated by the current flowing through the second current path of the current flowing in the direction opposite to the direction in which the current flows through the first current path do not overlap each other in the z direction decreases. Therefore, it is possible to reduce magnetic fluxes, among the magnetic fluxes generated by the current flowing in the first current path and the magnetic fluxes generated by the current flowing in the second current path, which do not cancel each other out. Therefore, it is possible to further reduce the inductance caused by the loop of the current flowing through the capacitor 70, the switching element 80, and the light-emitting element 90.

(1-4) The multilayer board 20 has the first to third substrates 20A to 20C and the first to fourth conductive layers 30, 40, 50, and 60. The first substrate 20A constituting the board main surface 20s of the multilayer board 20 has the substrate main surface 20As constituting the board main surface 20s, and the substrate back surface 20Ar facing the side opposite to the substrate main surface 20As. The first wiring 41 of the second conductive layer 40 constituting the wiring pattern is formed on the substrate back surface 20Ar.

According to this configuration, in the z direction, the current flowing through the first current path and the current flowing in the second current path of the current flowing in the direction opposite to the direction in which the current flows through the first current path may be brought close to each other. As a result, it is possible to enhance the effect of cancelling out the magnetic flux generated by the current flowing through the first current path and the magnetic flux generated by the current flowing through the second current path. Therefore, it is possible to further reduce the inductance caused by the loop of the current flowing through the capacitor 70, the switching element 80, and the light-emitting element 90.

(1-5) The semiconductor light-emitting device 10 includes the case 100 which includes the side wall 101 surrounding the capacitor 70, the switching element 80, and the light-emitting element 90, and the light-transmitting plate 102 provided on the side wall 101 and arranged at a position where it overlaps the light-emitting element 90 when viewed in the z direction. The light-emitting element 90 emits light such that the light spreads away from the multilayer board 20 in the z direction. The light-emitting element 90 is mounted on the multilayer board 20 so that a light-emitting region between the light-transmitting plate 102 and the multilayer board 20 is formed at an inward side from the side wall 101 when viewed in the z direction.

According to this configuration, since the light emitted from the light-emitting element 90 toward the light-transmitting plate 102 does not interfere with the side wall 101, all the light emitted from the light-emitting element 90 toward the light-transmitting plate 102 passes through the light-transmitting plate 102. Therefore, it is possible to suppress the light-emitting region of the light-emitting element 90 from narrowing when viewed in the z direction.

(1-6) The switching element 80 and the light-emitting element 90 are arranged apart from each other in the y direction. The light-emitting element 90 is arranged closer to the center of the multilayer board 20 in the x direction than the switching element 80.

According to this configuration, the light emitted from the light-emitting element 90 toward the light-transmitting plate 102 is surely not interfered by the side wall 101. Therefore, it is possible to suppress the narrowing of the light-emitting region of the light-emitting element 90 when viewed in the z direction.

(1-7) The dimension of the capacitor 70 in the x direction is larger than the sum of the dimension of the switching element 80 in the x direction and the dimension of the light-emitting element 90 in the x direction. The switching element 80 and the light-emitting element 90 are arranged apart from each other in the y direction and are arranged apart from each other in the x direction with respect to the capacitor 70.

According to this configuration, the multilayer board 20 may be miniaturized as compared with a configuration where the capacitor 70, the switching element 80, and the light-emitting element 90 are arranged, in a row, side by side in the y direction.

Second Embodiment

A semiconductor light-emitting device 10 according to a second embodiment of the present disclosure will be described with reference to FIGS. 11 and 12. The semiconductor light-emitting device 10 according to the second embodiment is different from the semiconductor light-emitting device 10 of the first embodiment in the arrangement positions of the switching element 80 and the light-emitting element 90 and the shapes of the plurality of conductive layers of the multilayer board 20. In the following description, the same constituent elements as those of the semiconductor light-emitting device 10 of the first embodiment are denoted by the same reference numerals, and explanation thereof may be omitted. Further, the plurality of conductive layers of the multilayer board 20 will be described as a first conductive layer 30A, a second conductive layer 40A, a third conductive layer 50, and a fourth conductive layer 60.

Figure 11:
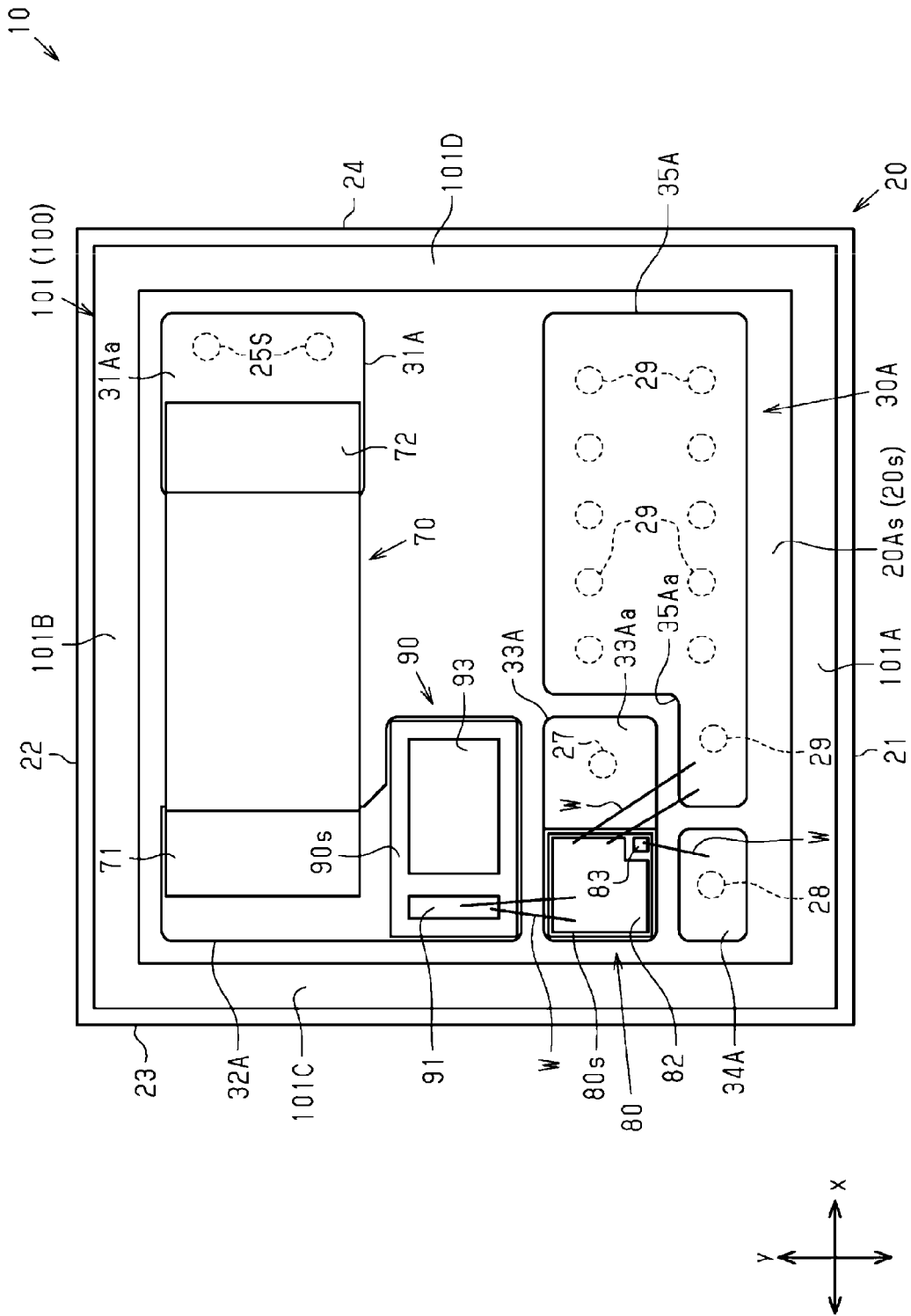
FIG. 11 is a plan view showing an internal structure of a semiconductor light-emitting device according to a second embodiment of the present disclosure.

As shown in FIG. 11, the capacitor 70, the switching element 80, and the light-emitting element 90 are arranged in the y direction. Here, also in the present embodiment, the y direction corresponds to the "first direction."

The capacitor 70, the switching element 80, and the light-emitting element 90 are arranged at positions where they at least partially overlap each other when viewed in the y direction. That is, when the capacitor 70, the switching element 80, and the light-emitting element 90 are arranged at a position where they at least partially overlap each other when viewed in the y direction, it may be said that the capacitor 70, the switching element 80, and the light-emitting element 90 are arranged in the y direction. In the present embodiment, when viewed in they direction, a portion of the light-emitting element 90 and a portion of the switching element 80 protrude from the capacitor 70 in the x direction. When viewed in the y direction, the switching element 80 is arranged at a position where it entirely overlaps the light-emitting element 90.

Further, when viewed in the y direction, the switching element 80 may be arranged to partially protrude from the light-emitting element 90. That is, both the switching element 80 and the light-emitting element 90 may be arranged at positions where they at least partially overlap each other when viewed in the y direction.

The capacitor 70 is arranged in the same manner as in the first embodiment. That is, when viewed in the z direction, the capacitor 70 is arranged such that its longitudinal direction is along the x direction and its lateral direction is along the y direction. The first electrode 71 and the second electrode 72 of the capacitor 70 are arranged apart from each other in the x direction. In the present embodiment, the first electrode 71 of the capacitor 70 is arranged adjacent to the third side wall 101C in the x direction, and the second electrode 72 thereof is arranged adjacent to the fourth side wall 101D in the x direction.

The light-emitting element 90 is arranged closer to the capacitor 70 than the switching element 80 in the y direction. That is, the light-emitting element 90 is interposed between the capacitor 70 and the switching element 80 in the y direction. When viewed in the y direction, the light-emitting element 90 is arranged at a position where it overlaps the first electrode 71 of the capacitor 70.

When viewed in the z direction, the light-emitting element 90 is arranged such that the x direction is a long side direction and the y direction is a short side direction. The anode electrodes 91 formed on the light-emitting element main surface 90s of the light-emitting element 90 are provided at an end, between both ends of the light-emitting element main surface 90s, which is closer to the third side wall 101C in the x direction. In the present embodiment, the anode electrode 91 is arranged closer to the third side wall 101C than the first electrode 71 of the capacitor 70.

The switching element 80 is arranged closer to the third side wall 101C than the light-emitting element 90 in the x direction. More specifically, the switching element 80 is arranged so that its center in the x direction is closer to the third side wall 101C than the center of the light-emitting element 90 in the x direction. In the present embodiment, an end, between both ends of the switching element 80, which is closer to the third side wall 101C in the x direction and an end, between both ends of the light-emitting element 90, which is closer to the third side wall 101C in the x direction are arranged at positions where they are aligned with each other.

Figure 12:
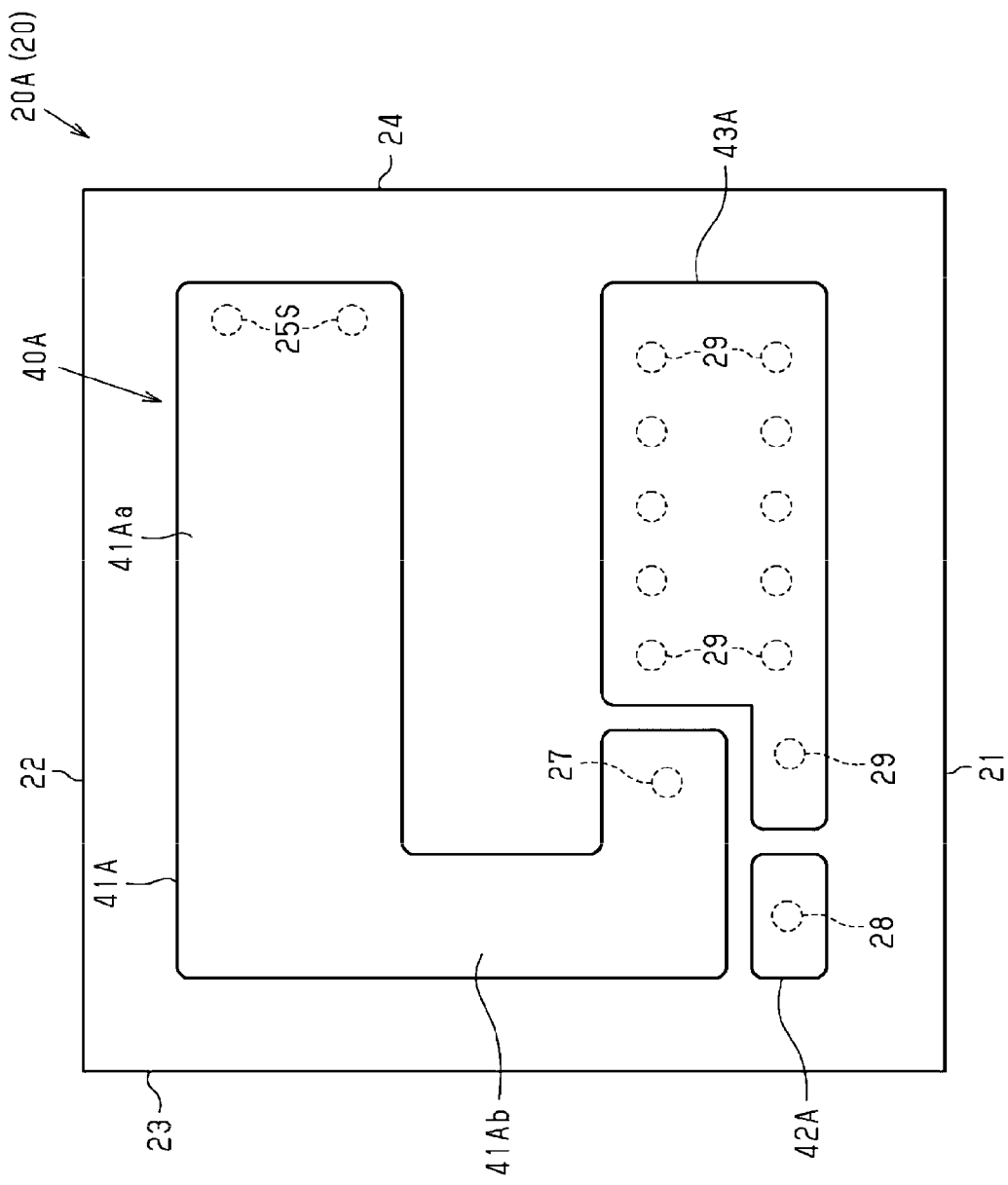
FIG. 12 is a perspective view showing a wiring pattern on a side of the substrate back surface of a first substrate constituting a board main surface of a multilayer board of the semiconductor light-emitting device of FIG. 11.

As shown in FIGS. 11 and 12, the multilayer board 20 of the present embodiment is different from the multilayer board 20 of the first embodiment in the configurations of the first conductive layer and the second conductive layer. In the following description, the first conductive layer is referred to as the "first conductive layer 30A," and the second conductive layer is referred to as the "second conductive layer 40A." The third conductive layer 50 and the fourth conductive layer 60 have substantially the same configurations as those of the first embodiment, although the shape of each wiring is changed from the first embodiment, and therefore, explanation thereof will be omitted.

As shown in FIG. 11, the first conductive layer 30A of the multilayer board 20 includes a first wiring 31A, a second wiring 32A, a third wiring 33A, a fourth wiring 34A, and a fifth wiring 35A. Here, in the present embodiment, the first conductive layer 30A corresponds to a "first wiring pattern." Further, the first wiring 31A corresponds to a "first front surface side wiring," the second wiring 32A corresponds to a "second front surface side wiring," and the third wiring 33A corresponds to a "third front surface side wiring."

The first wiring 31A is a wiring on which the second electrode 72 of the capacitor 70 is mounted. The second electrode 72 is bonded to the first wiring 31A by a conductive bonding material. As a result, the second electrode 72 is electrically connected to the first wiring 31A. When viewed in the z direction, the arrangement position and shape of the first wiring 31A are the same as those of the first wiring 31 of the first embodiment. That is, the first wiring 31A has an extension wiring 31Aa.

The second wiring 32A is a wiring on which both the first electrode 71 of the capacitor 70 and the light-emitting element 90 are mounted. The first electrode 71 of the capacitor 70 and the light-emitting element back surface 90r (not shown in FIG. 11) of the light-emitting element 90 are bonded to the second wiring 32A by a conductive bonding material. As a result, both the first electrode 71 of the capacitor 70 and the cathode electrode 92 (not shown in FIG. 11) of the light-emitting element 90 are electrically connected to the second wiring 32A.

The shape of the second wiring 32A viewed from the z direction is substantially L-shaped. The first electrode 71 of the capacitor 70 is mounted on an end, between both ends of the second wiring 32A, which is closer to the second side wall 101B in the y direction, and the light-emitting element 90 is mounted on an end, between both ends of the second wiring 32A, which is closer to the first side wall 101A in the y direction. A dimension, in the x direction, of the end, between both ends of the second wiring 32A, which is closer to the first side wall 101A in the y direction is larger than a dimension in the x direction of the end, between both ends of the second wiring 32A, which is closer to the second side wall 101B in they direction. That is, the dimension, in the x direction, of the end, between both ends of the second wiring 32A, which is closer to the first side wall 101A in they direction is larger than the dimension, in the x direction, of another portion of the second wiring 32A on which the light-emitting element 90 is mounted. In the present embodiment, the multilayer board 20 does not have the second through-wiring 26.

The third wiring 33A is a wiring on which the switching element 80 is mounted. The switching element back surface 80r of the switching element 80 is bonded to the third wiring 33A by a conductive bonding material. As a result, the drain electrode 81 of the switching element 80 is electrically connected to the third wiring 33A.

The third wiring 33A is arranged closer to the first side wall 101A than the second wiring 32A. The third wiring 33A is interposed between the second wiring 32A and the fourth wiring 34A in the y direction.

The shape of the third wiring 33A viewed from the z direction is substantially a rectangular shape in which the x direction is a long side direction and the y direction is a short side direction. It may be said that the third wiring 33A extends in the x direction. The switching element 80 is arranged at the end, between both ends of the third wiring 33A, which is closer to the third side wall 101C in the x direction. In other words, the third wiring 33A includes an extension wiring 33Aa extending along the x direction from the switching element 80 toward the fourth side wall 101D when viewed in the z direction. When viewed in the y direction, the extension wiring 33Aa is formed to be aligned with the light-emitting element 90 in the x direction. The third through-wiring 27 is arranged at a position where it overlaps the extension wiring 33Aa when viewed in the z direction.

The fourth wiring 34A is a wiring electrically connected to the gate electrode 83 of the switching element 80. The gate electrode 83 of the switching element 80 is connected to the fourth wiring 34A by a wire W. As a result, the gate electrode 83 is electrically connected to the fourth wiring 34A. When viewed in the z direction, the arrangement position and shape of the fourth wiring 34A are the same as those of the fourth wiring 34 of the first embodiment. Similar to the first embodiment, the fourth through-wiring 28 is arranged at a position where it overlaps the fourth wiring 34A when viewed in the z direction.

The fifth wiring 35A is a wiring connected to the ground. The source electrode 82 of the switching element 80 is connected to the fifth wiring 35A by a wire W. As a result, the source electrode 82 is electrically connected to the fifth wiring 35A.

The fifth wiring 35A is formed near the board side surface 21 and the board side surface 24 of the board main surface 20s. The fifth wiring 35A is arranged at a position adjacent to both the first side wall 101A and the fourth side wall 101D. When viewed in they direction, the fifth wiring 35A is arranged at a position where it overlaps the first wiring 31A, the second wiring 32A, and the third wiring 33A. When viewed in the x direction, the fifth wiring 35A is arranged at a position where it overlaps both the third wiring 33A and the fourth wiring 34A.

The shape of the fifth wiring 35A viewed from the z direction is substantially a rectangular shape having a recessed portion 35Aa, in which the x direction is a long side direction and the y direction is a short side direction. The recessed portion 35Aa is formed at an end, which is closer to the third side wall 101C, of both ends of the fifth wiring 35A in the x direction. The third wiring 33A enters the recessed portion 35Aa. A dimension of the fifth wiring 35A in the x direction is larger than the dimension of the third wiring 33A in the x direction. A width dimension of the fifth wiring 35A (a dimension of the fifth wiring 35A in they direction) is larger than the width dimension of the third wiring 33A (the dimension of the third wiring 33A in they direction). Similar to the first embodiment, the plurality of fifth through-wirings 29 are arranged at positions where they overlap the fifth wiring 35A when viewed in the z direction.

In the board main surface 20s of the multilayer board 20, a first current path in which a current flows through the light-emitting element 90, the switching element 80, and the capacitor 70 is formed by the first conductive layer 30A, the light-emitting element 90, the switching element 80, and the capacitor 70. The first current path is a path through which a current flows in the order of, for example, the first electrode 71 of the capacitor 70, the second wiring 32A, the drain electrode 81 and the source electrode 82 of the switching element 80, the wire W, the anode electrode 91 and the cathode electrode 92 of the light-emitting element 90, and the third wiring 33A.

As shown in FIG. 12, the second conductive layer 40A is an inner layer pattern formed in the multilayer board 20. Here, in the present embodiment, the second conductive layer 40A corresponds to a "second wiring pattern." That is, the light-emitting element 90, the switching element 80, and the capacitor 70 are electrically connected to one another by both the conductive layers 30A and 40A.

The second conductive layer 40A is formed on the substrate back surface 20Ar of the first substrate 20A. When viewed in the z direction, the second conductive layer 40A is formed to overlap the first current path and form a second current path of a current flowing in a direction opposite to a direction in which the current flows through the first current path.

The second conductive layer 40A includes a first wiring 41A, a second wiring 42A, and a third wiring 43A. The first to third wirings 41A to 43A are arranged apart from one another. The first wiring 41A corresponds to a "back surface side wiring."

When viewed in the z direction, the first wiring 41A is a wiring provided at a position where it overlaps the first current path, and is electrically connected to both the first wiring 31A and the third wiring 33A of the first conductive layer 30A. The first wiring 41A is a wiring that forms the second current path. The first wiring 41A is connected to the first wiring 31A by a first through-wiring 25S, and is connected to the third wiring 33A by a third through-wiring 27. Here, the third through-wiring 27 is a wiring that penetrates the multilayer board 20 in the z direction. That is, the third through-wiring 27 is connected to the third wiring 33 of the first conductive layer 30A, the first wiring 41A of the second conductive layer 40A, the second wiring 52 of the third conductive layer 50, and the second wiring 62 of the fourth conductive layer 60.

As shown in FIGS. 11 and 12, the first wiring 41A is provided at a position where it overlaps the first wiring 31A, the second wiring 32A, and the third wiring 33A of the first conductive layer 30A when viewed in the z direction. The first wiring 31A, the second wiring 32A, and the third wiring 33A are wirings that form the first current path in the first conductive layer 30A.

The first wiring 41A includes a first wiring portion 41Aa that overlaps both the first electrode 71 and the second electrode 72 of the capacitor 70 when viewed in the z direction, and a second wiring portion 41Ab that overlaps both the light-emitting element 90 and the switching element 80 when viewed in the z direction.

The first wiring portion 41Aa extends in the x direction. A width dimension of the first wiring portion 41Aa (a dimension of the first wiring portion 41Aa in the y direction) is equal to the width dimension of the first wiring 31A of the first conductive layer 30A (the dimension of the first wiring 31A in the y direction). Further, the width dimension of the first wiring portion 41Aa is equal to the dimension of the capacitor 70 in the y direction. Similar to the first embodiment, in consideration of a deviation of a mounting position of the capacitor 70, even when the width dimension of the first wiring portion 41Aa is slightly larger than the dimension of the capacitor 70 in the y direction, it may be said that the width dimension of the first wiring portion 41Aa (the dimension of the first wiring portion 41Aa in they direction) is equal to the dimension of the capacitor 70 in they direction.

When viewed in the z direction, both ends of the first wiring portion 41Aa in the x direction protrude from the capacitor 70. That is, the length of the first wiring portion 41Aa in the x direction is longer than the length of the capacitor 70 in the x direction. The first wiring portion 41Aa extends to a position where it overlaps the first wiring 31A when viewed in the z direction. A portion of the first wiring portion 41Aa that overlaps the first wiring 31A when viewed in the z direction is connected to the first wiring 31A via the first through-wiring 25S.

The second wiring portion 41Ab extends in they direction from one among both ends of the first wiring portion 41Aa that is closer to the board side surface 23 in the x direction. The second wiring portion 41Ab extends from the first wiring portion 41Aa toward the board side surface 21. The third through-wiring 27 is connected to the second wiring portion 41Ab. That is, the second wiring portion 41Ab is connected to the third wiring 33A of the first conductive layer 30A via the third through-wiring 27. In the present embodiment, the third through-wiring 27 is a wiring that penetrates the multilayer board 20 in the z direction. The third through-wiring 27 is formed of, for example, a via formed by burying a conductor in a through-hole penetrating the multilayer board 20 in the z direction. The third through-wiring 27 may be formed by a through-hole.

The third through-wiring 27 is connected to the third wiring 33 of the first conductive layer 30, the first wiring 41 of the second conductive layer 40, the second wiring 52 of the third conductive layer 50, and the second wiring 62 of the fourth conductive layer 60. As a result, the third wiring 33, the first wiring 41, the second wiring 52, and the second wiring 62 are electrically connected to each other.

Since the third through-wiring 27 is provided at a position where it does not overlap the switching element 80 when viewed in the z direction, the dimension, in the x direction, of an end, between both ends of the second wiring portion 41Ab, which is closer to the board side surface 21 in the y direction is larger than the dimension, in the x direction, of another portion of the second wiring portion 41Ab. The dimension, in the x direction, of another portion of the second wiring portion 41Ab is substantially equal to the dimension of the switching element 80 in the x direction.

When viewed in the z direction, the second wiring 42A is arranged at a position where it overlaps the fourth wiring 34A of the first conductive layer 30A. The shape and size of the second wiring 42A viewed from the z direction are the same as the shape and size of the fourth wiring 34A viewed from the z direction. The second wiring 42A is connected to the fourth wiring 34A by the fourth through-wiring 28.

Since the fourth through-wiring 28 penetrates the multilayer board 20 in the z direction, the fourth through-wiring 28 is a wiring that connects the fourth wiring 34A of the first conductive layer 30A, the second wiring 42A of the second conductive layer 40A, the third wiring 53 of the third conductive layer 50, and the third wiring 63 of the fourth conductive layer 60. As a result, the fourth wiring 34A, the second wiring 42A, the third wiring 53, and the third wiring 63 are electrically connected to one another.

When viewed in the z direction, the third wiring 43A is arranged at a position where it overlaps the fifth wiring 35A of the first conductive layer 30A. The shape and size of the third wiring 43A viewed from the z direction are the same as the shape and size of the fifth wiring 35A viewed from the z direction.

Since the fifth through-wiring 29 penetrates the multilayer board 20 in the z direction, the fifth through-wiring 29 is a wiring that connects the fifth wiring 35A of the first conductive layer 30A, the third wiring 43A of the second conductive layer 40A, the fourth wiring 54 of the third conductive layer 50, and the fourth wiring 64 of the fourth conductive layer 60. As a result, the fifth wiring 35A, the third wiring 43A, the fourth wiring 54, and the fourth wiring 64 are electrically connected to each other.

According to the semiconductor light-emitting device 10 having the aforementioned configuration, when the switching element 80 is turned on, the first current path through which a current flows in the order of the first electrode 71 of the capacitor 70, the second wiring 32A of the first conductive layer 30A, the drain electrode 81 (not shown) and the source electrode 82 of the switching element 80, the wire W, the anode electrode 91 and the cathode electrode 92 (not shown) of the light-emitting element 90, and the third wiring 33A is formed. Then, the current flowing through the first current path flows in the order of the third through-wiring 27, the second wiring portion 41Ab of the first wiring 41A of the second conductive layer 40A, and the first wiring portion 41Aa thereof. That is, when the current flows in the first current path, a current flows in the second current path which is the same path but through which the current flows in the opposite direction. Therefore, a magnetic flux caused by the current flowing through the first current path and a magnetic flux caused by the current flowing through the second current path cancel each other out. As a result, an inductance in a loop of the current flowing through the capacitor 70, the switching element 80, and the light-emitting element 90 is reduced.

(Effects)

According to the semiconductor light-emitting device 10 of the present embodiment, the following effects may be obtained in addition to the effects of (1-2) to (1-5) of the first embodiment.

(2-1) The semiconductor light-emitting device 10 includes the multilayer board 20 having the board main surface 20s, the board back surface 20r facing the side opposite to the board main surface 20s, the first conductive layer 30A formed on the board main surface 20s, and the second conductive layer 40A formed on the side of the board back surface 20r with respect to the first conductive layer 30A, and further includes the light-emitting element 90, the switching element 80, and the capacitor 70, which are electrically connected to one another by the first conductive layer 30A. When viewed in the z direction, the capacitor 70 has a shape having a longitudinal direction and a lateral direction. The capacitor 70, the switching element 80, and the light-emitting element 90 are arranged in the y direction, which is the first direction orthogonal to the longitudinal direction when viewed in the z direction. The second conductive layer 40A is formed to overlap the first current path of the current flowing through the light-emitting element 90, the switching element 80, and the capacitor 70 on the board main surface 20s when viewed in the z direction and to configure the second current path of the current flowing in the direction opposite to the direction in which the current flows through the first current path.

According to this configuration, the magnetic flux generated by the current flowing through the first current path and the magnetic flux generated by the current flowing through the second current path cancel each other out, so that the inductance caused by the loop of the current flowing through the capacitor 70, the switching element 80, and the light-emitting element 90 may be reduced.

(2-2) The light-emitting element 90 is arranged so that the x direction is the long side direction and the y direction is the short side direction. According to this configuration, the size of a parts arrangement region from the capacitor 70 to the switching element 80 in the y direction may be reduced. On the other hand, since the dimension of the light-emitting element 90 in the x direction is smaller than the dimension of the capacitor 70 in the x direction, a dead space is formed in the x direction. By reducing the size of the dead space in the y direction, it is possible to suppress an increase in the size of the multilayer board 20.

Third Embodiment

Figure 13:
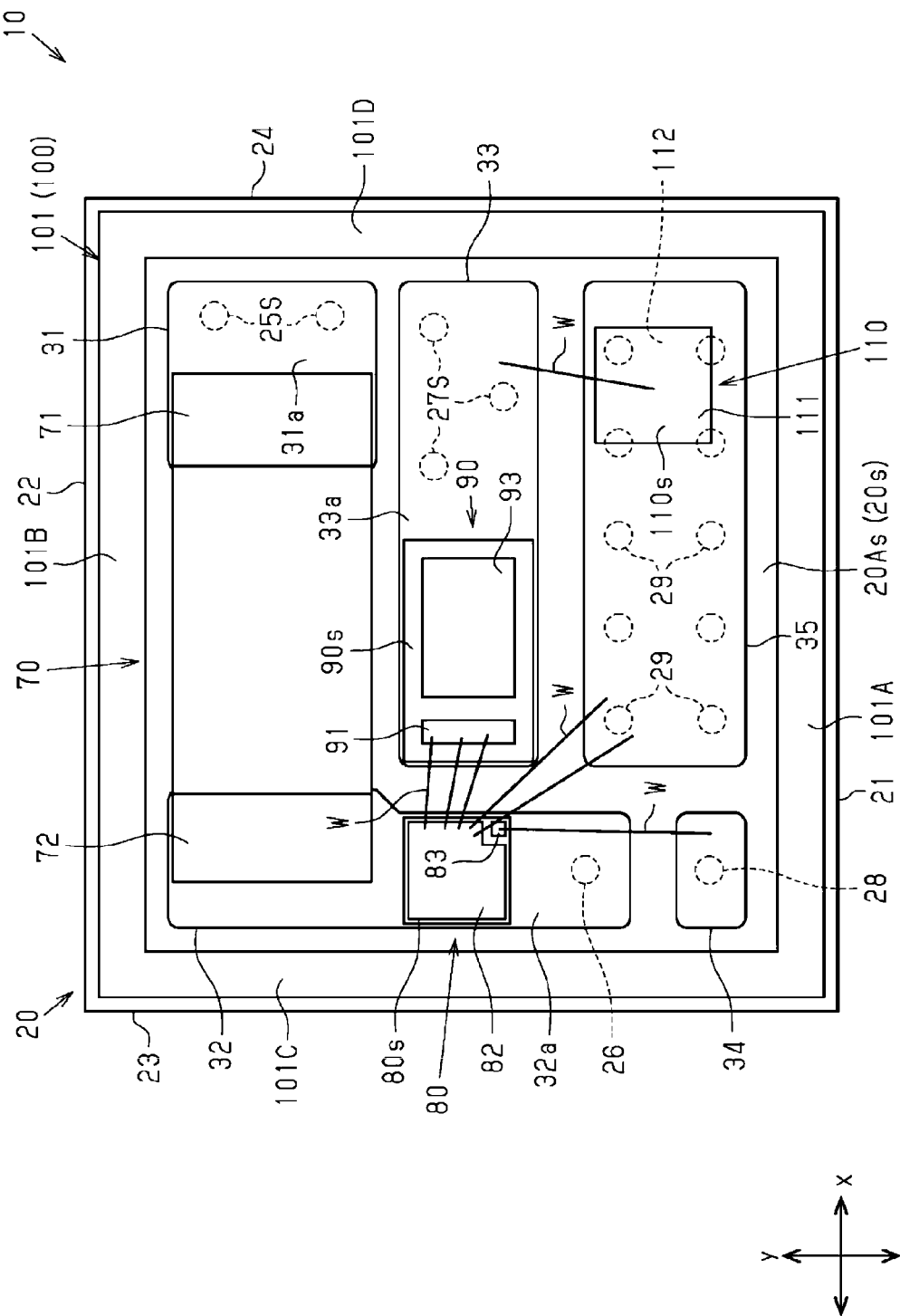
FIG. 13 is a plan view showing an internal structure of a semiconductor light-emitting device according to a third embodiment of the present disclosure.

A semiconductor light-emitting device 10 according to a third embodiment of the present disclosure will be described with reference to FIGS. 13 and 14. The semiconductor light-emitting device 10 according to the present embodiment is different from the semiconductor light-emitting device 10 of the first embodiment in that a protective diode 110 is added. In the following description, the same constituent elements as those of the semiconductor light-emitting device 10 of the first embodiment are denoted by the same reference numerals, and explanation thereof may be omitted.

The protective diode 110 is an element corresponding to the protective diode DP (see FIG. 8) of the first embodiment and is built in the semiconductor light-emitting device 10. More specifically, as shown in FIG. 13, the protective diode 110 is mounted on the board main surface 20s of the multilayer board 20. The protective diode 110 is, for example, a fast recovery diode and is configured as a chip component. The protective diode 110 is formed in a rectangular flat plate shape. The protective diode 110 has a diode main surface 110s and a diode back surface (not shown) facing opposite sides in the z direction. The protective diode 110 is mounted on the board main surface 20s so that the diode main surface 110s faces the same side as the board main surface 20s of the multilayer board 20.

Figure 14:
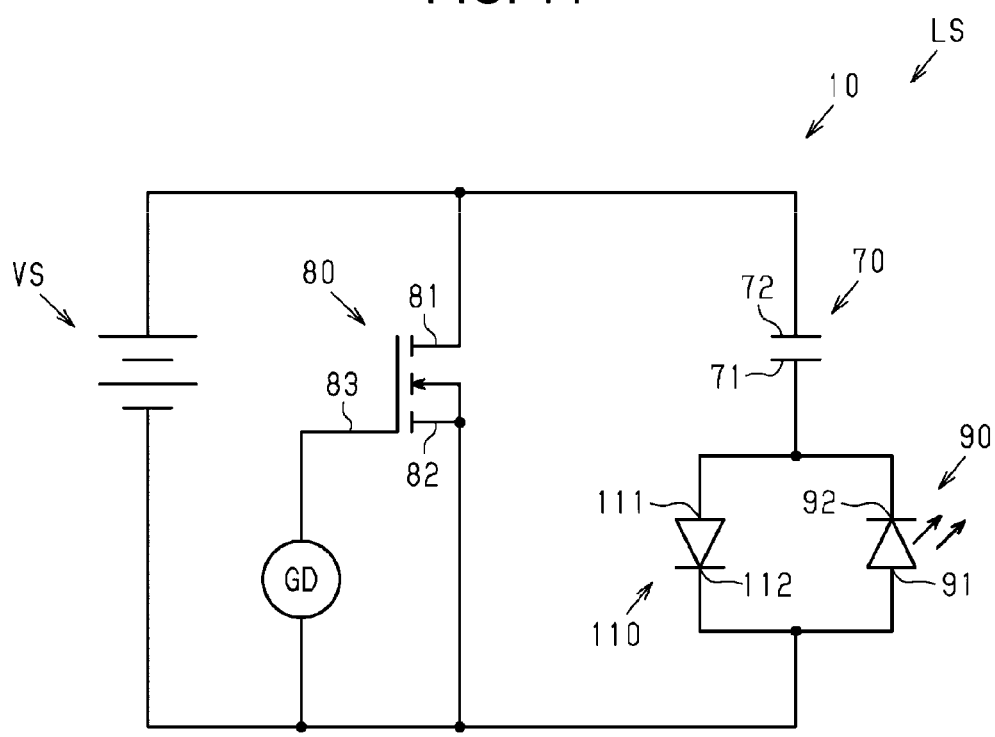
FIG. 14 is a schematic circuit diagram of a laser system including the semiconductor light-emitting device of FIG. 13.

The protective diode 110 includes an anode electrode 111 and a cathode electrode 112 (see FIG. 14). The anode electrode 111 is formed on the diode main surface 110s, and the cathode electrode 112 is formed on the diode back surface.

When viewed in the z direction, the protective diode 110 is mounted on the fifth wiring 35. The diode back surface of the protective diode 110 is bonded to the fifth wiring 35 by a conductive bonding material. As a result, the cathode electrode 112 of the protective diode 110 is electrically connected to the fifth wiring 35.

The anode electrode 111 is connected to the third wiring 33 by a wire W. As a result, the anode electrode 111 is electrically connected to the third wiring 33. The protective diode 110 is arranged closer to the fourth side wall 101D than the light-emitting element 90 in the x direction and is arranged closer to the first side wall 101A than the light-emitting element 90 in the y direction. When viewed in the y direction, the protective diode 110 is arranged at a position where it partially overlaps the first electrode 71 of the capacitor 70. In the present embodiment, a portion of the protective diode 110 in the x direction protrudes toward the fourth side wall 101D with respect to the first electrode 71 of the capacitor 70.

As shown in FIG. 14, the protective diode 110 is connected in antiparallel to the light-emitting element 90. The cathode electrode 112 of the protective diode 110 is electrically connected to the source electrode 82 of the switching element 80. The anode electrode 111 of the protective diode 110 is electrically connected to the first electrode 71 of the capacitor 70.

(Effects)

According to the semiconductor light-emitting device 10 of the present embodiment, the following effects may be obtained in addition to the effects of the first embodiment.

(3-1) The semiconductor light-emitting device 10 includes the protective diode 110. The protective diode 110 is connected in antiparallel to the light-emitting element 90. According to this configuration, it is possible to suppress an excessive reverse voltage being applied to the light-emitting element 90.

Fourth Embodiment

A semiconductor light-emitting device 10 according to the fourth embodiment of the present disclosure will be described with reference to FIGS. 15 and 16. The semiconductor light-emitting device 10 according to the present embodiment is different from the semiconductor light-emitting device 10 of the second embodiment in the arrangement positions of the switching element 80 and the light-emitting element 90 and the shapes of the plurality of conductive layers of the multilayer board 20. In the following description, the same constituent elements as those of the semiconductor light-emitting device 10 of the second embodiment are denoted by the same reference numerals, and explanation thereof may be omitted.

Figure 15:
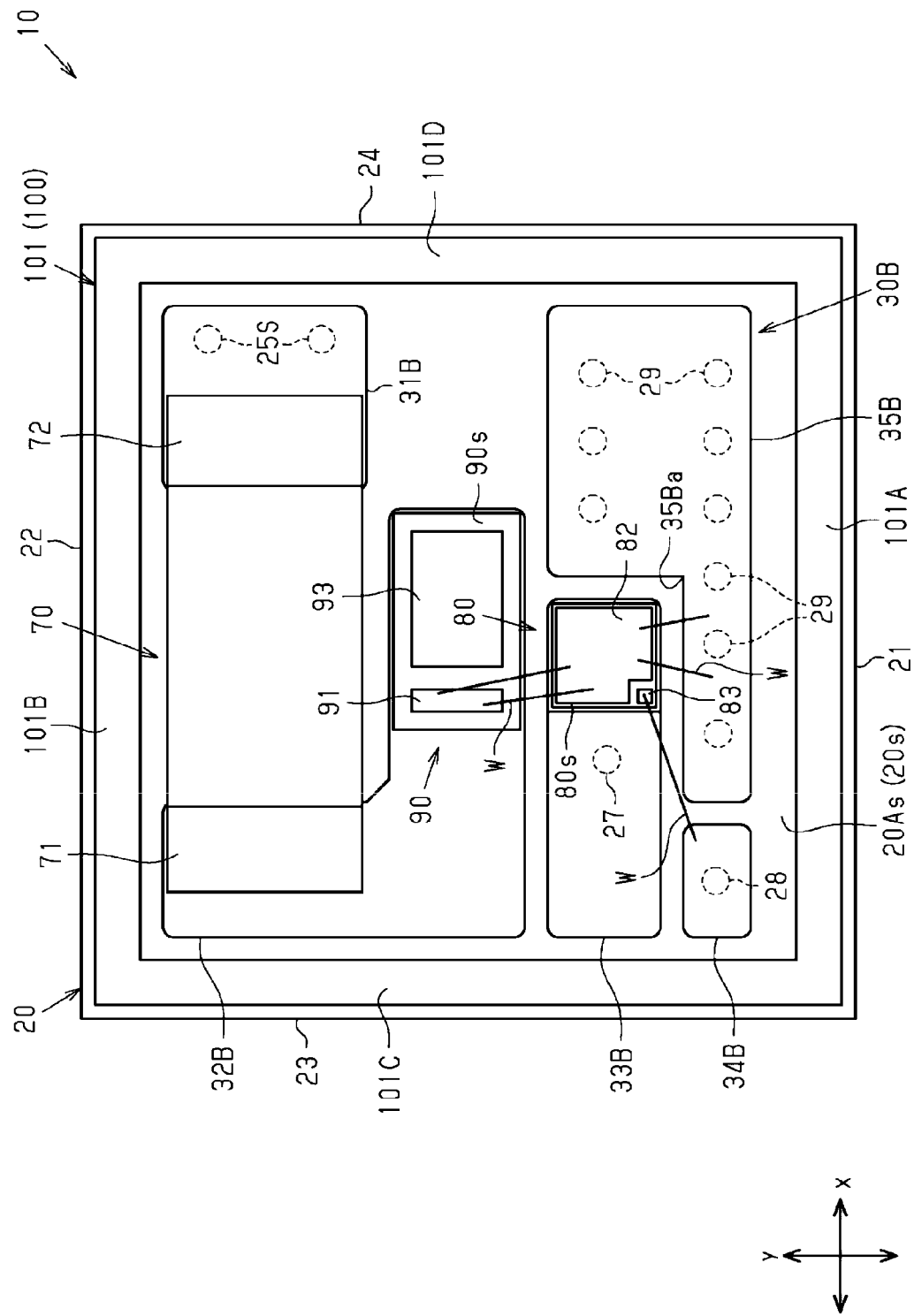
FIG. 15 is a plan view showing an internal structure of a semiconductor light-emitting device according to a fourth embodiment of the present disclosure.

As shown in FIG. 15, the switching element 80 and the light-emitting element 90 are arranged closer to the second electrode 72 than the first electrode 71 of the capacitor 70 in the x direction. In the present embodiment, both the switching element 80 and the light-emitting element 90 are interposed between the first electrode 71 and the second electrode 72 of the capacitor 70 in the x direction. In the present embodiment, when viewed in the y direction, the switching element 80 is arranged so that the entire switching element 80 overlaps the light-emitting element 90.

Similar to the second embodiment, the light-emitting element 90 is arranged closer to the capacitor 70 than the switching element 80 in the y direction. In other words, the light-emitting element 90 is interposed between the capacitor 70 and the switching element 80 in the y direction.

Figure 16:
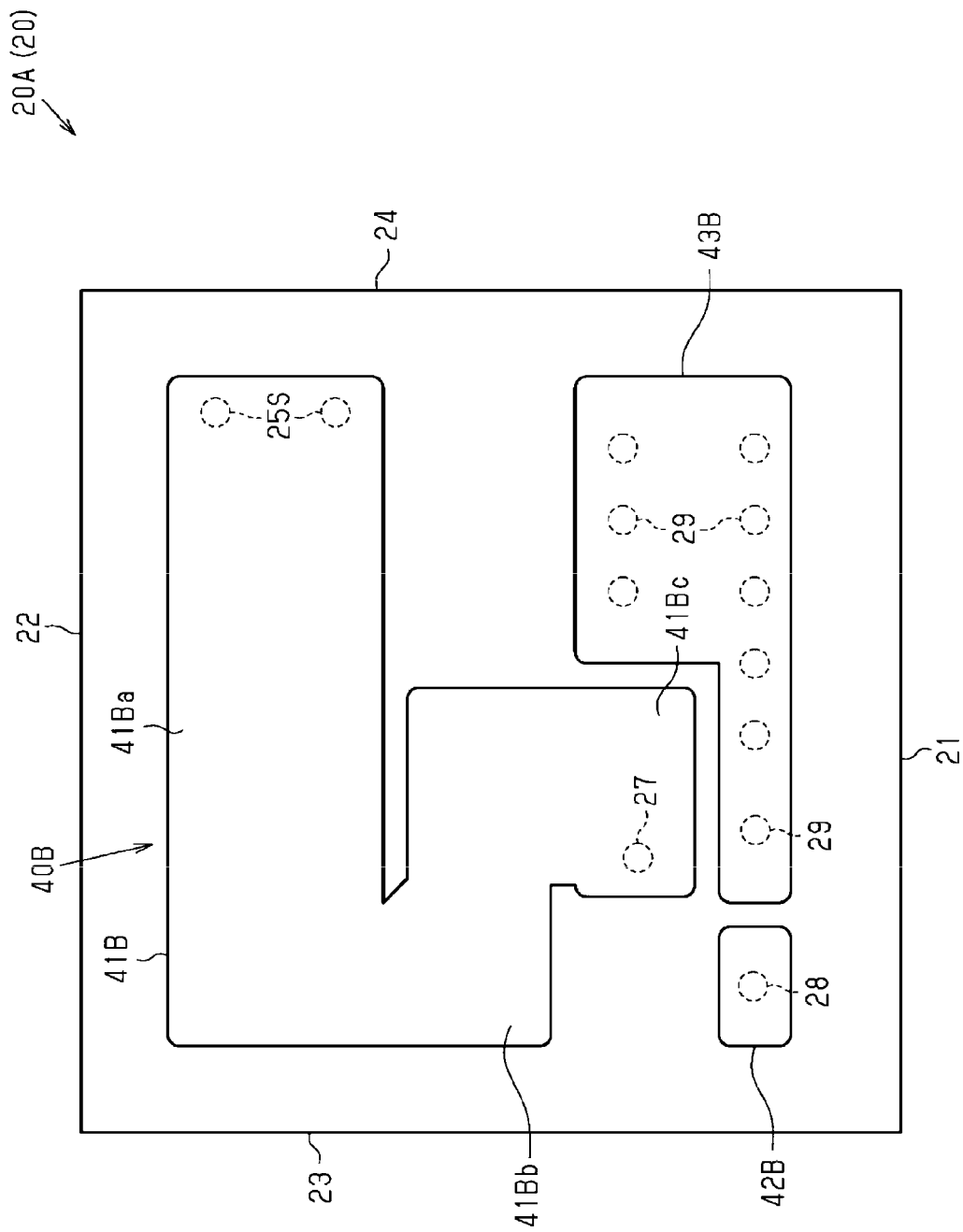
FIG. 16 is a perspective view showing a wiring pattern on a side of the substrate back surface of a first substrate constituting a board main surface of a multilayer board of the semiconductor light-emitting device of FIG. 15.

As shown in FIGS. 15 and 16, the multilayer board 20 is different from the multilayer board 20 of the first embodiment in the configurations of the first conductive layer and the second conductive layer. In the following description, the first conductive layer is referred to as a "first conductive layer 30B," and the second conductive layer is referred to as a "second conductive layer 40B." Since the third conductive layer 50 and the fourth conductive layer 60 are the same as those in the first embodiment, explanation thereof will be omitted.

As shown in FIG. 15, the first conductive layer 30B includes a first wiring 31B, a second wiring 32B, a third wiring 33B, a fourth wiring 34B, and a fifth wiring 35B. The first wiring 31B and the fourth wiring 34B are the same as the first wiring 31A and the fourth wiring 34A of the second embodiment. Here, in the present embodiment, the first conductive layer 30B corresponds to a "first wiring pattern." Further, the first wiring 31B corresponds to a "first front surface side wiring," the second wiring 32B corresponds to a "second front surface side wiring," and the third wiring 33B corresponds to a "third front surface side wiring."

In the present embodiment, as compared with the second embodiment, as both the switching element 80 and the light-emitting element 90 move toward the fourth side wall 101D in the x direction, shapes of the second wiring 32B and the fourth wiring 34B of the first conductive layer 30 differ from those of the second wiring 32A and the fourth wiring 34A of the second embodiment. Further, as the shape of the fourth wiring 34B is changed, a shape of the fifth wiring 35B is different from the shape of the fifth wiring 35A of the second embodiment.

More specifically, a dimension, in the x direction, of an end, between both ends of the second wiring 32B, which is closer to the third wiring 33B in the y direction is larger than a dimension, in the x direction, of an end, between both ends of the second wiring 32A, which is closer to the third wiring 33A in the second embodiment in the y direction.

The dimension of the third wiring 33B in the x direction is larger than the dimension of the third wiring 33A of the second embodiment in the x direction. The fifth wiring 35B has a recessed portion 35Ba. The dimension of the recessed portion 35Ba in the x direction is larger than the dimension of the recessed portion 35Aa of the fifth wiring 35A of the second embodiment in the x direction. Similar to the second embodiment, the third wiring 33B enters the recessed portion 35Ba. Further, when viewed in the z direction, the switching element 80 is arranged in the recessed portion 35Ba.

As shown in FIG. 16, the second conductive layer 40B includes a first wiring 41B, a second wiring 42B, and a third wiring 43B. The second wiring 42B is the same as the second wiring 42A of the second embodiment. Here, the second conductive layer 40B corresponds to a "second wiring pattern," and the first wiring 41B corresponds to a "back surface side wiring." That is, the light-emitting element 90, the switching element 80, and the capacitor 70 are electrically connected to one another by both the conductive layers 30B and 40B.

The first wiring 41B is formed to overlap the capacitor 70, the switching element 80, and the light-emitting element 90 when viewed in the z direction. That is, the first wiring 41B is provided at a position where it overlaps the first current path when viewed in the z direction.

The first wiring 41B includes a first wiring portion 41Ba, a second wiring portion 41Bb, and a third wiring portion 41Bc. As shown in FIGS. 15 and 16, the first wiring portion 41Ba is formed so as to overlap the first wiring 31B of the first conductive layer 30B, the capacitor 70, and a portion of the second wiring 32B on which the first electrode 71 of the capacitor 70 is mounted, when viewed in the z direction.

The first wiring portion 41Ba extends in the x direction. A width dimension of the first wiring portion 41Ba (a dimension of the first wiring portion 41Ba in the y direction) is equal to the width dimension of the first wiring 31B (the dimension of the first wiring 31B in the y direction) of the first conductive layer 30B. Further, the width dimension of the first wiring portion 41Ba is equal to the dimension of the capacitor 70 in the y direction. Similar to the first embodiment, in consideration of a deviation of a mounting position of the capacitor 70, even when the width dimension of the first wiring portion 41Ba is slightly larger than the dimension of the capacitor 70 in the y direction, it may be said that the width dimension of the first wiring portion 41Ba (the dimension of the first wiring portion 41Ba in they direction) is equal to the dimension of the capacitor 70 in the y direction.

When viewed in the z direction, both ends of the first wiring portion 41Ba in the x direction protrude from the capacitor 70. That is, the length of the first wiring portion 41Ba in the x direction is longer than the length of the capacitor 70 in the x direction. The first wiring portion 41Ba extends to a position where it overlaps the first wiring 31B when viewed in the z direction. A portion of the first wiring portion 41Ba that overlaps the first wiring 31B when viewed in the z direction is connected to the first wiring 31A via the first through-wiring 25S.

The second wiring portion 41Bb is formed so as to overlap the second wiring 32B of the first conductive layer 30B and the light-emitting element 90 when viewed in the z direction. When viewed in the z direction, the second wiring portion 41Bb is formed so as to overlap both the light-emitting element 90 and a portion of the second wiring 32B on which the light-emitting element 90 is mounted. In the present embodiment, a leading end of the second wiring portion 41Bb is located closer to the third side wall 101C than an end, between both ends of the light-emitting element 90, which is closer to the fourth side wall 101D in the x direction. That is, when viewed in the z direction, a portion of the light-emitting element 90 protrudes from the second wiring portion 41Bb in the x direction.

The third wiring portion 41Bc is formed so as to overlap the switching element 80 and a portion of the third wiring 33A on which the switching element 80 is mounted, when viewed in the z direction. When viewed in the z direction, the third wiring portion 41Bc is formed to overlap both the switching element 80 and the third wiring 33B. In the present embodiment, a portion of the third wiring 33B closer to the third side wall 101C than a portion where the third through-wiring 27 is formed protrudes from the third wiring portion 41Bc when viewed in the z direction.

As shown in FIGS. 15 and 16, the second wiring 42B is arranged at a position where it overlaps the fourth wiring 34B of the first conductive layer 30B. The shape of the second wiring 42B viewed from the z direction is the same as the shape of the fourth wiring 34B viewed from the z direction. The second wiring 42B is connected to the third wiring 43B by the fourth through-wiring 28.

The third wiring 43B is arranged at a position where it overlaps the fifth wiring 35B of the first conductive layer 30B in the z direction. The shape of the third wiring 43B viewed from the z direction is the same as the shape of the fifth wiring 35B viewed from the z direction. The third wiring 43B is connected to the fifth wiring 35B by the fifth through-wiring 29.

(Effects)

According to the semiconductor light-emitting device 10 according to the present embodiment, the following effects may be obtained in addition to the effects of the second embodiment.

(4-1) The light-emitting element 90 is arranged near the center of the multilayer board 20 in the x direction and the y direction. According to this configuration, as compared with a case where the light-emitting element 90 is arranged at a position adjacent to the side wall 101, light emitted from the light-emitting element 90 toward the light-transmitting plate 102 does not interfere with the side wall 101. Therefore, it is possible to suppress the light-emitting region of the light-emitting element 90 from narrowing when viewed in the z direction.

Fifth Embodiment

A semiconductor light-emitting device 10 according to a fifth embodiment will be described with reference to FIGS. 17 to 20. The semiconductor light-emitting device 10 according to the present embodiment is different from the semiconductor light-emitting device 10 of the fourth embodiment in the shapes of the plurality of conductive layers of the multilayer board 20. In the following description, the same constituent elements as those of the semiconductor light-emitting device 10 of the first embodiment are denoted by the same reference numerals, and explanation thereof may be omitted. Further, the plurality of conductive layers of the multilayer board 20 are referred to as a "first conductive layer 30C," a "second conductive layer 40C," a "third conductive layer 50C," and a "fourth conductive layer 60C."

Figure 17:
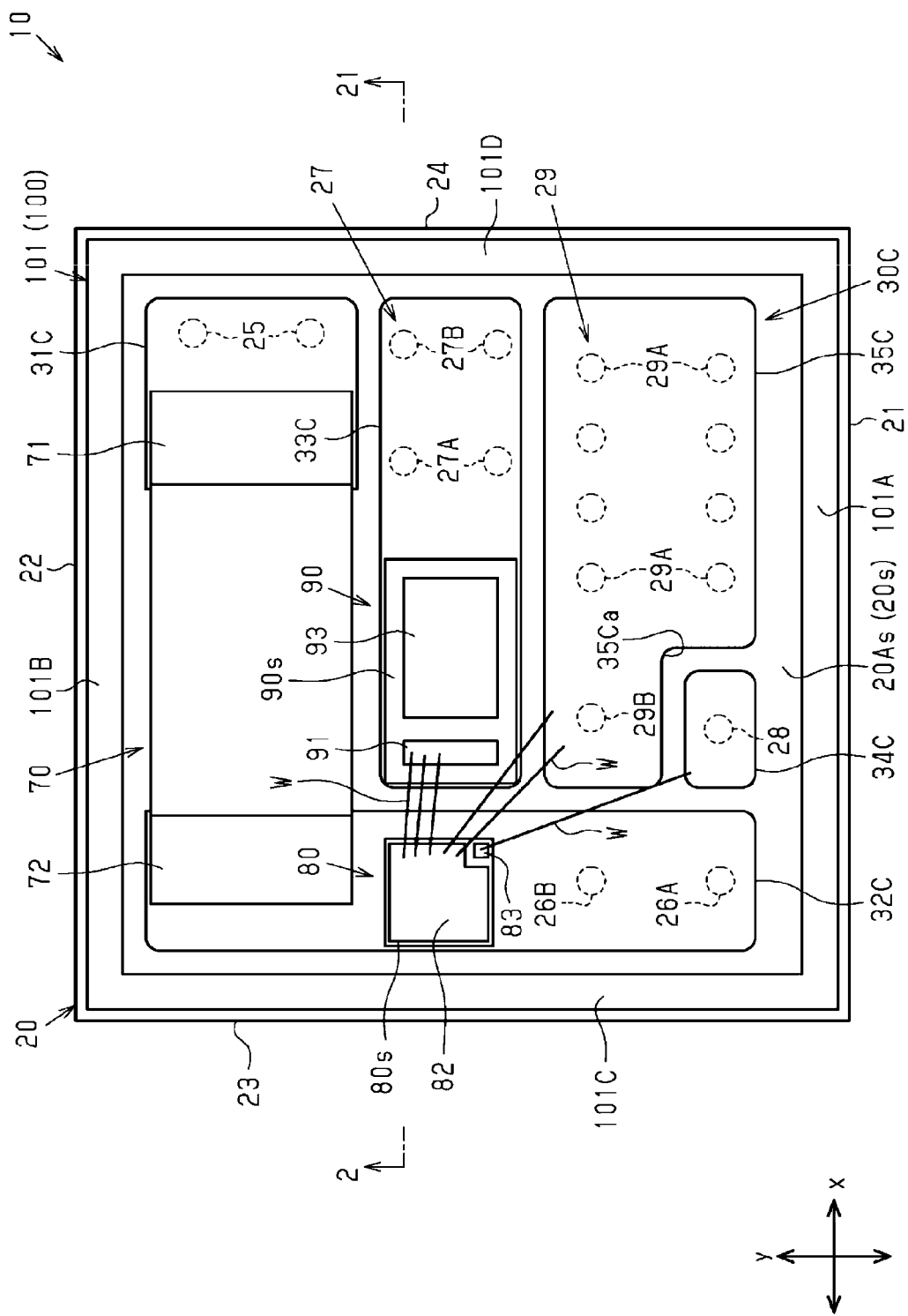
FIG. 17 is a plan view showing an internal structure of a semiconductor light-emitting device according to a fifth embodiment of the present disclosure.

As shown in FIG. 17, the first conductive layer 30C is a conductive layer corresponding to the first conductive layer 30 of the first embodiment and includes a first wiring 31C, a second wiring 32C, a third wiring 33C, a fourth wiring 34C, and a fifth wiring 35C. That is, in the present embodiment, the first conductive layer 30C corresponds to a "first wiring pattern." Further, the first wiring 31C corresponds to a "first front surface side wiring," the second wiring 32C corresponds to a "second front surface side wiring," and the third wiring 33C corresponds to a "third front surface side wiring."

An arrangement position and a shape of the first wiring 31C are the same as those of the first wiring 31 of the first conductive layer 30. An arrangement position and a shape of the third wiring 33C are the same as those of the third wiring 33 of the first conductive layer 30. Further, an arrangement form of the capacitor 70 with respect to the first wiring 31C and the second wiring 32C, an arrangement form of the switching element 80 with respect to the second wiring 32C, and an arrangement form of the light-emitting element 90 with respect to the third wiring 33C are similar to those in the first embodiment respectively.

An arrangement position of the second wiring 32C is the same as the arrangement position of the second wiring 32 of the first conductive layer 30. A dimension of the second wiring 32C in the y direction is larger than the dimension of the second wiring 32 of the first conductive layer 30 in the y direction. The second wiring 32C is formed such that both ends thereof in the y direction are adjacent to the first side wall 101A and the second side wall 101B.

The fourth wiring 34C is arranged apart from the third side wall 101C in the x direction. The fourth wiring 34C is interposed between the second wiring 32C and the fifth wiring 35C in the x direction. The fourth wiring 34C is arranged at a position adjacent to the first side wall 101A in the y direction. When viewed in the y direction, the fourth wiring 34C is arranged at a position where it overlaps the third wiring 33C.

Similar to the first embodiment, the fourth wiring 34C is connected to the gate electrode 83 of the switching element 80 via a wire W. That is, the fourth wiring 34C is electrically connected to the gate electrode 83 of the switching element 80.

An arrangement position of the fifth wiring 35C is the same as the arrangement position of the fifth wiring 35 of the first conductive layer 30. On the other hand, the fifth wiring 35C has a recessed portion 35Ca. The recessed portion 35Ca is formed at an end, between both ends of the fifth wiring 35C, which is closer to the second wiring 32C in the x direction. The fourth wiring 34C is arranged in the recessed portion 35Ca. The end, between both ends of the fifth wiring 35C, which is closer to the second wiring 32C in the x direction is located between the third wiring 33C and the fourth wiring 34C.

Similar to the first embodiment, the fifth wiring 35C is connected to the source electrode 82 of the switching element 80 via a wire W. The wire W connected to the source electrode 82 is connected to the end, between both ends of the fifth wiring 35C, which is closer to the second wiring 32C in the x direction. That is, the fifth wiring 35C is electrically connected to the source electrode 82 of the switching element 80.

As shown in FIG. 18, the second conductive layer 40C is a conductive layer corresponding to the second conductive layer 40 of the first embodiment and includes a first wiring 41C, a second wiring 42C, a third wiring 43C, and a fourth wiring 44C. That is, the second conductive layer 40C corresponds to a "second wiring pattern," and the first wiring 41C corresponds to a "back surface side wiring." That is, the light-emitting element 90, the switching element 80, and the capacitor 70 are electrically connected to one another by both the conductive layers 30C and 40C.

Similar to the first wiring 41 of the second conductive layer 40 of the first embodiment, the first wiring 41C includes a first wiring portion 41Ca, a second wiring portion 41Cb, and a third wiring portion 41Cc. Arrangement positions and shapes of the first wiring portion 41Ca and the third wiring portion 41Cc are the same as those of the first wiring portion 41a and the third wiring portion 41c of the first wiring 41 of the first embodiment. The arrangement position of the second wiring portion 41Cb is the same as the arrangement position of the second wiring portion 41b of the first wiring 41 of the first embodiment, whereas a shape of the second wiring portion 41Cb is different from the shape of the second wiring portion 41b of the first embodiment. Specifically, a dimension of the second wiring portion 41Cb in the x direction is smaller than the dimension of the second wiring portion 41b of the first embodiment in the x direction. That is, a leading end of the second wiring portion 41Cb is formed at a position apart from the fourth side wall 101D.

The second wiring 42C is arranged near the board side surface 21 and the board side surface 23 of the substrate back surface 20Ar of the first substrate 20A. The second wiring 42C is arranged apart from the second wiring portion 41Cb of the first wiring 41C in the y direction. As shown in FIGS. 17 and 18, the second wiring 42C is arranged at a position where it overlaps an end, between both ends of the second wiring 32C of the first conductive layer 30C, which is closer to the first side wall 101A in the y direction when viewed in the z direction.

The third wiring 43C is interposed between the second wiring 42C and the fourth wiring 44C in the x direction. The third wiring 43C and the second wiring 42C are arranged apart from each other in the x direction to be aligned with each other in the y direction. As shown in FIGS. 17 and 18, the third wiring 43C is arranged at a position where it overlaps the fourth wiring 34C of the first conductive layer 30C when viewed in the z direction.

The fourth wiring 44C is arranged near the board side surface 21 and the board side surface 24 of the substrate back surface 20Ar of the first substrate 20A. The fourth wiring 44C is interposed between the third wiring 43C and the board side surface 24 in the x direction. That is, the fourth wiring 44C does not have a portion that overlaps the third wiring 43C when viewed in they direction. As shown in FIGS. 17 and 18, the fourth wiring 44C is arranged at a position where it overlaps the fifth wiring 35C of the first conductive layer 30C when viewed in the z direction.

Figure 19:
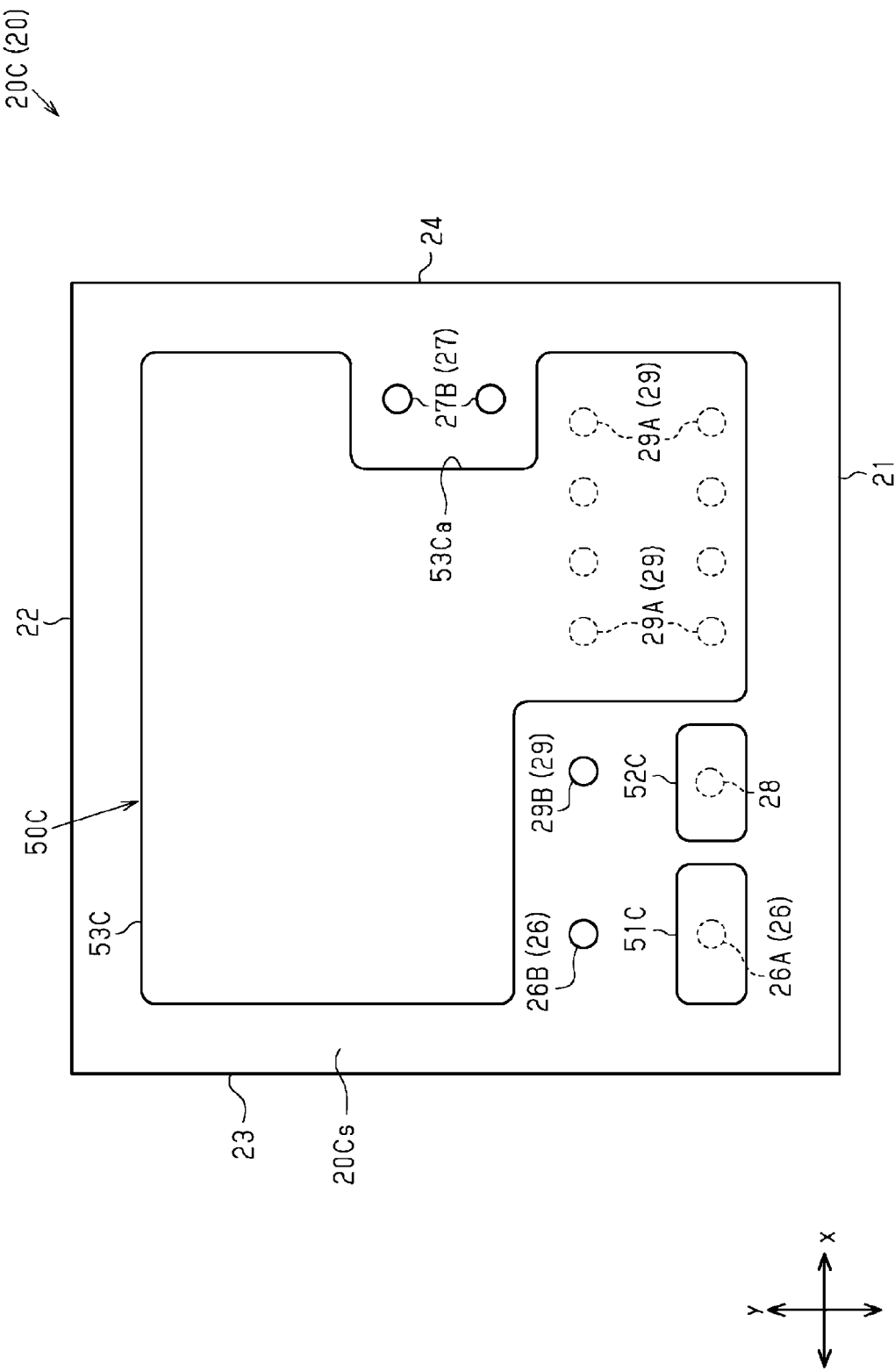
FIG. 19 is a plan view of a third substrate constituting a board back surface of the multilayer board.

As shown in FIG. 19, the third conductive layer 50C is a conductive layer corresponding to the third conductive layer 50 of the first embodiment and includes a first wiring 51C, a second wiring 52C, and a third wiring 53C. The first wiring 51C is arranged near the board side surface 21 and the board side surface 23 of the substrate main surface 20Cs of the third substrate 20C. As shown in FIGS. 18 and 19, the first wiring MC is arranged at a position where it overlaps the second wiring 42C of the second conductive layer 40C when viewed in the z direction.

The second wiring 52C is interposed between the first wiring MC and the third wiring 53C in the x direction. The second wiring 52C and the first wiring MC are arranged apart from each other in the x direction to be aligned with each other in the y direction. As shown in FIGS. 18 and 19, the second wiring 52C is arranged at a position where it overlaps the third wiring 43C of the second conductive layer 40C when viewed in the z direction.

The third wiring 53C is formed over most of the substrate main surface 20Cs of the third substrate 20C. As shown in FIGS. 17 and 19, the third wiring 53C is formed to cover the capacitor 70, the switching element 80, and the light-emitting element 90 when viewed in the z direction. That is, the third wiring 53C is formed to cover the first current path when viewed in the z direction. Further, as shown in FIGS. 18 and 19, the third wiring 53C is formed to cover the first wiring 41C of the second conductive layer 40C when viewed in the z direction. That is, the third wiring 53C is formed to overlap the first current path when viewed in the z direction and to cover the second current path of the current flowing in the direction opposite to the direction in which the current flows through the first current path. As shown in FIGS. 18 and 19, when viewed in the z direction, the third wiring 53C is arranged at a position where it overlaps the fourth wiring 44C of the second conductive layer 40C when viewed in the z direction.

As shown in FIG. 19, a recessed portion 53Ca is formed in the third wiring 53C. The recessed portion 53Ca is formed at an end, between both ends of the third wiring 53C, which is closer to the board side surface 24 in the x direction, and at the center of the end in the y direction.

Figure 20:
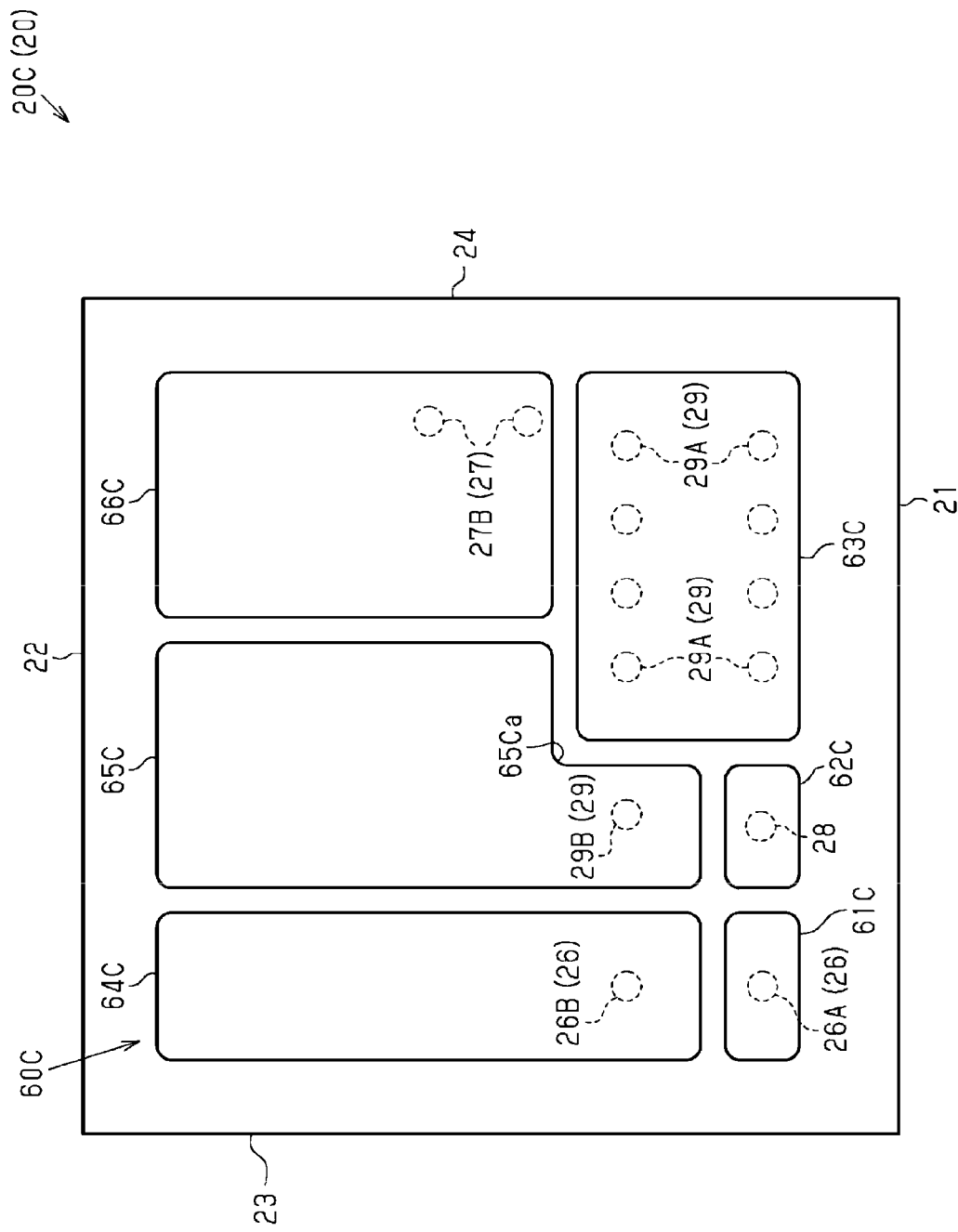
FIG. 20 is a perspective view showing a wiring pattern of the third substrate on a side of the substrate back surface of the third substrate.

As shown in FIG. 20, the fourth conductive layer 60C is a conductive layer corresponding to the fourth conductive layer 60 of the first embodiment and includes a first wiring 61C, a second wiring 62C, a third wiring 63C, a fourth wiring 64C, a fifth wiring 65C, and a sixth wiring 66C.

The first wiring 61C is arranged near the board side surface 21 and the board side surface 23 of the substrate back surface 20Cr of the third substrate 20C. As shown in FIGS. 19 and 20, the first wiring 61C is arranged at a position where it overlaps the first wiring 51C of the third conductive layer 50C when viewed in the z direction.

The second wiring 62C is interposed between the first wiring 61C and the third wiring 63C in the x direction. The second wiring 62C and the first wiring 61C are arranged apart from each other in the x direction to be aligned with each other in the y direction. As shown in FIGS. 19 and 20, the second wiring 62C is arranged at a position where it overlaps the second wiring 52C of the third conductive layer 50C when viewed in the z direction.

The third wiring 63C is arranged near the board side surface 21 and the board side surface 24 of the substrate back surface 20Cr of the third substrate 20C. The shape of the third wiring 63C viewed from the z direction is the same as the shape of the fourth wiring 64C (see FIG. 18) of the second conductive layer 40C viewed from the z direction. As shown in FIGS. 19 and 20, the third wiring 63C is arranged at a position where it overlaps the third wiring 53C of the third conductive layer 50C when viewed in the z direction.

As shown in FIG. 19, the fourth wiring 64C, the fifth wiring 65C, and the sixth wiring 66C are arranged closer to the board side surface 22 than the first wiring 61C, the second wiring 62C, and the third wiring 63C in the y direction, respectively. The fourth wiring 64C, the fifth wiring 65C, and the sixth wiring 66C are arranged apart from each other in the x direction to be aligned with one another in the y direction. The fifth wiring 65C is interposed between the fourth wiring 64C and the sixth wiring 66C in the x direction. The fourth wiring 64C is arranged closer to the board side surface 23 than the fifth wiring 65C. The sixth wiring 66C is arranged closer to the board side surface 24 than the fifth wiring 65C.

The fourth wiring 64C is arranged apart from the first wiring 61C in they direction so as to be aligned with the first wiring 61C in the x direction. The shape of the fourth wiring 64C viewed from the z direction is substantially a rectangular shape in which the y direction is a long side direction and the x direction is a short side direction. It may be said that the fourth wiring 64C extends in the y direction. In the present embodiment, the width dimension of the fourth wiring 64C (the dimension of the fourth wiring 64C in the x direction) is equal to the dimension of the first wiring 61C in the x direction.

The fifth wiring 65C is arranged at a position where it overlaps the second wiring 62C when viewed in the y direction. When viewed in the y direction, the fifth wiring 65C is arranged at a position where it overlaps an end, between both ends of the third wiring 63C, which is closer to the second wiring 62C in the x direction.

The fifth wiring 65C extends in the y direction. A recessed portion 65Ca is formed in the fifth wiring 65C. The recessed portion 65Ca is formed at an end, between both ends of the fifth wiring 65C, which is closer to the second wiring 62C in the y direction. The end, between both ends of the third wiring 63C, which is closer to the second wiring 62C in the x direction enters the recessed portion 65Ca.

The sixth wiring 66C is arranged at a position where it overlaps the third wiring 63C when viewed in the y direction. The shape of the sixth wiring 66C viewed from the z direction is a rectangular shape in which the y direction is a long side direction and the x direction is a short side direction. It may be said that the sixth wiring 66C extends in the y direction.

As shown in FIGS. 17 to 20, the multilayer board 20 includes a plurality of through-wirings, similar to the first embodiment. In the present embodiment, the multilayer board 20 includes a first through-wiring 25, a second through-wiring 26, a third through-wiring 27, a fourth through-wiring 28, and a fifth through-wiring 29.

The first through-wiring 25 is a wiring that connects the first wiring 31C of the first conductive layer 30C and the first wiring 41C of the second conductive layer 40C, similarly to the first through-wiring 25S of the first embodiment. The first through-wiring 25 is connected to an end, between both ends of the first wiring portion 41Ca of the first wiring 41C, which is closer to the fourth side wall 101D in the x direction.

In the present embodiment, the second through-wiring 26 is a wiring provided at a position where it overlaps the second wiring 32C of the first conductive layer 30C when viewed in the z direction. As shown in FIG. 17, a plurality of second through-wirings 26 (two second through-wirings 26 in the present embodiment) are provided. These second through-wirings 26 are arranged apart from each other in the y direction to be aligned with each other in the x direction. For the sake of convenience, of the two second through-wirings 26, the second through-wiring 26 closer to the first side wall 101A is referred to as a "second through-wiring 26A," and the second through-wiring 26 closer to the second side wall 101B is referred to as a "second through-wiring 26B."

Similar to the second through-wiring 26 of the first embodiment, the second through-wiring 26A is a wiring that connects the second wiring 32C of the first conductive layer 30C, the second wiring 42C of the second conductive layer 40C, the first wiring 51C of the third conductive layer 50C, and the first wiring 61C of the fourth conductive layer 60C. In this case, the first wiring 61C of the fourth conductive layer 60C constitutes a terminal (drain terminal) to which the drain electrode 81 of the switching element 80 is electrically connected.

The second through-wiring 26B is a wiring that connects the second wiring 32C of the first conductive layer 30C and the fourth wiring 64C of the fourth conductive layer 60C. That is, the second through-wiring 26B is not connected to the second conductive layer 40C and the third conductive layer 50C. In this way, the fourth wiring 64C of the fourth conductive layer 60C serves as a heat-radiating wiring configured to radiate heat from the second wiring 32C of the first conductive layer 30C.

In the present embodiment, the third through-wiring 27 is a wiring provided at a position where it overlaps the third wiring 33C of the first conductive layer 30C when viewed in the z direction. As shown in FIG. 17, a plurality of third through-wirings 27 (two third through-wirings 27 in the present embodiment) are provided. In the arrangement form of these third through-wirings 27, a pair of third through-wirings 27, which are apart from each other in the y direction to be aligned with each other in the x direction, is arranged in two rows apart from each other in the x direction. For the sake of convenience, of these pairs of third through-wirings 27, the pair of third through-wirings 27 that are closer to the third side wall 101C is referred to as a "pair of through-wirings 27A," and the pair of third through-wirings 27 that are closer to the fourth side wall 101D is referred to as a "pair of through-wirings 27B."

Figure 21:
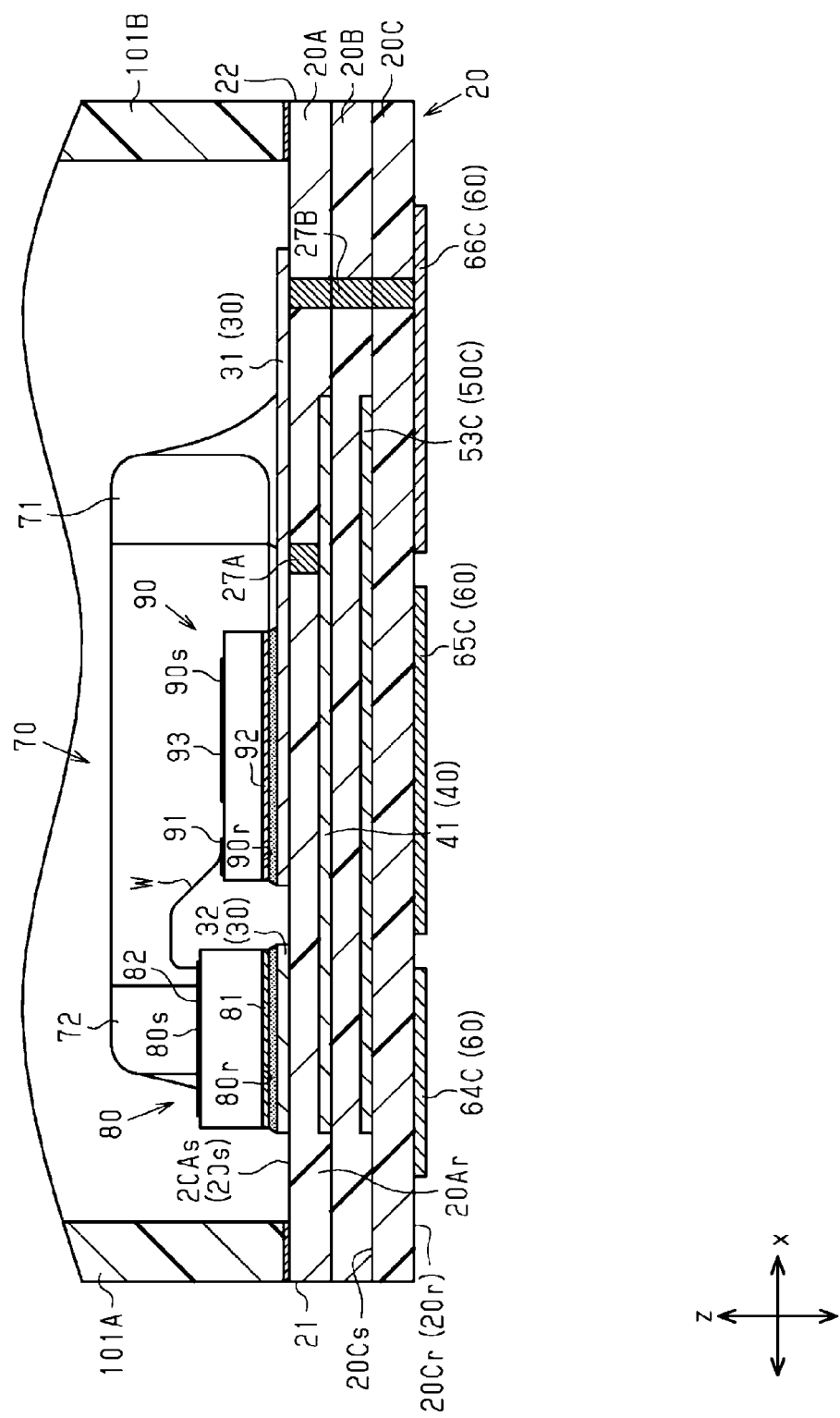
FIG. 21 shows a cross-sectional view showing a portion of a cross-sectional structure of the semiconductor light-emitting device taken along line 21-21 in FIG. 17.

As shown in FIG. 21, the pair of third through-wirings 27A connects the third wiring 33C of the first conductive layer 30C and the first wiring 41C of the second conductive layer 40C, similar to the third through-wirings 27S of the first embodiment. The pair of third through-wirings 27A are connected to an end, between both ends of the second wiring portion 41Cb of the first wiring 41C, which is closer to the fourth side wall 101D in the x direction, that is, a leading end of the second wiring portion 41Cb.

As shown in FIG. 21, the pair of third through-wirings 27B is a wiring that connects the third wiring 33C of the first conductive layer 30C and the sixth wiring 66C of the fourth conductive layer 60C. That is, the pair of third through-wirings 27B is not connected to the second conductive layer 40C and the third conductive layer 50C. As shown in FIG. 19, the recessed portion 53Ca of the third wiring 53C of the third conductive layer 50C is formed to avoid the pair of third through-wirings 27B. In this way, the sixth wiring 66C of the fourth conductive layer 60C serves as a heat-radiating wiring configured to radiate heat from the third wiring 33C of the first conductive layer 30C.

As shown in FIGS. 17 to 20, the fourth through-wiring 28 is a wiring that connects the fourth wiring 34C of the first conductive layer 30C, the third wiring 43C of the second conductive layer 40C, the second wiring 52C of the third conductive layer 50C, and the second wiring 62C of the fourth conductive layer 60C, similar to the fourth through-wiring 28 of the first embodiment. In this case, the second wiring 62C of the fourth conductive layer 60C constitutes a terminal (gate terminal) to which the gate electrode 83 of the switching element 80 is electrically connected.

In the present embodiment, the fifth through-wiring 29 is a wiring provided at a position where it overlaps the fifth wiring 35C of the first conductive layer 30C when viewed in the z direction. As shown in FIG. 17, a plurality of fifth through-wirings 29 (seven fifth through-wirings 29 in the present embodiment) are provided. In the arrangement form of these fifth through-wirings 29, two rows of fifth through-wirings 29, which are apart from each other in the x direction to be aligned with each other in the y direction, are arranged apart from each other in the y direction. For the sake of convenience, among the plurality of fifth through-wirings 29, the fifth through-wiring 29 provided at one end, between both ends of the fifth wiring 35C, which is closer to the second wiring 32C in the x direction is referred to as a "fifth through-wiring 29B," and each of the remaining fifth through-wirings 29 is referred to as a "fifth through-wiring 29A."

The fifth through-wiring 29B is a wiring that connects the fifth wiring 35C of the first conductive layer 30C and the fifth wiring 65C of the fourth conductive layer 60C. That is, the fifth through-wiring 29B is not connected to the second conductive layer 40C and the third conductive layer 50C. In this way, the fifth wiring 65C of the fourth conductive layer 60C serves as a heat-radiating wiring configured to radiate heat of the fifth wiring 35C of the first conductive layer 30C.

Similar to the fifth through-wiring 29 of the first embodiment, each of the fifth through-wirings 29A is a wiring that connects the fifth wiring 35C of the first conductive layer 30C, the fourth wiring 44C of the second conductive layer 40C, the third wiring 53C of the third conductive layer 50C, and the third wiring 63C of the fourth conductive layer 60C. In this case, the third wiring 63C of the fourth conductive layer 60C constitutes a ground terminal.

Even with such a semiconductor light-emitting device 10, a relationship between the current flowing in the first current path and the current flowing in the second current path of the current flowing in the direction opposite to the direction in which the current flows through the first current path is the same as that in the first embodiment. Further, a portion of the current flowing through the third wiring 63C flows to the sixth wiring 66C via the third through-wiring 27.

(Effects)

According to the semiconductor light-emitting device 10 according to the present embodiment, the following effects may be obtained in addition to the effects of the first embodiment.

(5-1) The second through-wiring 26B is connected to the fourth wiring 64C of the fourth conductive layer 60C while avoiding the second conductive layer 40C and the third conductive layer 50C. According to this configuration, when the semiconductor light-emitting device 10 is driven with the semiconductor light-emitting device 10 mounted on a drive substrate (not shown), the heat of the switching element 80 moves from the second wiring 32C of the first conductive layer 30C to the fourth wiring 64C via the second through-wiring 26B. That is, since the heat of the switching element 80 is more easily transferred to the fourth wiring 64C of the fourth conductive layer 60C than the second conductive layer 40C and the third conductive layer 50C, the heat of the switching element 80 moves more easily to the drive substrate. As a result, it is possible to improve the heat radiation performance of the semiconductor light-emitting device 10.

(5-2) The third through-wiring 27B is connected to the sixth wiring 66C of the fourth conductive layer 60C while avoiding the second conductive layer 40C and the third conductive layer 50C. According to this configuration, when the semiconductor light-emitting device 10 is driven with the semiconductor light-emitting device 10 mounted on a drive substrate (not shown), the heat of the light-emitting element 90 moves from the third wiring 33C of the first conductive layer 30C to the sixth wiring 66C via the third through-wiring 27B. That is, the heat of the light-emitting element 90 is more easily transferred to the sixth wiring 66C of the fourth conductive layer 60C than the second conductive layer 40C and the third conductive layer 50C, so that the heat of the light-emitting element 90 moves more easily to the drive substrate. As a result, it is possible to improve the heat radiation performance of the semiconductor light-emitting device 10.

(5-3) The third wiring 53C, which is the ground potential, covers both the first current path and the second current path. According to this configuration, it is possible to prevent noise caused by the current flowing through the first current path and the current flowing through the second current path from leaking to the outside of the multilayer board 20.

[Modifications]

Each of the aforementioned embodiments is an example of a form that the semiconductor light-emitting device according to the present disclosure may take, and is not intended to limit the form. The semiconductor light-emitting device according to the present disclosure may take a form different from the form exemplified in each of the aforementioned embodiments. One example thereof is a form in which each of the aforementioned embodiments is partially replaced, changed, or omitted, or a form in which a new configuration is added to each of the aforementioned embodiments. The following modifications may be combined with each other unless technically contradictory. In each of the following modifications, the same parts as each of the aforementioned embodiments are denoted by the same reference numerals as each of the aforementioned embodiments, and explanation thereof will be omitted.

In the first embodiment, the arrangement form of the capacitor 70 may be arbitrarily changed. For example, the capacitor 70 may be arranged apart from each other in the y direction such that the first electrode 71 and the second electrode 72 are aligned with each other in the x direction. In this case, for example, the light-emitting element 90 may be arranged at a position where it does not overlap the capacitor 70 when viewed in the y direction. Further, for example, the light-emitting element 90 may be arranged at a position where it partially overlaps the capacitor 70 when viewed in the y direction.

In the second embodiment, both the switching element 80 and the light-emitting element 90 are arranged at positions where they overlap the first electrode 71 of the capacitor 70 when viewed in the y direction, but the present disclosure is not limited thereto. For example, when viewed in the y direction, both the switching element 80 and the light-emitting element 90 may be arranged at positions where they overlap the second electrode 72 of the capacitor 70. In this case, for example, the fourth wiring 34 of the first conductive layer 30 may be arranged at a position where it is aligned with the second electrode 72 of the capacitor 70 in the x direction.

In the first and fourth embodiments, the positional relationship between the first wirings 41 and 41C of the second conductive layers 40 and 40C and the capacitor 70, the switching element 80, and the light-emitting element 90 when viewed in the z direction may be arbitrarily changed. For example, when viewed in the z direction, the capacitor 70 may be arranged to partially protrude from the first wiring portions 41a and 41Ca of the first wirings 41 and 41C. When viewed in the z direction, the switching element 80 may be arranged to partially protrude from the second wiring portions 41b and 41Cb of the first wirings 41 and 41C. When viewed in the z direction, the light-emitting element 90 may be arranged to partially protrude from the second wiring portions 41b and 41Cb of the first wirings 41 and 41C. In short, when viewed in the z direction, the capacitor 70 may be arranged to at least partially overlap the first wiring portions 41a and 41Ca of the first wirings 41 and 41C. The switching element 80 may be arranged to at least partially overlap the second wiring portions 41b and 41Cb of the first wirings 41 and 41C. The light-emitting element 90 may be arranged to at least partially overlap the second wiring portions 41b and 41Cb of the first wirings 41 and 41C.

In the first and fourth embodiments, the positional relationship among the first wirings 41 and 41C of the second conductive layers 40 and 40C and the first wiring 31, the second wiring 32, and the third wiring 33 of the first conductive layer 30 may be arbitrarily changed. For example, when viewed in the z direction, the first wiring portions 41a and 41Ca of the first wirings 41 and 41C may be partially deviated from the first wiring 31 in the y direction. When viewed in the z direction, the second wiring portions 41b and 41Cb of the first wirings 41 and 41C may be partially deviated from the third wiring 33 in they direction.

In the second and fourth embodiments, the positional relationship between the first wirings 41A and 41B of the second conductive layers 40A and 40B, the capacitor 70, the switching element 80, and the light-emitting element 90 when viewed in the z direction may be arbitrarily changed. For example, when viewed in the z direction, the capacitor 70 may be arranged to partially protrude from the first wiring portions 41Aa and 41Ba of the first wirings 41A and 41B. When viewed in the z direction, the switching element 80 may be arranged to partially protrude from the second wiring portions 41Ab and 41Bb of the first wirings 41A and 41B. When viewed in the z direction, the light-emitting element 90 may be arranged to partially protrude from the second wiring portions 41Ab and 41Bb of the first wirings 41A and 41B. In short, when viewed in the z direction, the capacitor 70 may be arranged to at least partially overlap the first wiring portions 41Aa and 41Ba of the first wirings 41A and 41B. The switching element 80 may be arranged to at least partially overlap the second wiring portions 41Ab and 41Bb of the first wirings 41A and 41B. The light-emitting element 90 may be arranged to at least partially overlap the second wiring portions 41Ab and 41Bb of the first wirings 41A and 41B.

In each of the embodiments, the size of the capacitor 70 is larger than the sizes of the switching element 80 and the light-emitting element 90, but the size relationship among the capacitor 70, the switching element 80, and the light-emitting element 90 is not limited thereto. For example, the size of the light-emitting element 90 may be larger than the size of the capacitor 70. Further, for example, the size of the switching element 80 may be larger than the size of the capacitor 70. In this case, the light-emitting element 90 corresponds to the "first predetermined element," and the capacitor 70 corresponds to the "second predetermined element" or the "third predetermined element."

In each of the aforementioned embodiments, the electrode configuration of the switching element 80 may be arbitrarily changed. For example, the switching element 80 may have a configuration in which the drain electrode 81, the source electrode 82, and the gate electrode 83 are formed on the switching element main surface 80s of the switching element 80.

In each of the embodiments, the light-emitting direction of the light-emitting element 90 is not limited to the z direction, but may be arbitrarily changed. For example, the light-emitting direction of the light-emitting element 90 may be a direction orthogonal to the z direction. In this case, an opening is formed in a portion of the side wall 101 of the case 100 through which the light of the light-emitting element 90 passes. A light-transmitting plate may be installed at this opening. Further, a top wall, instead of the light-transmitting plate 102, may be installed on the side wall 101. That is, the shape of the case 100 may be a box shape that opens toward the multilayer board 20.

In each of the embodiments, the electrode configuration of the light-emitting element 90 may be arbitrarily changed. For example, the light-emitting element 90 may have a configuration in which both the anode electrode 91 and the cathode electrode 92 are formed on one of the light-emitting element main surface 90s and the light-emitting element back surface 90r.

In each of the embodiments, the light-transmitting plate 102 may be omitted from the case 100.

In each of the embodiments, the case 100 may be omitted from the semiconductor light-emitting device 10.

In each of the embodiments, the semiconductor light-emitting device 10 may include a translucent resin instead of the case 100. The translucent resin is made of a material that transmits light and has an electrical insulation characteristic, and covers the capacitor 70, the switching element 80, and the light-emitting element 90. The translucent resin may have a rectangular parallelepiped shape that covers the entire board main surface 20s of the multilayer board 20.

In each of the embodiments, the configuration of the multilayer board 20 may be arbitrarily changed. For example, the second substrate 20B and the third conductive layer 50 may be omitted from the multilayer board 20.

In each of the embodiments, the semiconductor light-emitting device 10 may include a single-layer board instead of the multilayer board 20. An example of this will be described with the semiconductor light-emitting device 10 of the first embodiment. The first conductive layer 30 is formed on the board front surface, and the second conductive layer 40, which is a wiring pattern, and external terminals, are formed on the board back surface. Examples of the external terminals may include a power supply terminal configured to supply electric power to the semiconductor light-emitting device 10, a ground terminal connected to the ground, and a control terminal electrically connected to the gate electrode 83 of the switching element 80. These external terminals are formed by, for example, a wiring pattern. In this case, both the third conductive layer 50 and the fourth conductive layer 60 are omitted. The semiconductor light-emitting device 10 includes a through-wiring that penetrates the board in its thickness direction and connects the first conductive layer 30 and the fourth conductive layer 60. The through-wiring includes a first through-wiring 25S that connects the first wiring 31 and the first wiring 41, a second through-wiring 26 that connects the second wiring 32 and the second wiring 62, a third through-wiring 27S that connects the third wiring 33 and the first wiring 41, a fourth through-wiring 28 that connects the fourth wiring 34 and the third wiring 63, and a fifth through-wiring 29 that connects the fifth wiring 35 and the fourth wiring 64.

In the present disclosure, the semiconductor light-emitting device 10 including the capacitor 70, the switching element 80, and the light-emitting element 90 is used, but the present disclosure is not limited thereto, and electronic components including a first element, a second element, and a third element electrically connected to one another may be used.

The term "on" as used in the present disclosure includes the meanings of "on" and "above" unless clearly stated otherwise in the context. Therefore, the expression "A is formed on B" is intended to mean that A may be arranged directly on B while being in contact with B in the present embodiment, but as a modification, A may be arranged above B while not being in contact with B. That is, the term "on" does not exclude a structure in which other members are formed between A and B.

The z direction used in the present disclosure may not be the vertical direction, and may not be exactly the same as the vertical direction. Therefore, various structures according to the present disclosure are not limited to "upper" and "lower" in the z direction described herein as being "upper" and "lower" in the vertical direction. For example, the x direction may be the vertical direction, or the y direction may be the vertical direction.

(Supplementary Notes)

The technical ideas that may be understood from each of the aforementioned embodiments and each of the aforementioned modifications are described below. In addition, reference numerals of the constituent elements of the embodiments corresponding to the constituent elements described in the respective supplementary notes are shown in parentheses. The reference numerals are shown as examples to assist in understanding, and the constituent elements described in the respective supplementary notes should not be limited to the constituent elements denoted by the reference numerals.

(Supplementary Note A1)

A semiconductor light-emitting device (10) including:
- a board including a front surface (20s), a back surface (20r) facing an opposite side of the front surface, a first wiring pattern (30/30C) formed on the front surface (20s), and a second wiring pattern (40/40C) formed on the side of the back surface (20r) with respect to the first wiring pattern (30/30C); and
- a light-emitting element (90), a switching element (80), and a capacitor (70), which are electrically connected to one another by both the first wiring pattern and the second wring patterns (30/30C and 40/40C),
- wherein, a first predetermined element (70) and a second predetermined element (80) among the light-emitting element (90), the switching element (80), and the capacitor (70) are arranged in a first direction (y direction) when viewed in a thickness direction (z direction) of the board,
- wherein the second predetermined element (80) and a third predetermined element (90) among the light-emitting element (90), the switching element (80), and the capacitor (70), are arranged in a second direction (x direction) intersecting the first direction (y direction) when viewed in the thickness direction (z direction) of the board, and
- wherein with respect to a first current path of a first current flowing through the light-emitting element (90), the switching element (80), and the capacitor (70) on the front surface (20s), the second wiring pattern (40/40C) is configured to form a second current path through which a second current flows in an opposite direction to a direction in which the first current flows through the first current path, the second current path overlapping the first current path when viewed in the thickness direction (z direction) of the board.

(Supplementary Note A2)

The semiconductor light-emitting device (10) of Supplementary Note A1, wherein the first predetermined element (70) and the second predetermined element (80)) are arranged at positions where the first predetermined element (70) and the second predetermined element (80) at least partially overlap each other when viewed in the first direction (y direction).

(Supplementary Note A3)

The semiconductor light-emitting device (10) of Supplementary Note A1 or A2, wherein the second predetermined element (80) and the third predetermined element (90) are arranged at positions where the second predetermined element (80) and the third predetermined element (90) at least partially overlap each other when viewed in the second direction (x direction).

(Supplementary Note A4)

The semiconductor light-emitting device (10) of any one of Supplementary Notes A1 and A3, wherein the first predetermined element (70) has a shape having a longitudinal direction and a lateral direction when viewed in the thickness direction (z direction) of the board, and is arranged so that the lateral direction is along the first direction (y direction) and the longitudinal direction is along the second direction (x direction),
- wherein the length of the first predetermined element (70) in the longitudinal direction is longer than each of a length of the second predetermined element (80) and a length of the third predetermined element (90) in the second direction, and
- wherein both the second predetermined element (80) and the third predetermined element (90) are arranged at a position where the second predetermined element (80) and the third predetermined element (90) at least partially overlap the first predetermined element (70) when viewed in the first direction (y direction).

(Supplementary Note A5)

The semiconductor light-emitting device (10) of Supplementary Note A4, wherein both the second predetermined element (80) and the third predetermined element (90) are arranged at positions where the second predetermined element (80) and the third predetermined element (90) entirely overlap the first predetermined element (70) when viewed in the first direction (y direction).

(Supplementary Note A6)

The semiconductor light-emitting device (10) of Supplementary Note A4 or A5, wherein the first predetermined element is the capacitor (70),
- wherein the capacitor (70) includes a first electrode (71) and a second electrode (72), and
- wherein the first electrode (71) and the second electrode (72) are arranged apart from each other in the longitudinal direction (x direction).

(Supplementary Note A7)

The semiconductor light-emitting device (10) of Supplementary Note A6, wherein the second predetermined element is the switching element (80), the third predetermined element is the light-emitting element (90), and the light-emitting element (90) is a light-emitting diode,
- wherein a drain electrode (81) of the switching element (80) is electrically connected to the second electrode (72) of the capacitor (70),
- wherein a source electrode (82) of the switching element (80) is electrically connected to an anode electrode (91) of the light-emitting diode (90),
- wherein a cathode electrode (92) of the light-emitting diode (90) is electrically connected to the first electrode (71) of the capacitor (70), and wherein the switching element (80) is arranged closer to the second electrode (72) than the light-emitting diode (90) in the second direction (x direction).

(Supplementary Note A8)

The semiconductor light-emitting device (10) of Supplementary Note A7, wherein the first wiring pattern (30/30C) includes: a first front surface side wiring (31/31C) on which the first electrode (71) of the capacitor (70) is mounted; a second front surface side wiring (32/32C) on which the second electrode (72) of the capacitor (70) and the switching element (80) are mounted; and a third front surface side wiring (33/33C) on which the light-emitting diode (90) is mounted, wherein the second wiring pattern (40/40C) includes a back surface side wiring (41/41C) formed at a position where the back surface side wiring (41/41C) overlaps each of the third front surface side wiring (33/33C), the second front surface side wiring (32/32C), and a portion of the first front surface side wiring (31/31C), when viewed in the thickness direction (z direction) of the board, and wherein the back surface side wiring (41/41C) is electrically connected to the third front surface side wiring (33/33C).

(Supplementary Note A9)

The semiconductor light-emitting device (10) of Supplementary Note A8, wherein the back surface side wiring (41/41C) includes: a first wiring portion (41a/41Ca) that extends along the second direction (x direction) and overlaps both the first electrode (71) and the second electrode (72) of the capacitor (70) when viewed in the thickness direction (z direction) of the board; a second wiring portion (41b/41Cb) that extends along the second direction (x direction) and overlaps the light-emitting diode (90) and the switching element (80) when viewed in the thickness direction (z direction) of the board; and a third wiring portion (41c/41Cc) that connects the first wiring portion (41a/41Ca) and the second wiring portion (41b/41Cb) in the first direction (y direction), and wherein the third wiring portion (41c/41Cc) connects an end, which is closer to the switching element (80), of both ends of the first wiring portion (41a/41Ca) in the second direction (x direction) and an end, which is closer to the second electrode (72) of the capacitor (70), of both ends of the second wiring portion (41b/41Cb) in the second direction (x direction).

(Supplementary Note A10)

The semiconductor light-emitting device (10) of Supplementary Note A9, wherein when viewed in the thickness direction (z direction) of the board, the first wiring portion (41a/41Ca) is formed to entirely overlap the capacitor (70), and the second wiring portion (41b/41Cb) is formed to entirely overlap both the switching element (80) and the light-emitting element (90).

(Supplementary Note A11)

The semiconductor light-emitting device (10) of Supplementary Note A10, wherein when viewed in the thickness direction (z direction) of the board, a dimension of the second wiring portion (41b/41Cb) in the first direction (y direction) is equal to a dimension of the third front surface side wiring (33/33C) in the first direction (y direction), and a dimension of the first wiring portion (41a/41Ca) in the first direction (y direction) is equal to a dimension of the capacitor (70) in the first direction (y direction).

(Supplementary Note A12)

A semiconductor light-emitting device (10) including:
a board including a front surface (20s), a back surface (20r) facing an opposite side of the front surface (20s), a first wiring pattern (30A/30B) formed on the front surface (20s), and a second wiring pattern (40A/40B) formed on the side of the back surface (20r) with respect to the first wiring pattern (30A/30B); and
a light-emitting element (90), a switching element (80), and a capacitor (70), which are electrically connected to one another by both the first wiring pattern and the second wiring pattern (30A/30B and 40A/40B),
wherein a first predetermined element (70) among the light-emitting element (90), the switching element (80), and the capacitor (70) has a shape having a longitudinal direction and a lateral direction when viewed in a thickness direction (z direction) of the board,
wherein the first predetermined element (70) and another element (80 and 90) among the light-emitting element (90), the switching element (80), and the capacitor (70) are arranged in a first direction (y direction) intersecting the longitudinal direction when viewed in the thickness direction (z direction) of the board, and
wherein with respect to a first current path of a first current flowing through the light-emitting element (90), the switching element (80), and the capacitor (70) on the front surface (20s), the second wiring pattern (40A/40B) is configured to form a second current path through which a second current flows in an opposite direction to a direction in which the first current flows through the first current path, the second current path overlapping the first current path when viewed in the thickness direction (z direction) of the board.

(Supplementary Note A13)

The semiconductor light-emitting device (10) of Supplementary Note A12, wherein the light-emitting element (90), the switching element (80), and the capacitor (70) are arranged at positions where the light-emitting element (90), the switching element (80), and the capacitor (70) at least partially overlap one another when viewed in the first direction (y direction).

(Supplementary Note A14)

The semiconductor light-emitting device (10) of Supplementary Note A12 or A13, wherein the first predetermined element is the capacitor (70), and wherein the light-emitting element (90) is arranged closer to the capacitor (70) than the switching element (80) in the first direction (y direction).

(Supplementary Note A15)

The semiconductor light-emitting device (10) of Supplementary Note A14, wherein the capacitor (70) includes a first electrode (71) and a second electrode (72),
wherein the first electrode (71) and the second electrode (72) are arranged apart from each other in the longitudinal direction,
wherein both the switching element (80) and the light-emitting element (90) are arranged at positions where both the switching element and the light-emitting element overlap the first electrode (71) of the capacitor (70) when viewed in the first direction (y direction), and
wherein a cathode electrode (92) of the light-emitting element (90) is electrically connected to the first electrode (71) of the capacitor (70).

(Supplementary Note A16)

The semiconductor light-emitting device (10) of Supplementary Note A15, wherein the light-emitting element (90) is a light-emitting diode,
wherein the first wiring pattern (30A/30B) includes: a first front surface side wiring (31A/31B) on which the second electrode (72) of the capacitor (70) is mounted; a second front surface side wiring (32A/32B) on which the first electrode (71) of the capacitor (70) and the light-emitting diode (90) are mounted; and a third front surface side wiring (33A/33B) on which the switching element (80) is mounted,
    wherein the second wiring pattern (40A/40B) includes a back surface side wiring (41A/41B) formed at a position where the back surface side wiring (41A/41B) overlaps each of the third front surface side wiring (33A/33B), the second front surface side wiring (32A/32B), and a portion of the first front surface side wiring (31A/31B), when viewed in the thickness direction (z direction) of the board, and
    wherein the back surface side wiring (41A/41B) is electrically connected to the third front surface side wiring (33A/33B).

(Supplementary Note A17)

The semiconductor light-emitting device (10) of Supplementary Note A16, wherein the back surface side wiring (41A/41B) includes: a first wiring portion (41Aa/41Ba) that extends in the first direction (y direction) and overlaps the switching element (80), the light-emitting diode (90), and the first electrode (71) of the capacitor (70) when viewed in the thickness direction (z direction) of the board; and a second wiring portion (41Ab/41Bb) that extends from the first wiring portion (41Aa/41Ba) in the second direction (x direction) and overlaps the second electrode (72) of the capacitor (70) when viewed in the thickness direction (z direction) of the board.

(Supplementary Note A18)

The semiconductor light-emitting device (10) of any one of Supplementary Notes A1 to A17, wherein the board (20) is a multilayer board including a plurality of substrates (20A to 20C) having an insulation characteristic and a plurality of conductive layers (30, 30A to 30C, 40, 40A to 40C, 50, 50C, 60, and 60C),
    wherein a front surface side substrate (20A), among the plurality of substrates (20A to 20C), constituting the front surface (20s) of the board (20) has a substrate front surface (20As) constituting the front surface (20s) of the board (20) and a substrate back surface (20Ar) facing an opposite side of the substrate front surface (20As),
    wherein the first wiring pattern (30, 30A to 30C) is a conductive layer, among the plurality of conductive layers (30, 30A to 30C, 40, 40A to 40C, 50, 50C, 60, and 60C), formed on the substrate front surface (20As), and
    wherein the second wiring pattern (40, 40A to 40C) is a conductive layer, among the plurality of conductive layers (30, 30A to 30C, 40, 40A to 40C, 50, 50C, 60, and 60C), formed on the substrate back surface (20Ar).

(Supplementary Note A19)

The semiconductor light-emitting device (10) of Supplementary Note A18, wherein a plurality of external terminals (60 and 60C) connected to an outside of the semiconductor light-emitting device are formed on the back surface (20r) of the board (20), and
    wherein at least one of the plurality of external terminals (60 and 60C) is electrically connected to at least one of the switching element (80) and the light-emitting element (90) by a through-wiring (25, 25S, 25R, 26, 27S, 27R, 28, 29) that penetrates the board (20) in the thickness direction (z direction) of the board.

(Supplementary Note A20)

The semiconductor light-emitting device (10) of Supplementary Note A19, wherein the through-wiring (25, 25S, 25R, 26, 27S, 27R, 28, 29) is provided to avoid a conductive layer (40, 40A to 40C, 50, 50C), among the plurality of conductive layers (30, 30A to 30C, 40, 40A to 40C, 50, 50C, 60, and 60C), interposed among the plurality of substrates (20A to 20C).

(Supplementary Note A21)

The semiconductor light-emitting device (10) of any one of Supplementary Notes A1 to A20, further including:
    a side wall (101) provided on the board (20) and configured to surround the capacitor (70), the switching element (80), and the light-emitting element (90); and
    a light-transmitting plate (102) provided on the side wall (101) and arranged at a position where the light-transmitting plate (102) overlaps the light-emitting element (90) when viewed in the thickness direction (z direction) of the board,
    wherein the light-emitting element (90) emits light such that a light-emitting region expands as the light-emitting region becomes distant from the board (20) in the thickness direction (z direction) of the board, and
    wherein the light-emitting element (90) is mounted on the board (20) such that the light-emitting region between the light-transmitting plate (102) and the board (20) is formed at an inward side from the side wall (101) when viewed in the thickness direction (z direction) of the board.

(Supplementary Note A22)

The semiconductor light-emitting device (10) of any one of Supplementary Notes A1 to A21, further including: a protective diode (110) configured to protect the light-emitting element (90).

(Supplementary Note B1)

An electronic component including:
    a board including a front surface, a back surface facing an opposite side of the front surface, a first wiring pattern formed on the front surface, and a second wiring pattern formed on the side of back surface with respect to the first wiring pattern; and
    a first element, a second element, and a third element, which are electrically connected to one another by both the first wiring pattern and the second wiring pattern,
    wherein the first element and the second element are arranged in a first direction when viewed in a thickness direction of the board,
    wherein the second element and the third element are arranged in a second direction intersecting the first direction when viewed in the thickness direction of the board, and
    wherein with respect to a first current path of a first current flowing through the first element, the second element, and the third element on the front surface, the second wiring pattern is configured to form a second current path through which a second current flows in an opposite direction to a direction in which the first current flows through the first current path, the second current path overlapping the first current path when viewed in the thickness direction of the board.

(Supplementary Note B2)

An electronic component including:
    a board including a front surface, a back surface facing an opposite side of the front surface, a first wiring pattern formed on the front surface, and a second wiring pattern formed on the side of the back surface with respect to the first wiring pattern; and a first element, a second element, and a third element, which are electrically connected to one another by both the first wiring pattern and the second wiring pattern, wherein the first element has a shape having a longitudinal direction and a lateral direction when viewed in a thickness direction of the board, wherein the first element, the second element, and the third element are arranged in a first direction intersecting the longitudinal direction, and wherein with respect to a first current path of a first current flowing through the first element, the second element, and the third element on the front surface, the second wiring pattern is configured to form a second current path through which a second current flows in an opposite direction to a direction in which the first current flows through the first current path, the second current path overlapping the first current path when viewed in the thickness direction of the board.

According to the present disclosure in some embodiments, it is possible to provide a semiconductor light-emitting device capable of electrically connecting a light-emitting element, a switching element, and a capacitor while reducing the inductance.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A semiconductor light-emitting device comprising:
   a board including a front surface, a back surface facing an opposite side of the front surface, a first wiring pattern formed on the front surface, and a second wiring pattern formed on the side of the back surface with respect to the first wiring pattern; and
   a light-emitting element, a switching element, and a capacitor, which are electrically connected to one another by both the first wiring pattern and the second wiring pattern,
   wherein a first predetermined element and a second predetermined element among the light-emitting element, the switching element, and the capacitor are arranged in a first direction when viewed in a thickness direction of the board,
   wherein, the second predetermined element and a third predetermined element among the light-emitting element, the switching element, and the capacitor are arranged in a second direction intersecting the first direction when viewed in the thickness direction of the board, and
   wherein with respect to a first current path of a first current flowing through the light-emitting element, the switching element, and the capacitor on the front surface, the second wiring pattern is configured to form a second current path through which a second current flows in an opposite direction to a direction in which the first current flows through the first current path, the second current path overlapping the first current path when viewed in the thickness direction of the board.

2. The semiconductor light-emitting device of claim 1, wherein the first predetermined element and the second predetermined element are arranged at positions where the first predetermined element and the second predetermined element at least partially overlap each other when viewed in the first direction.

3. The semiconductor light-emitting device of claim 1, wherein the second predetermined element and the third predetermined element are arranged at positions where the second predetermined element and the third predetermined element at least partially overlap each other when viewed in the second direction.

4. The semiconductor light-emitting device of claim 1, wherein the first predetermined element has a shape having a longitudinal direction and a lateral direction when viewed in the thickness direction of the board, and is arranged such that the lateral direction is along the first direction and the longitudinal direction is along the second direction,
   wherein a length of the first predetermined element in the longitudinal direction is longer than each of a length of the second predetermined element and a length of the third predetermined element in the second direction, and
   wherein both the second predetermined element and the third predetermined element are arranged at positions where the second predetermined element and the third predetermined element at least partially overlap the first predetermined element, when viewed in the first direction.

5. The semiconductor light-emitting device of claim 4, wherein both the second predetermined element and the third predetermined element are arranged at positions where the second predetermined element and the third predetermined element entirely overlap the first predetermined element, when viewed in the first direction.

6. The semiconductor light-emitting device of claim 4, wherein the first predetermined element is the capacitor,
   wherein the capacitor includes a first electrode and a second electrode, and
   wherein the first electrode and the second electrode are arranged apart from each other in the longitudinal direction.

7. The semiconductor light-emitting device of claim 6, wherein the second predetermined element is the switching element, the third predetermined element is the light-emitting element, and the light-emitting element is a light-emitting diode,
   wherein a drain electrode of the switching element is electrically connected to the second electrode of the capacitor,
   wherein a source electrode of the switching element is electrically connected to an anode electrode of the light-emitting diode,
   wherein a cathode electrode of the light-emitting diode is electrically connected to the first electrode of the capacitor, and
   wherein the switching element is arranged closer to the second electrode than the light-emitting diode in the second direction.

8. The semiconductor light-emitting device of claim 7, wherein the first wiring pattern includes:
   a first front surface side wiring on which the first electrode of the capacitor is mounted;
   a second front surface side wiring on which the second electrode of the capacitor and the switching element are mounted; and
   a third front surface side wiring on which the light-emitting diode is mounted, wherein the second wiring pattern includes a back surface side wiring formed at a position where the back surface side wiring overlaps each of the third front surface side wiring, the second front surface side wiring, and a portion of the first front surface side wiring, when viewed in the thickness direction of the board, and wherein the back surface side wiring is electrically connected to the third front surface side wiring.

9. The semiconductor light-emitting device of claim 8, wherein the back surface side wiring includes:
a first wiring portion that extends along the second direction and overlaps both the first electrode and the second electrode of the capacitor when viewed in the thickness direction of the board;
a second wiring portion that extends along the second direction and overlaps the light-emitting diode and the switching element when viewed in the thickness direction of the board; and
a third wiring portion that connects the first wiring portion and the second wiring portion in the first direction,
wherein the third wiring portion connects an end, between both ends of the first wiring portion, which is closer to the switching element in the second direction and an end, between both ends of the second wiring portion, which is closer to the second electrode of the capacitor in the second direction.

10. The semiconductor light-emitting device of claim 9, wherein when viewed in the thickness direction of the board, the first wiring portion is formed to entirely overlap the capacitor, and the second wiring portion is formed to entirely overlap both the switching element and the light-emitting element.

11. The semiconductor light-emitting device of claim 10, wherein when viewed in the thickness direction of the board, a dimension of the second wiring portion in the first direction is equal to a dimension of the third front surface side wiring in the first direction, and a dimension of the first wiring portion in the first direction is equal to a dimension of the capacitor in the first direction.

12. A semiconductor light-emitting device comprising:
a board including a front surface, a back surface facing an opposite side of the front surface, a first wiring pattern formed on the front surface, and a second wiring pattern formed on the side of the back surface with respect to the first wiring pattern; and
a light-emitting element, a switching element, and a capacitor, which are electrically connected to one another by both the first wiring pattern and the second wiring pattern,
wherein a first predetermined element among the light-emitting element, the switching element, and the capacitor has a shape having a longitudinal direction and a lateral direction when viewed in a thickness direction of the board,
wherein the first predetermined element and another element among the light-emitting element, the switching element, and the capacitor are arranged in a first direction intersecting the longitudinal direction when viewed in the thickness direction of the board, and
wherein with respect to a first current path of a first current flowing through the light-emitting element, the switching element, and the capacitor on the front surface, the second wiring pattern is configured to form a second current path through which a second current flows in an opposite direction to a direction in which the first current flows through the first current path, the second current path overlapping the first current path when viewed in the thickness direction of the board.

13. The semiconductor light-emitting device of claim 12, wherein the light-emitting element, the switching element, and the capacitor are arranged at positions where the light-emitting element, the switching element, and the capacitor at least partially overlap one another when viewed in the first direction.

14. The semiconductor light-emitting device of claim 12, wherein the first predetermined element is the capacitor, and
wherein the light-emitting element is arranged closer to the capacitor than the switching element in the first direction.

15. The semiconductor light-emitting device of claim 14, wherein the capacitor includes a first electrode and a second electrode,
wherein the first electrode and the second electrode are arranged apart from each other in the longitudinal direction,
wherein both the switching element and the light-emitting element are arranged at positions where both the switching element and the light-emitting element overlap the first electrode of the capacitor when viewed in the first direction, and
wherein a cathode electrode of the light-emitting element is electrically connected to the first electrode of the capacitor.

16. The semiconductor light-emitting device of claim 15, wherein the light-emitting element is a light-emitting diode,
wherein the first wiring pattern includes:
a first front surface side wiring on which the second electrode of the capacitor is mounted;
a second front surface side wiring on which the first electrode of the capacitor and the light-emitting diode are mounted; and
a third front surface side wiring on which the switching element is mounted,
wherein the second wiring pattern includes a back surface side wiring formed at a position where the back surface side wiring overlaps each of the third front surface side wiring, the second front surface side wiring, and a portion of the first front surface side wiring, when viewed in the thickness direction of the board, and
wherein the back surface side wiring is electrically connected to the third front surface side wiring.

17. The semiconductor light-emitting device of claim 16, wherein when a direction orthogonal to the first direction is defined as a second direction when viewed in the thickness direction of the board, the back surface side wiring includes:
a first wiring portion that extends in the first direction and overlaps the switching element, the light-emitting diode, and the first electrode of the capacitor when viewed in the thickness direction of the board; and
a second wiring portion that extends from the first wiring portion in the second direction and overlaps the second electrode of the capacitor when viewed in the thickness direction of the board.

18. The semiconductor light-emitting device of claim 1, wherein the board is a multilayer board including a plurality of substrates having an insulation characteristic and a plurality of conductive layers,
wherein a front surface side substrate, among the plurality of substrates, constituting the front surface of the board has a substrate front surface constituting the front surface of the board and a substrate back surface facing an opposite side of the substrate front surface, wherein the first wiring pattern is a conductive layer, among the plurality of conductive layers, formed on the substrate front surface, and wherein the second wiring pattern is a conductive layer, among the plurality of conductive layers, formed on the substrate back surface.

19. The semiconductor light-emitting device of claim 18, wherein a plurality of external terminals connected to an outside of the semiconductor light-emitting device are formed on the back surface of the board, and wherein at least one of the plurality of external terminals is electrically connected to at least one of the switching element and the light-emitting element by a through-wiring that penetrates the board in the thickness direction of the board.

20. The semiconductor light-emitting device of claim 19, wherein the through-wiring is provided to avoid a conductive layer, among the plurality of conductive layers, interposed among the plurality of substrates.

21. The semiconductor light-emitting device of claim 1, further comprising a case including:

a side wall provided on the board and configured to surround the capacitor, the switching element, and the light-emitting element; and a light-transmitting plate provided on the side wall and arranged at a position where the light-transmitting plate overlaps the light-emitting element when viewed in the thickness direction of the board, wherein the light-emitting element emits light such that a light-emitting region expands as the light-emitting region becomes distant from the board in the thickness direction of the board, and wherein the light-emitting element is mounted on the board such that the light-emitting region between the light-transmitting plate and the board is formed at an inward side from the side wall when viewed in the thickness direction of the board.

* * * * *